(12) United States Patent
Laske et al.

(10) Patent No.: US 11,815,699 B2
(45) Date of Patent: Nov. 14, 2023

(54) METHOD FOR PRODUCING LENS ELEMENTS AND PACKAGED RADIATION-SENSITIVE DEVICES ON WAFER LEVEL

(71) Applicant: Fraunhofer-Gesellschaft zur Förderung der angewandten Forschung e.V., Munich (DE)

(72) Inventors: Norman Laske, Bokelrehm (DE); Hans-Joachim Quenzer, Itzehoe (DE); Vanessa Stenchly, Meldorf (DE); Amit Kulkarni, Hamburg (DE); Arne Veit Schulz-Walsemann, Oldenborstel (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 327 days.

(21) Appl. No.: 16/595,901

(22) Filed: Oct. 8, 2019

(65) Prior Publication Data

US 2020/0041699 A1 Feb. 6, 2020

Related U.S. Application Data

(63) Continuation of application No. PCT/EP2018/059460, filed on Apr. 12, 2018.

(30) Foreign Application Priority Data

Apr. 13, 2017 (DE) ............ 10 2017 206 387.4
Jul. 28, 2017 (DE) ............ 10 2017 213 065.2

(51) Int. Cl.
*B29D 11/00* (2006.01)
*H01L 31/0232* (2014.01)
(Continued)

(52) U.S. Cl.
CPC ...... *G02B 3/0025* (2013.01); *B29D 11/00298* (2013.01); *H01L 31/02327* (2013.01); *H01L 31/186* (2013.01)

(58) Field of Classification Search
None
See application file for complete search history.

(56) References Cited

U.S. PATENT DOCUMENTS

| 5,066,090 A | 11/1991 | Mayerhofer et al. |
| 6,049,430 A | 4/2000 | Heanue et al. |

(Continued)

FOREIGN PATENT DOCUMENTS

| CN | 101246225 A | 8/2008 |
| CN | 102112896 A | 6/2011 |

(Continued)

OTHER PUBLICATIONS

Chinese Office Action, dated Mar. 11, 2021, parallel patent application No. 201880039832.0.

(Continued)

*Primary Examiner* — Xiaoming Liu
(74) *Attorney, Agent, or Firm* — McClure, Qualey & Rodack, LLP

(57) ABSTRACT

A production method includes fixing ball elements of a semiconductor material to a carrier substrate by means of heat and pressure; and one-sided thinning of the ball elements fixed to the carrier substrate to form plano-convex lens elements of a semiconductor material.

31 Claims, 29 Drawing Sheets

(51) Int. Cl.
*H01L 31/18* (2006.01)
*G02B 3/00* (2006.01)

(56) References Cited

U.S. PATENT DOCUMENTS

| | | | |
|---|---|---|---|
| 7,160,478 B2 | 1/2007 | Leib et al. | |
| 10,283,930 B2 | 5/2019 | Reinert et al. | |
| 2006/0016995 A1* | 1/2006 | Kummer | G01J 1/04 |
| | | | 250/338.1 |
| 2008/0198481 A1* | 8/2008 | Zung | B29D 11/00375 |
| | | | 359/716 |
| 2011/0292271 A1* | 12/2011 | Lin | H01L 31/02327 |
| | | | 348/340 |
| 2012/0257292 A1 | 10/2012 | Lu | |
| 2015/0064883 A1* | 3/2015 | Dykaar | H01L 21/56 |
| | | | 438/479 |
| 2017/0052293 A1 | 2/2017 | Cangemi et al. | |

FOREIGN PATENT DOCUMENTS

| | | |
|---|---|---|
| CN | 102279506 A | 12/2011 |
| CN | 102736139 A | 10/2012 |
| CN | 104576404 A | 4/2015 |
| EP | 0 421 118 A1 | 4/1991 |
| EP | 1 419 530 A2 | 5/2004 |
| HK | S60 187077 A | 9/1985 |
| JP | S59 101881 A | 6/1984 |
| JP | S60 187077 A | 9/1985 |
| JP | H02 127605 A | 5/1990 |
| JP | 2000-052443 A | 2/2000 |
| JP | 5431694 B2 | 12/2013 |
| KR | 10-2004-0093607 A | 11/2004 |
| KR | 20080064336 A | 7/2008 |
| WO | 2009/088241 A2 | 7/2009 |
| WO | 2010015383 A1 | 2/2010 |
| WO | 2015/082477 A1 | 6/2015 |

OTHER PUBLICATIONS

English Translation of Chinese Office Action, dated Mar. 11, 2021, parallel patent application No. 201880039832.0.

* cited by examiner

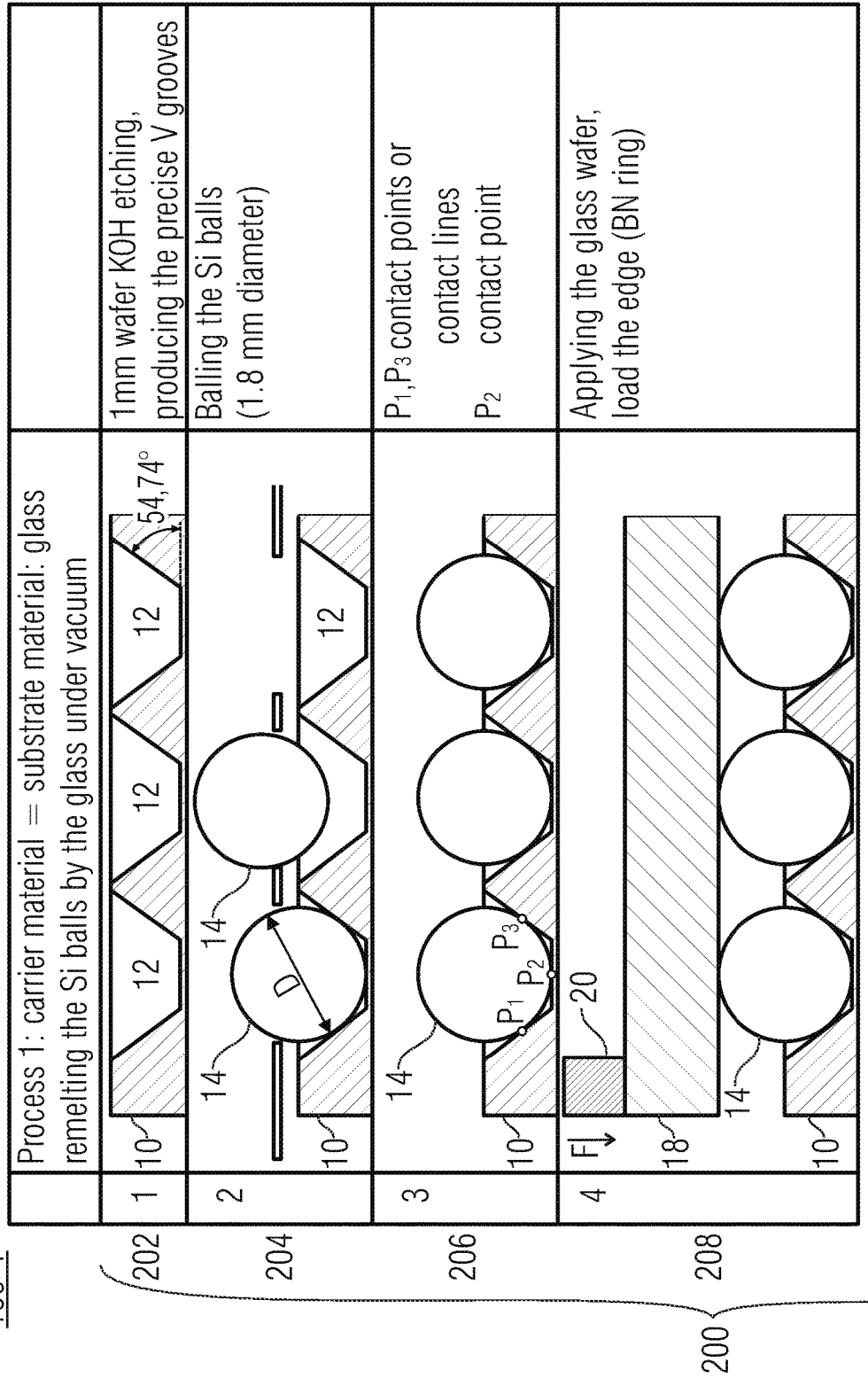
Fig. 2 (Con't)

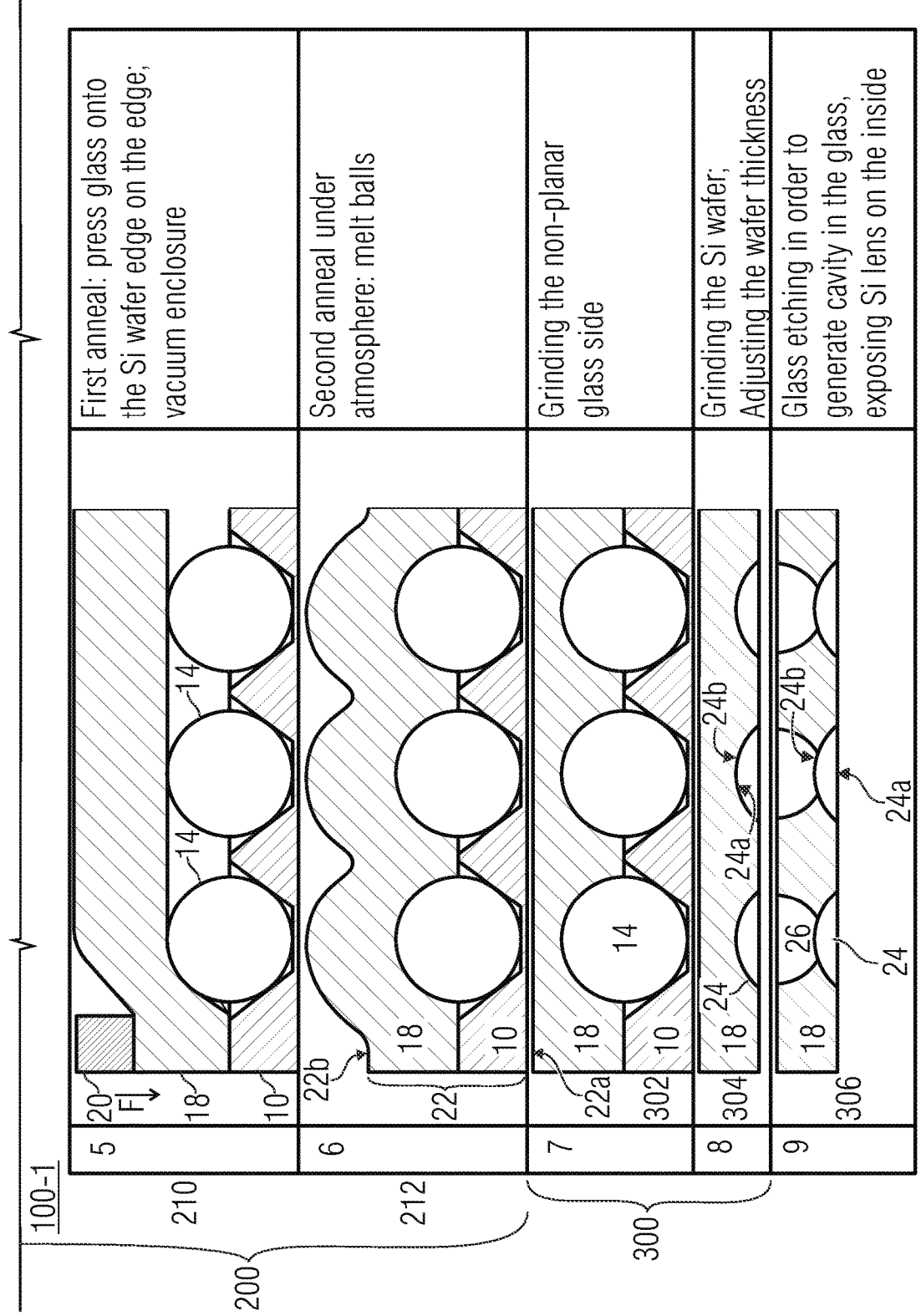
Fig. 2 (Con't)

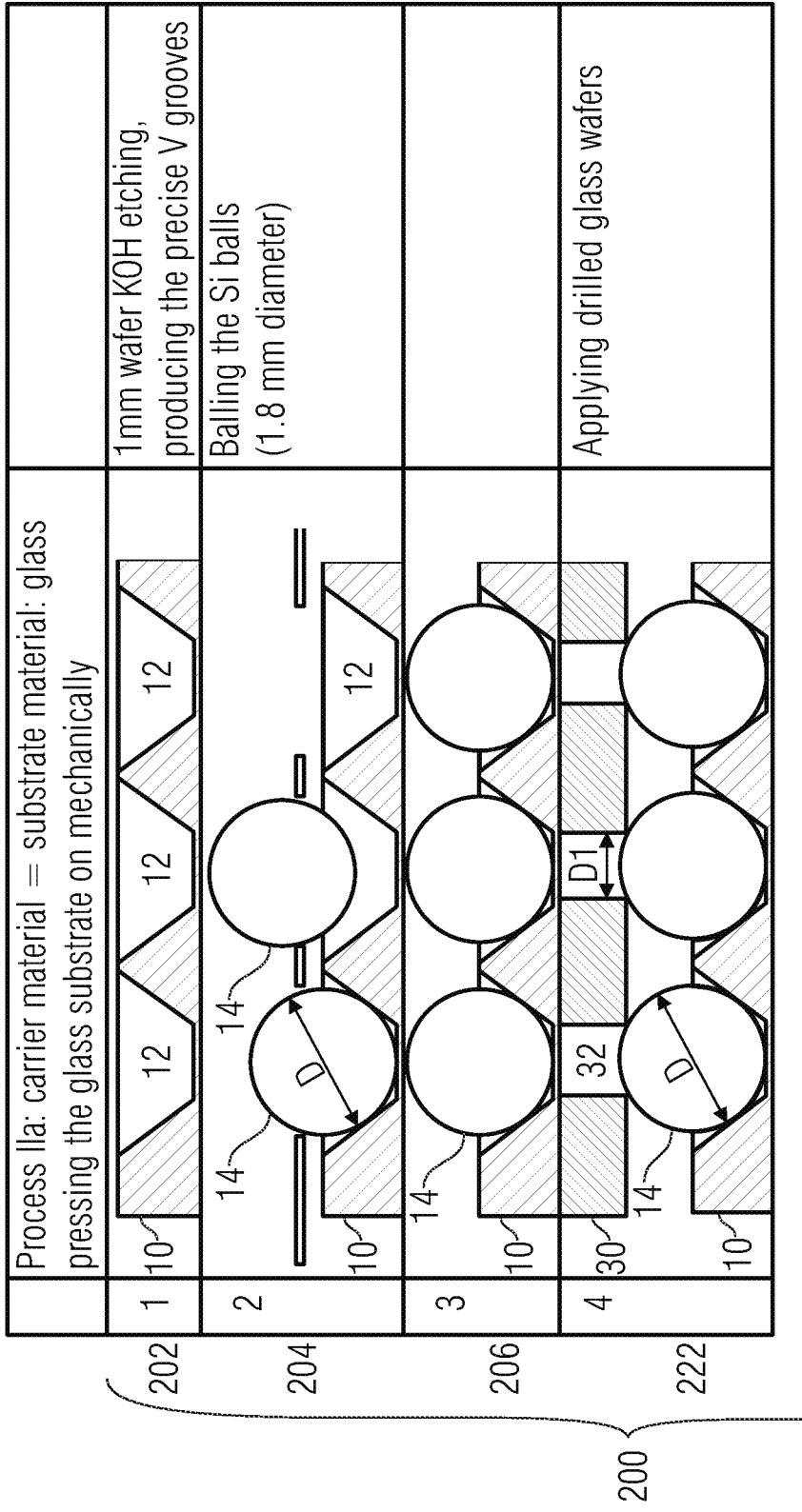
Fig. 3 (Con't)

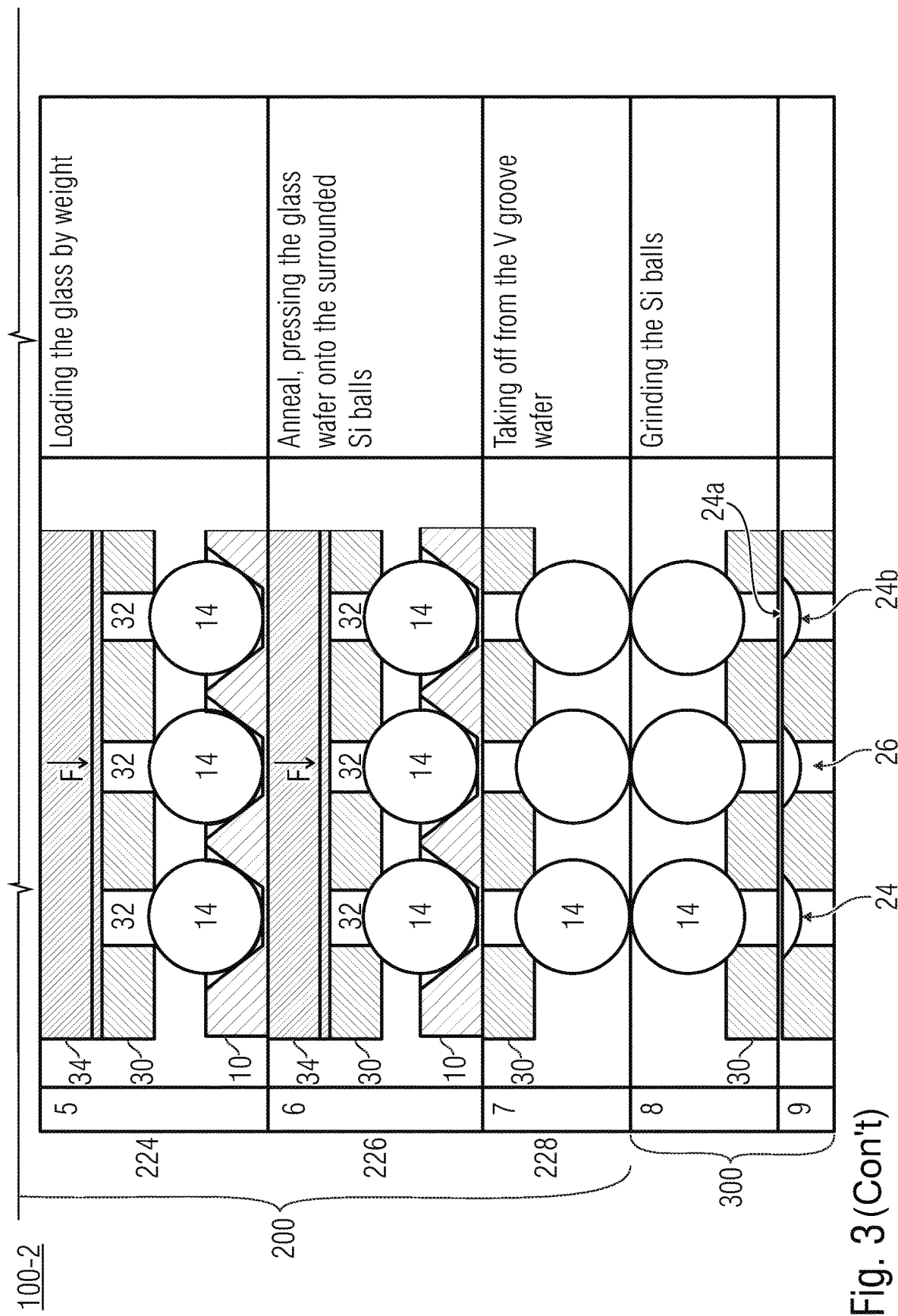
Fig. 3 (Con't)

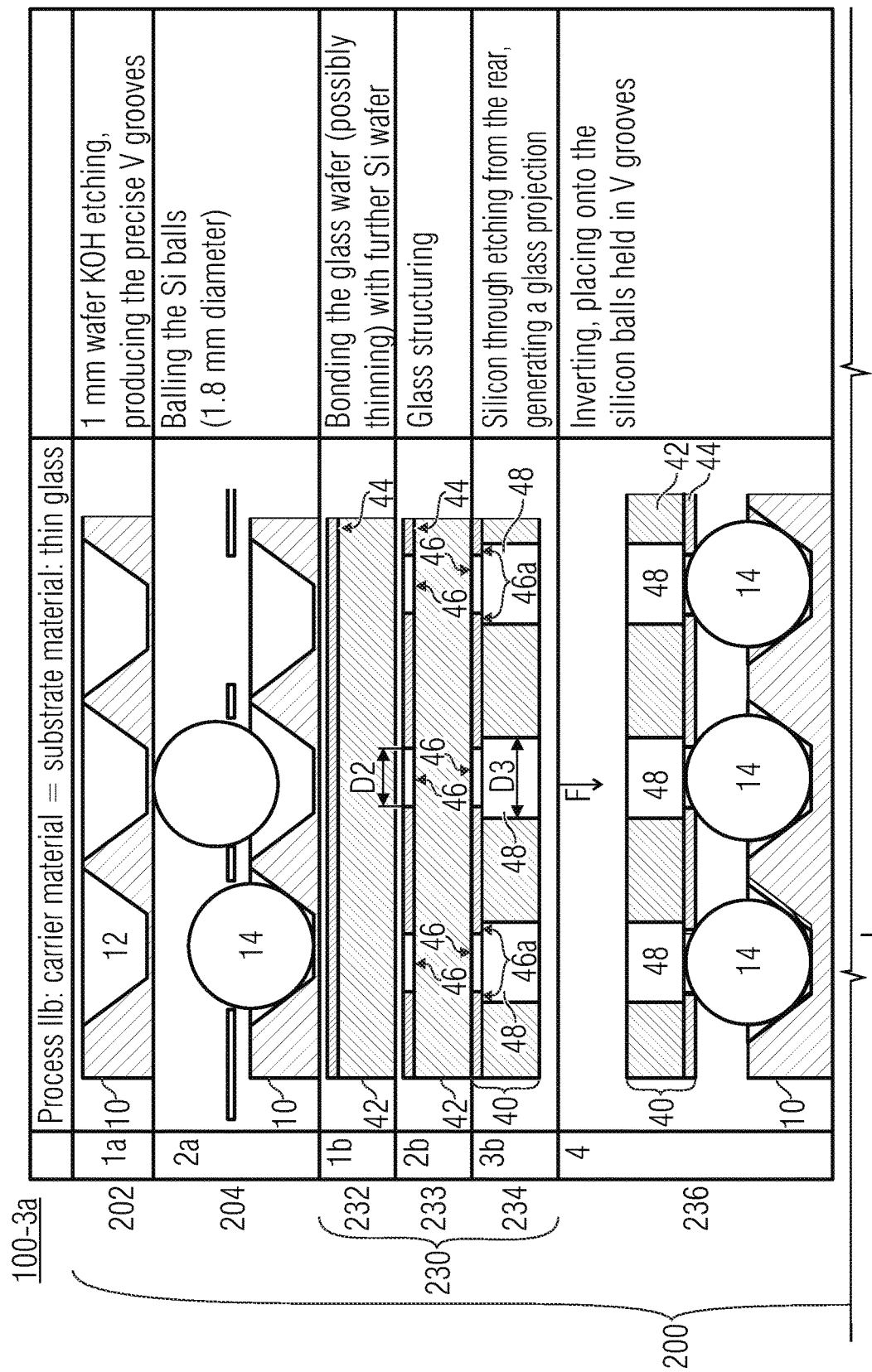
Fig. 4A (Con't)

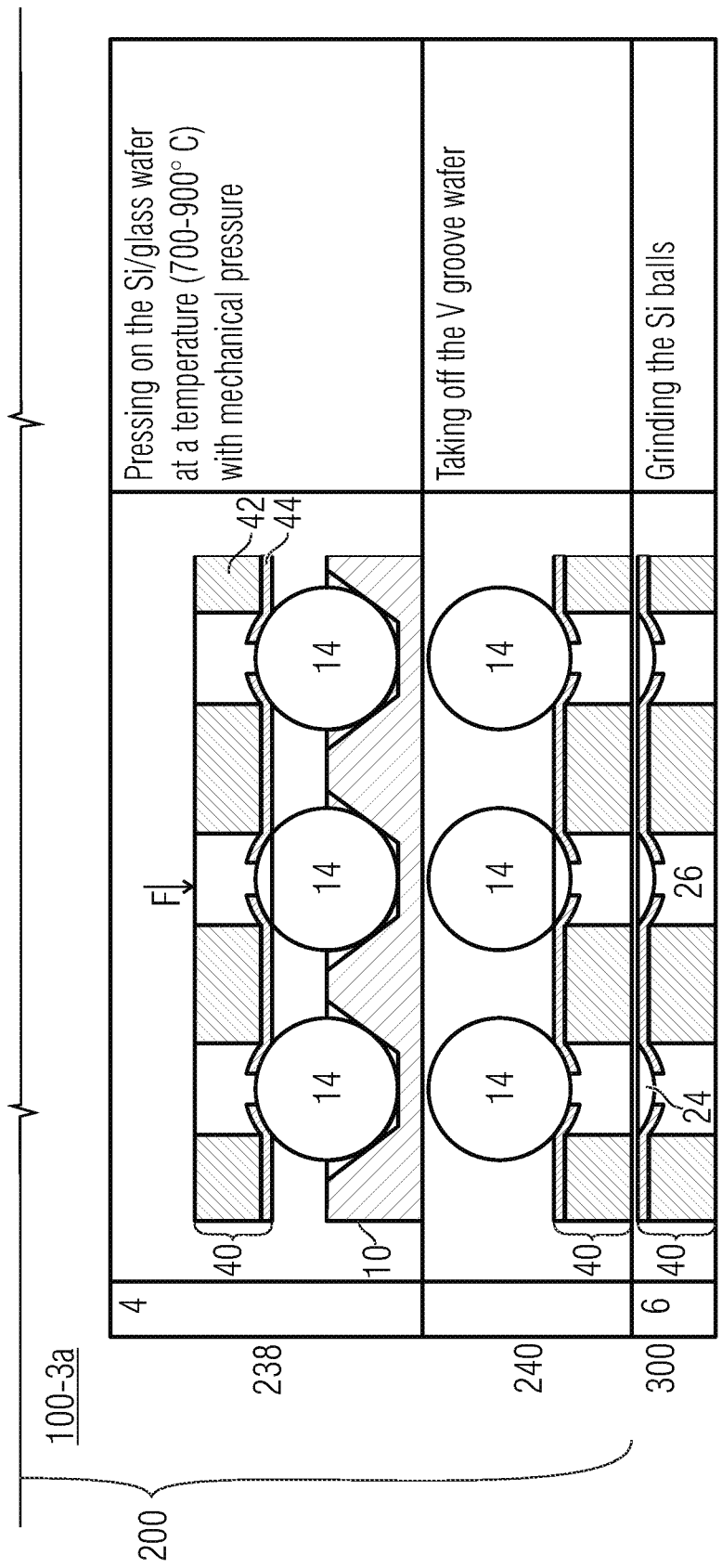
Fig. 4A (Con't)

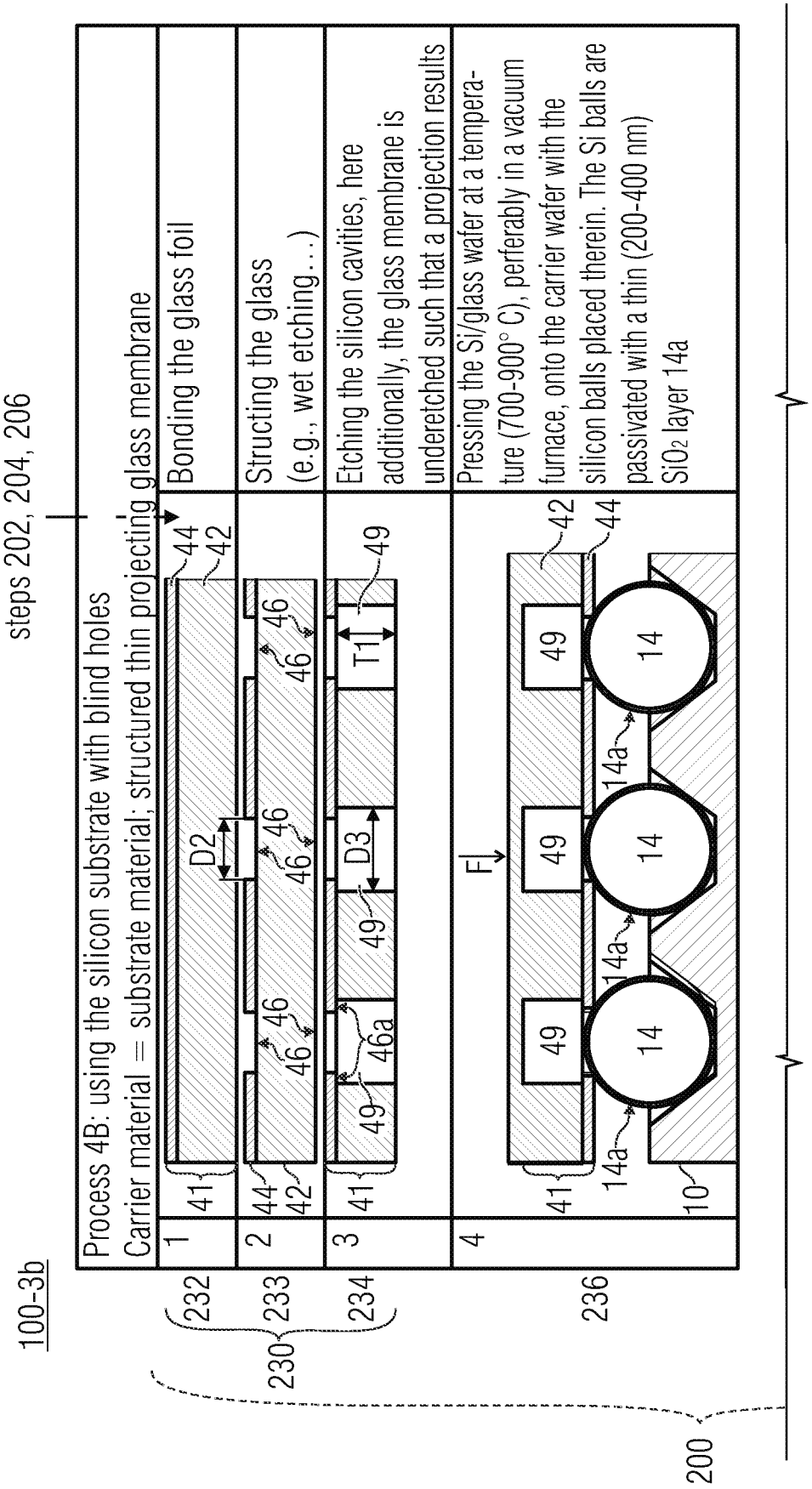
Fig. 4B (Con't)

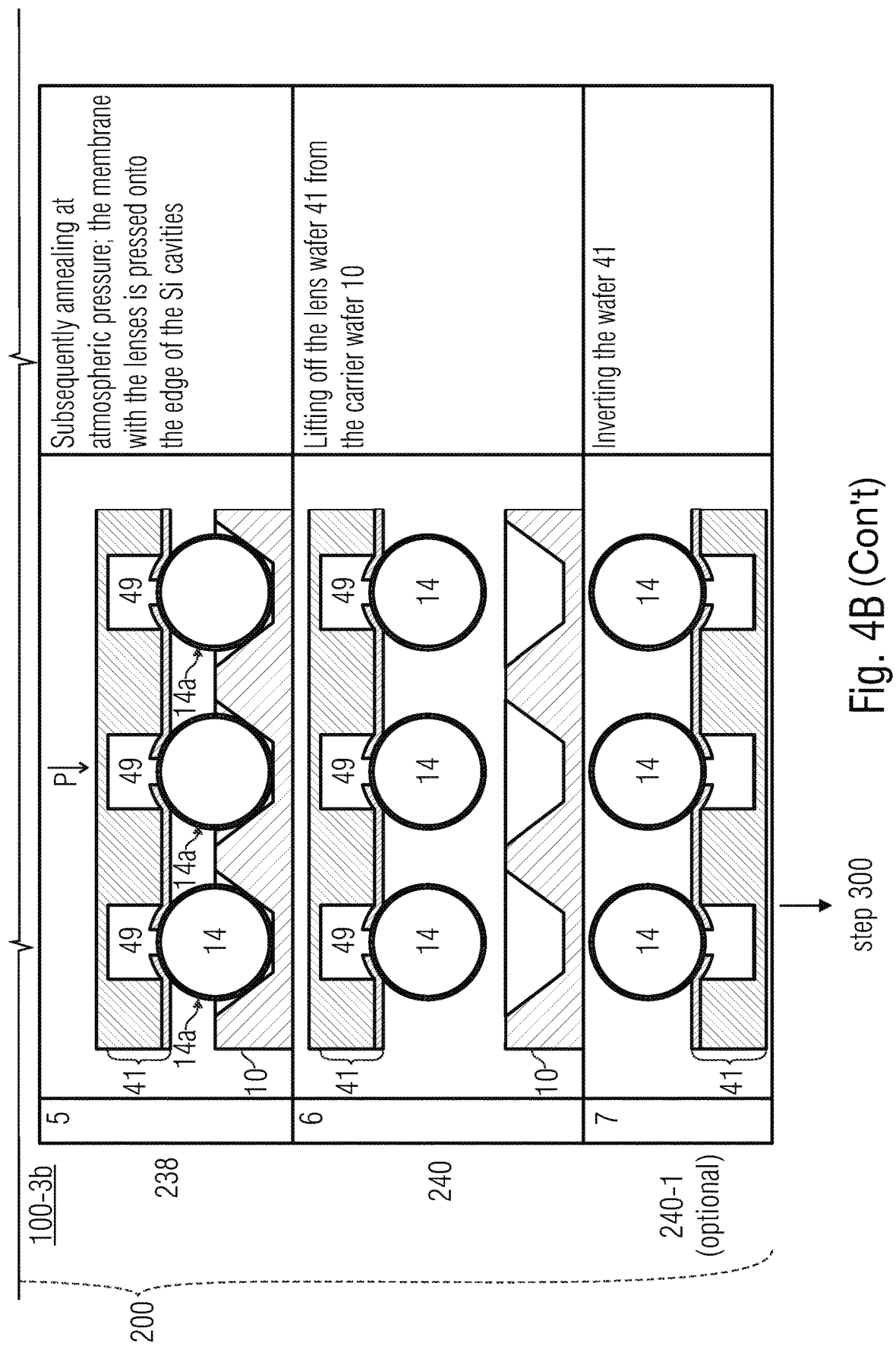
Fig. 4B (Con't)

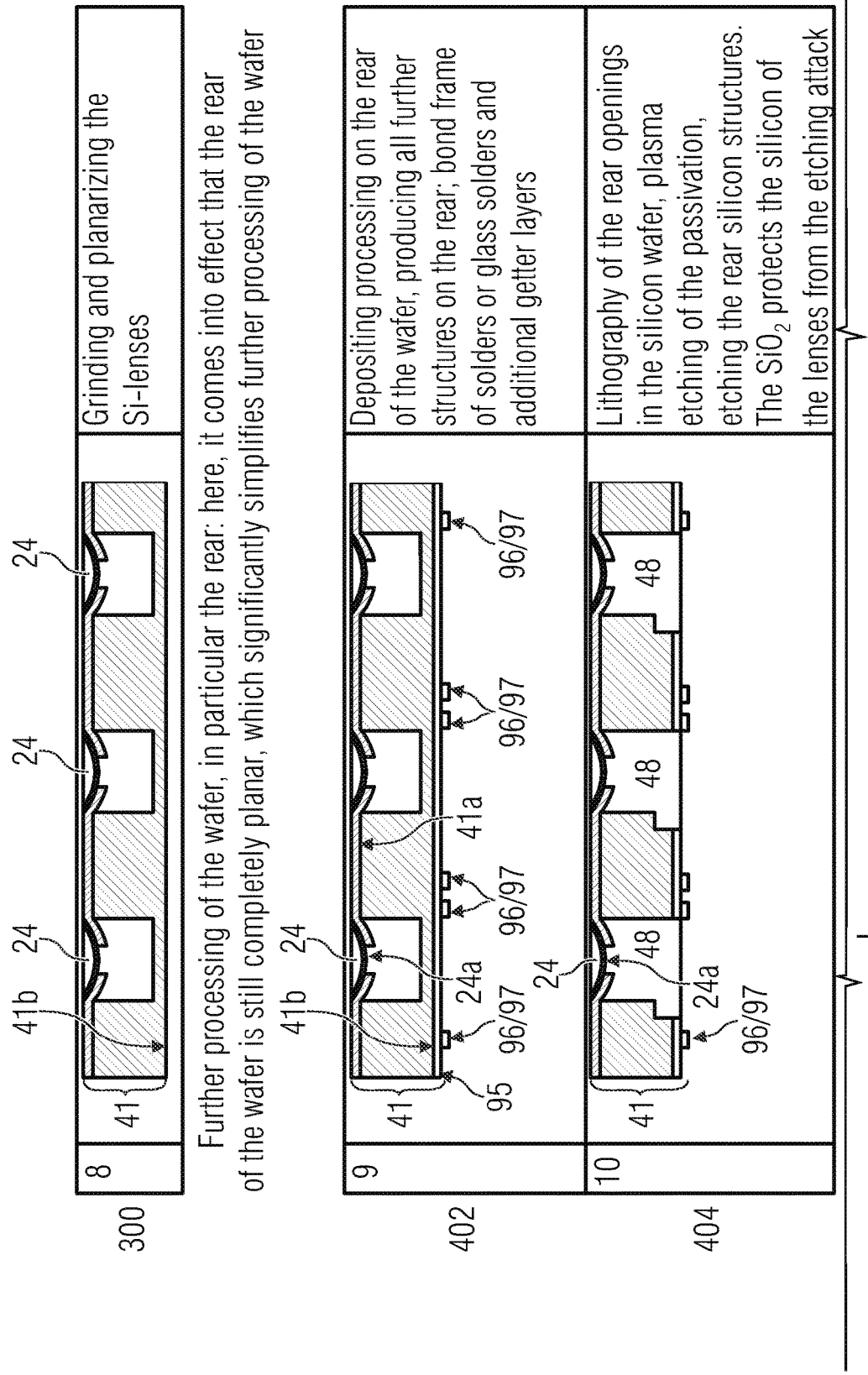
Fig. 4B (Con't)

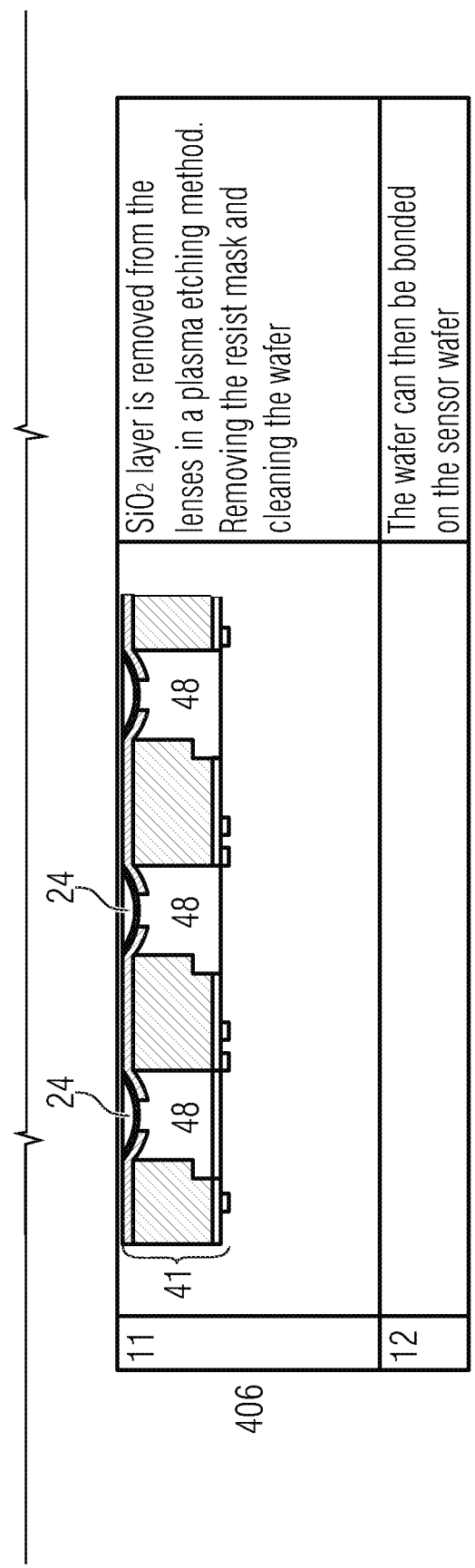
Fig. 4B (Con't)

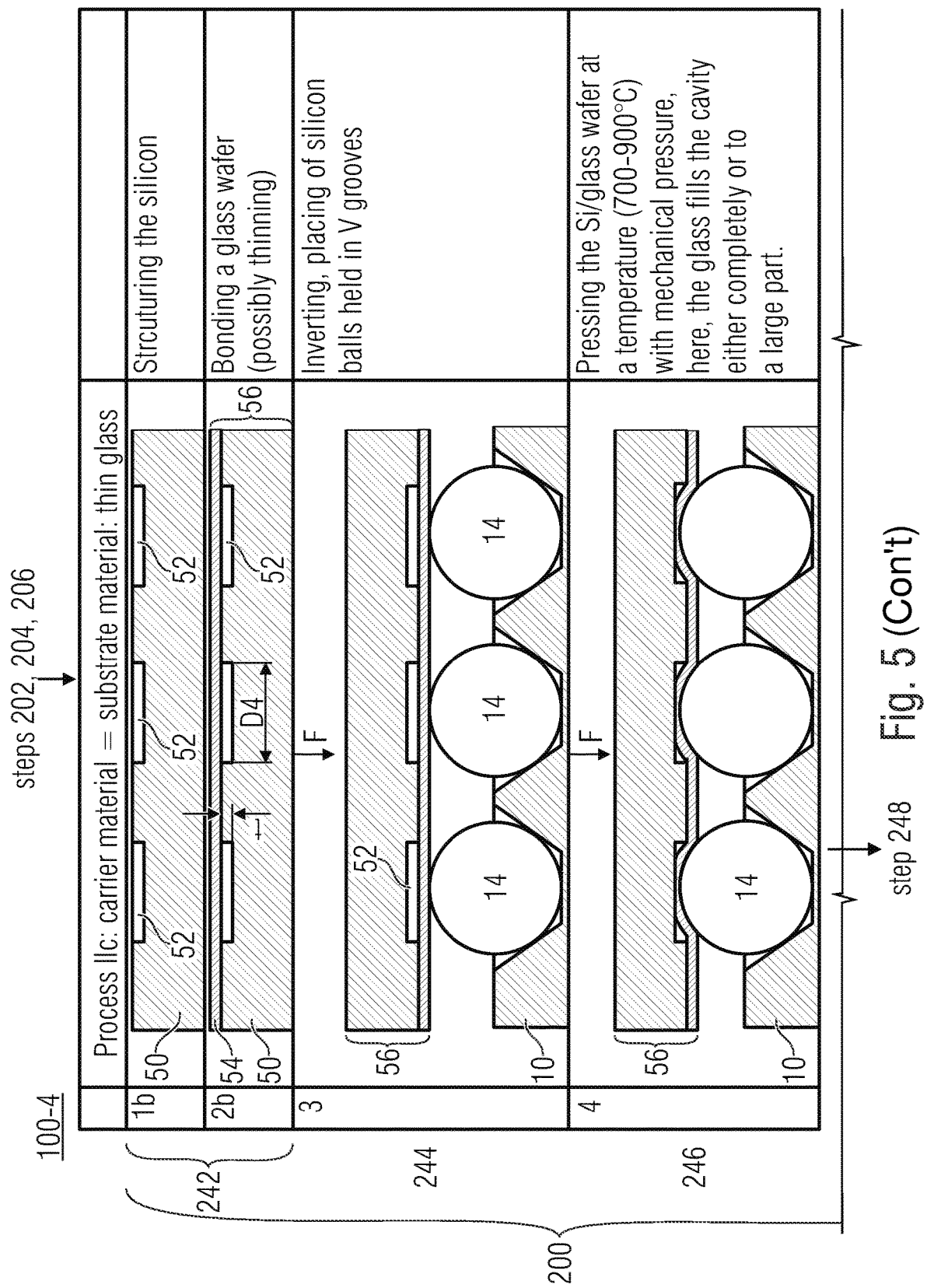
Fig. 5 (Con't)

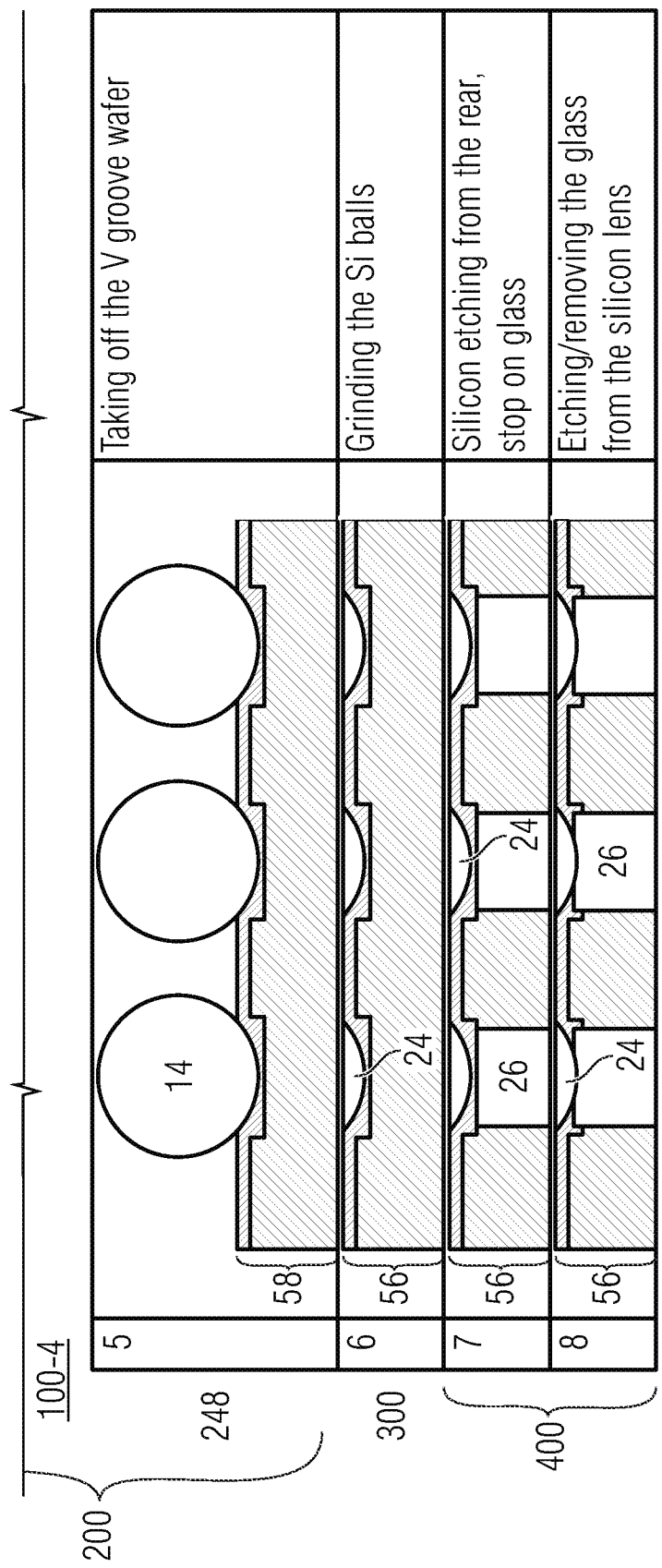
Fig. 5 (Con't)

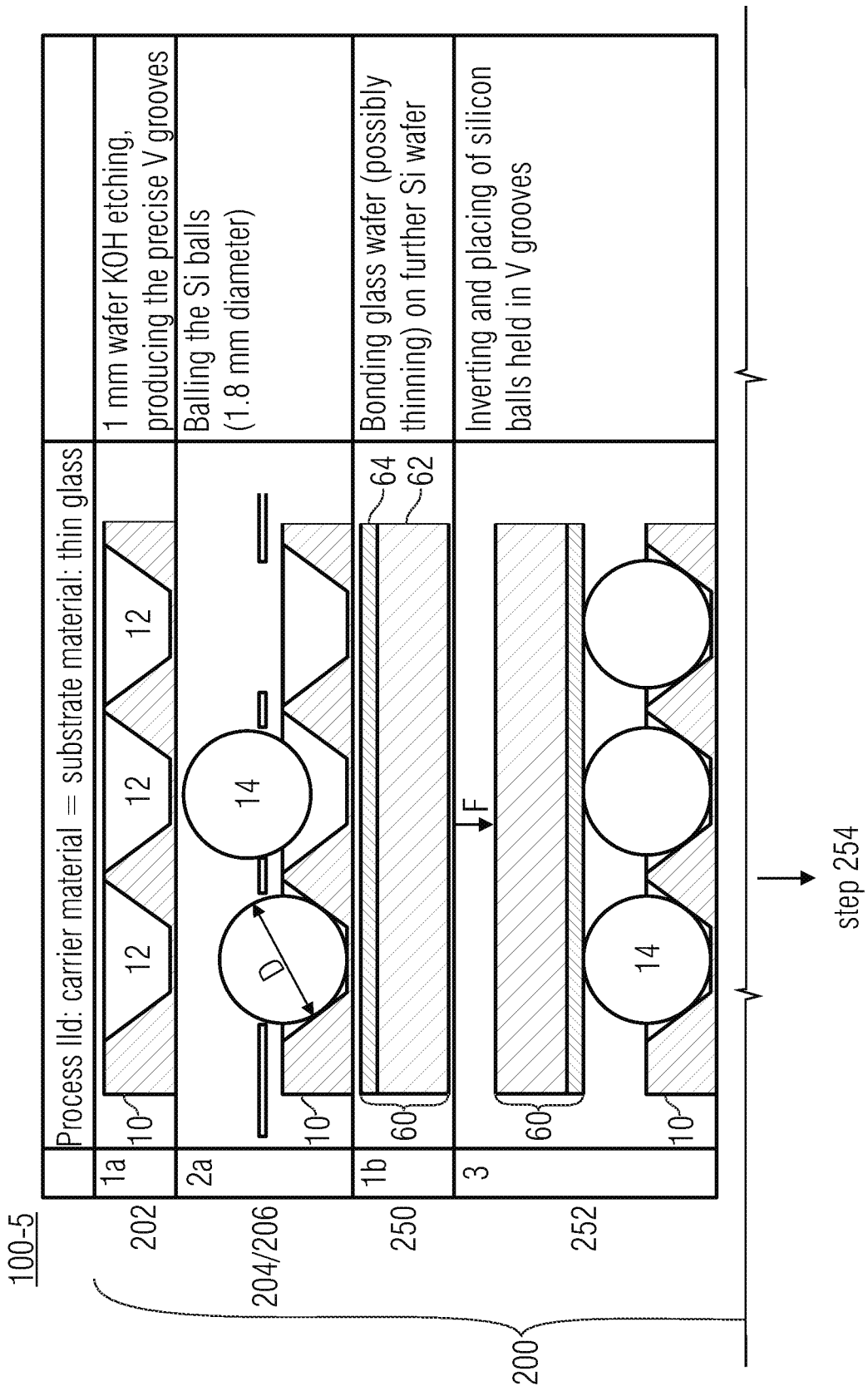
Fig. 6 (Con't)

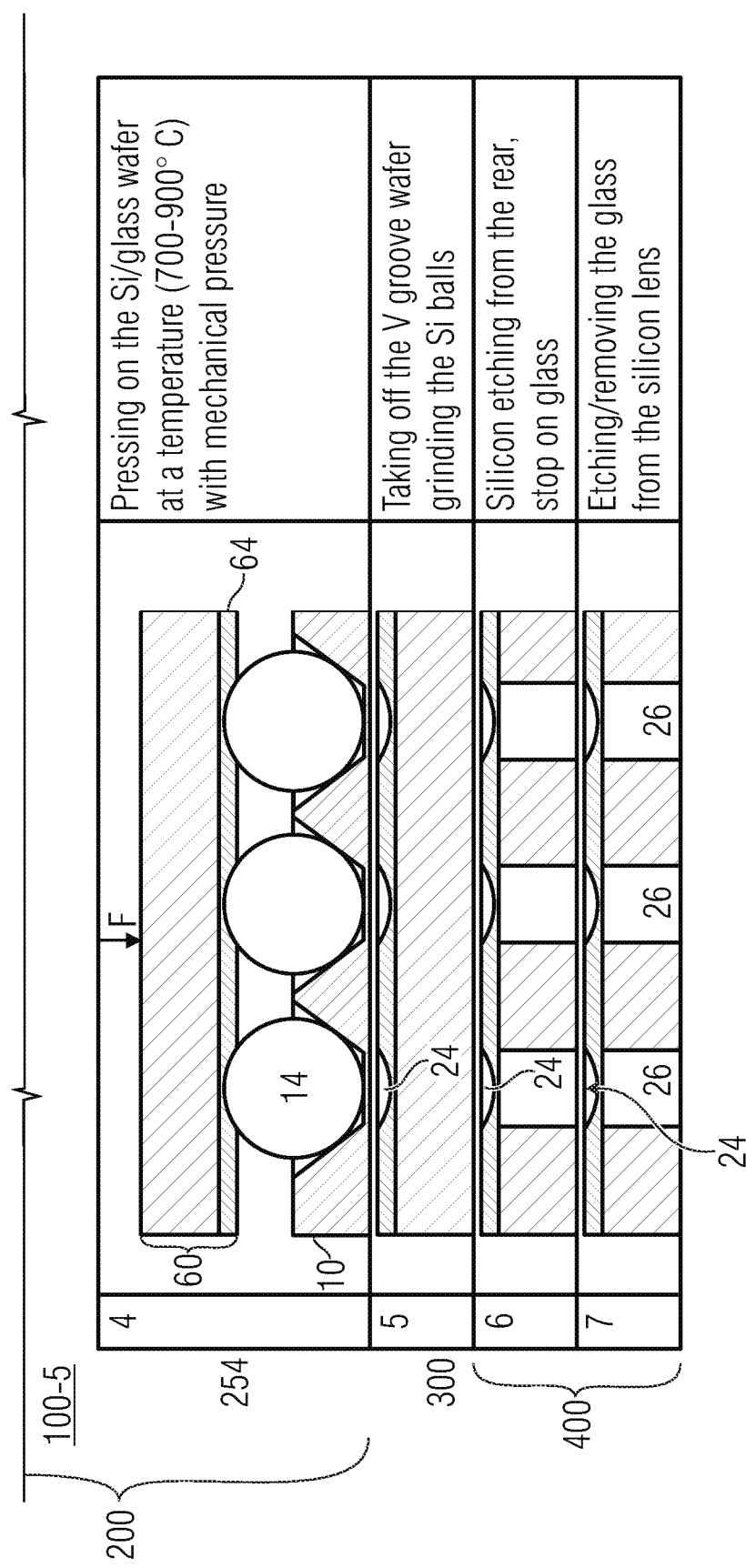
Fig. 6 (Con't)

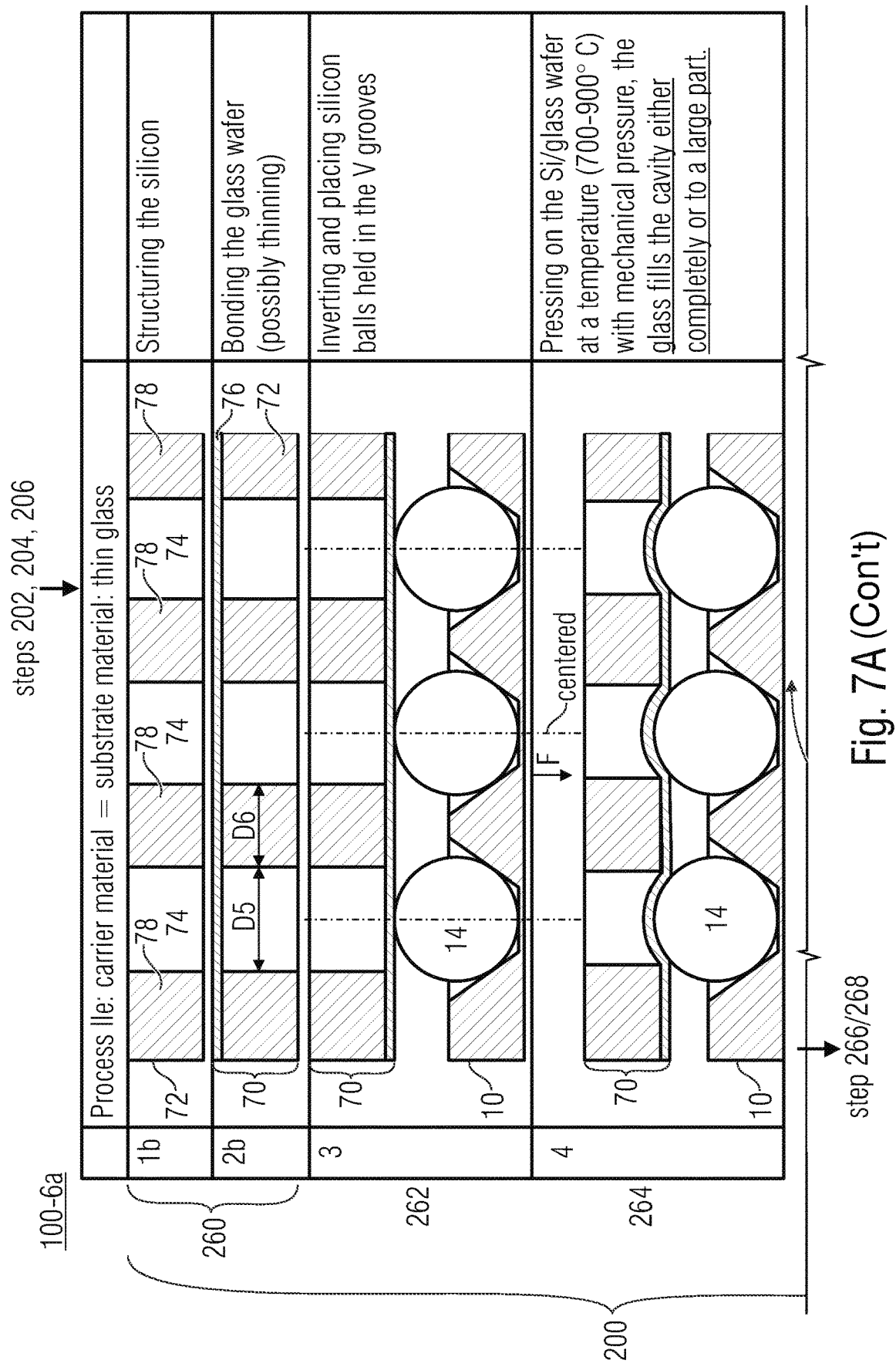
Fig. 7A (Con't)

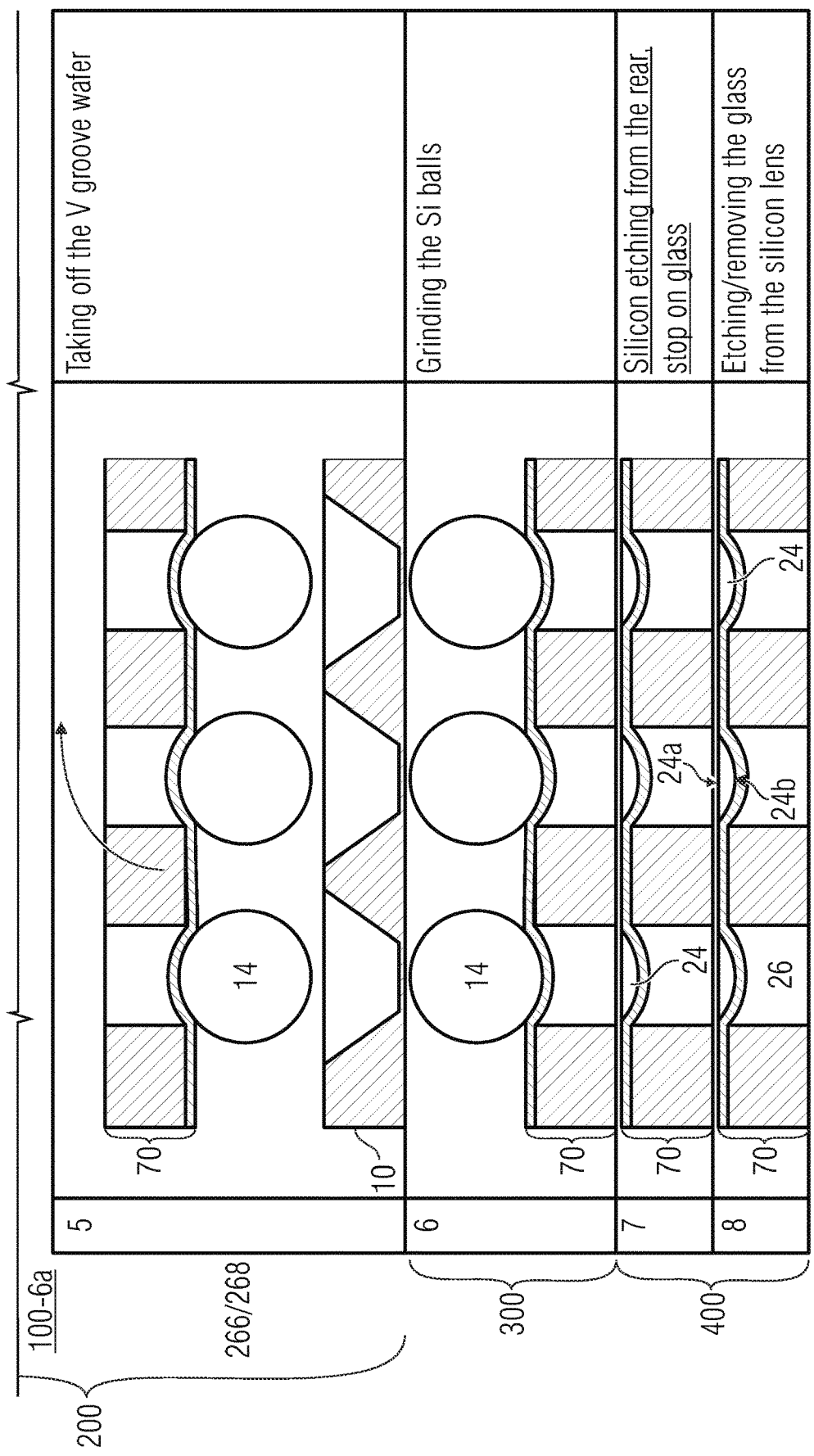
Fig. 7A (Con't)

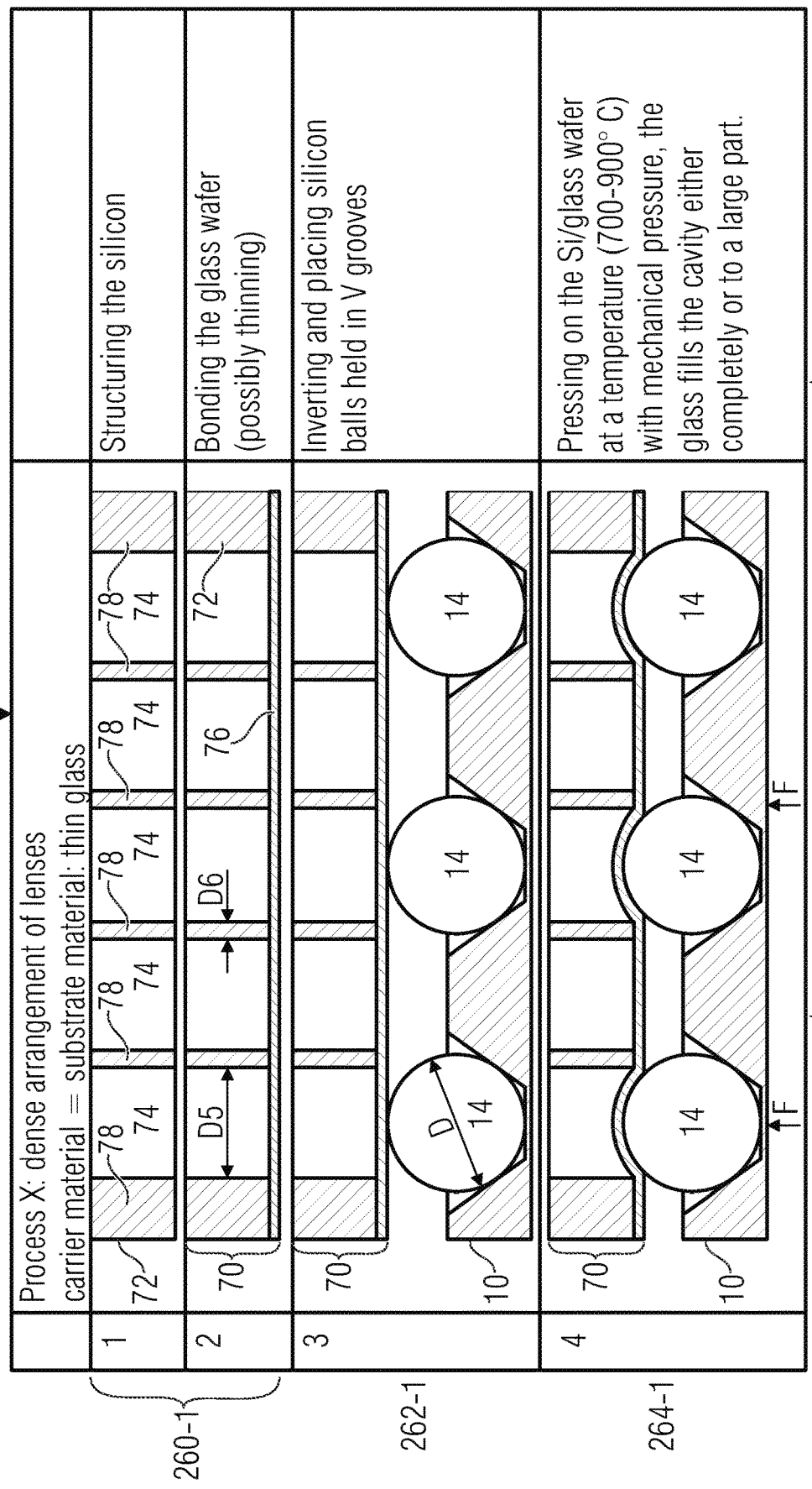
Fig. 7B (Con't)

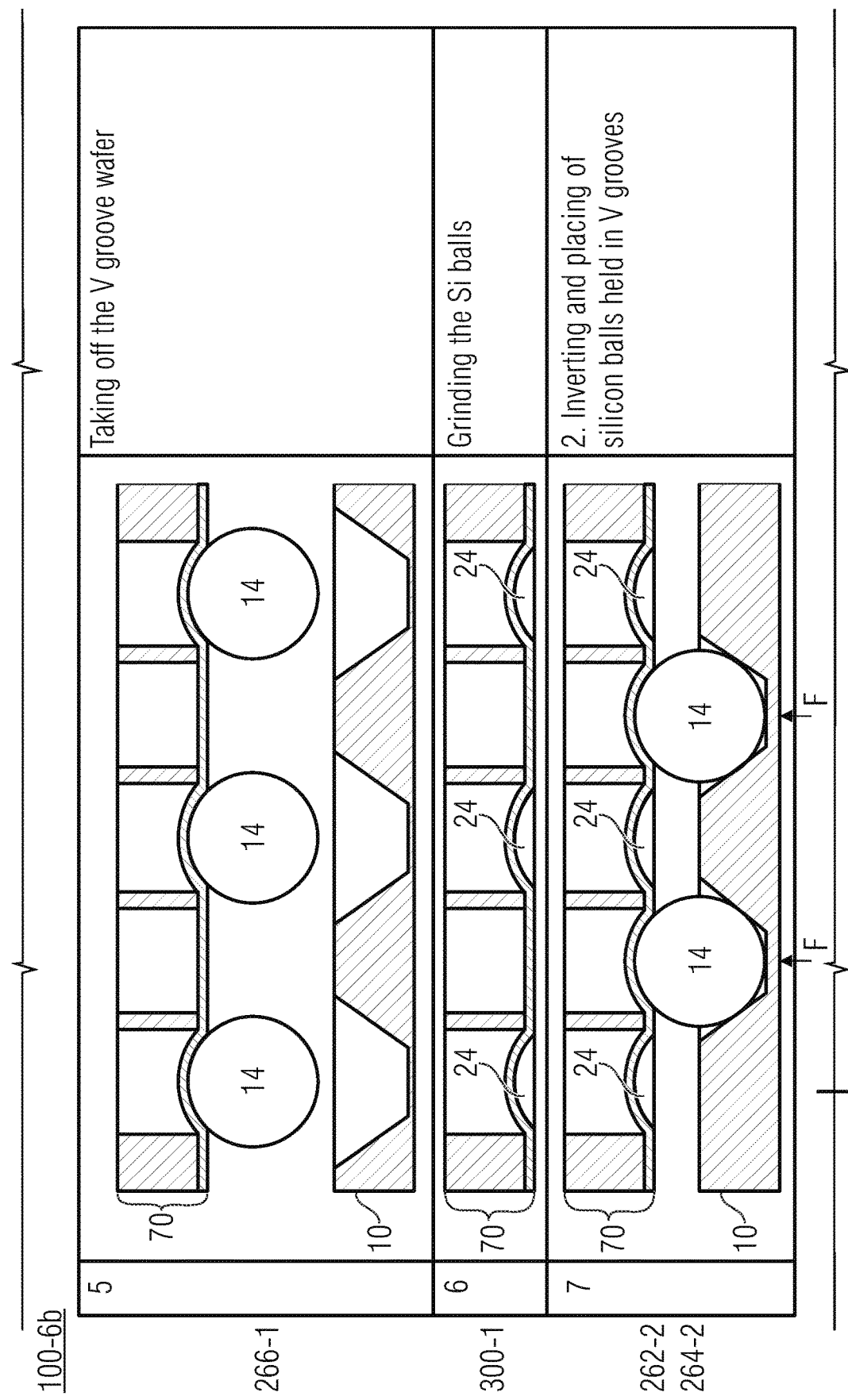
Fig. 7B (Con't)

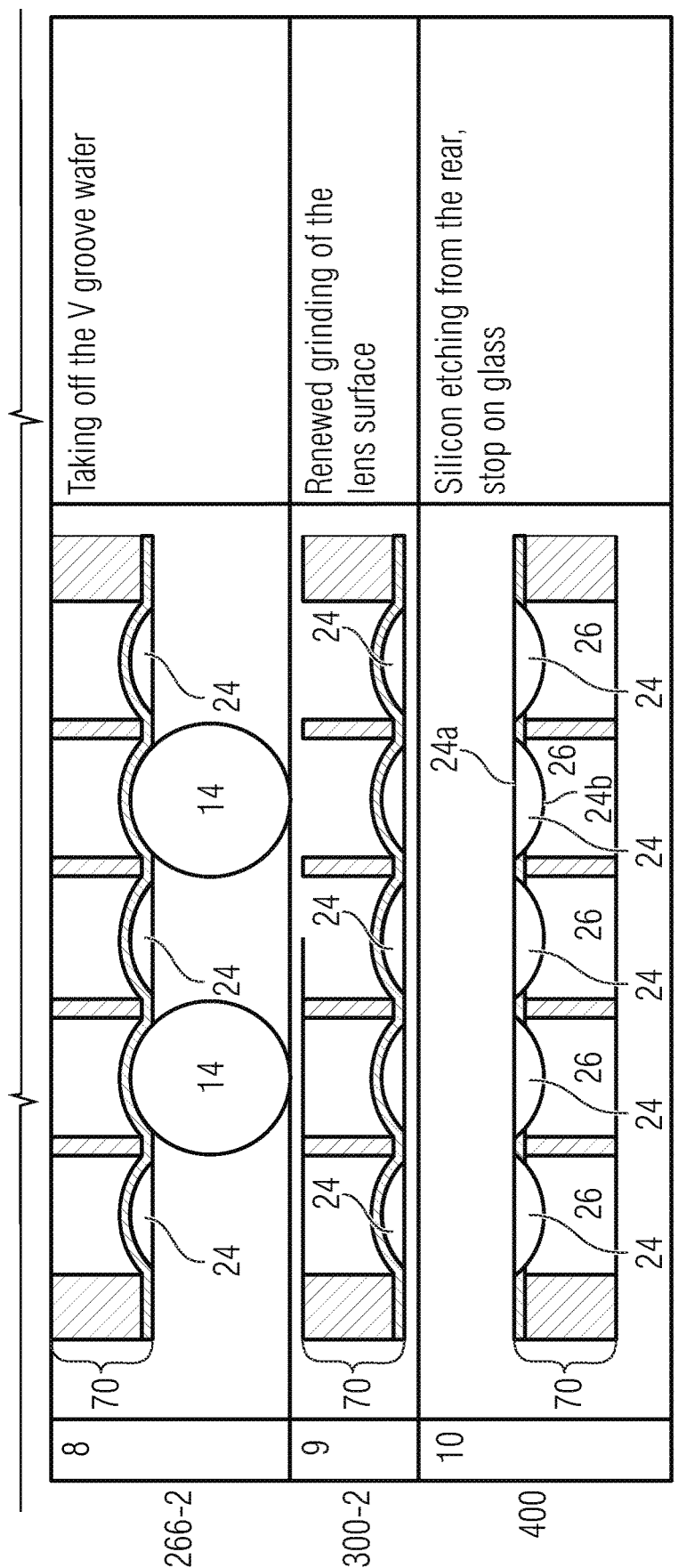
Fig. 7B (Con't)

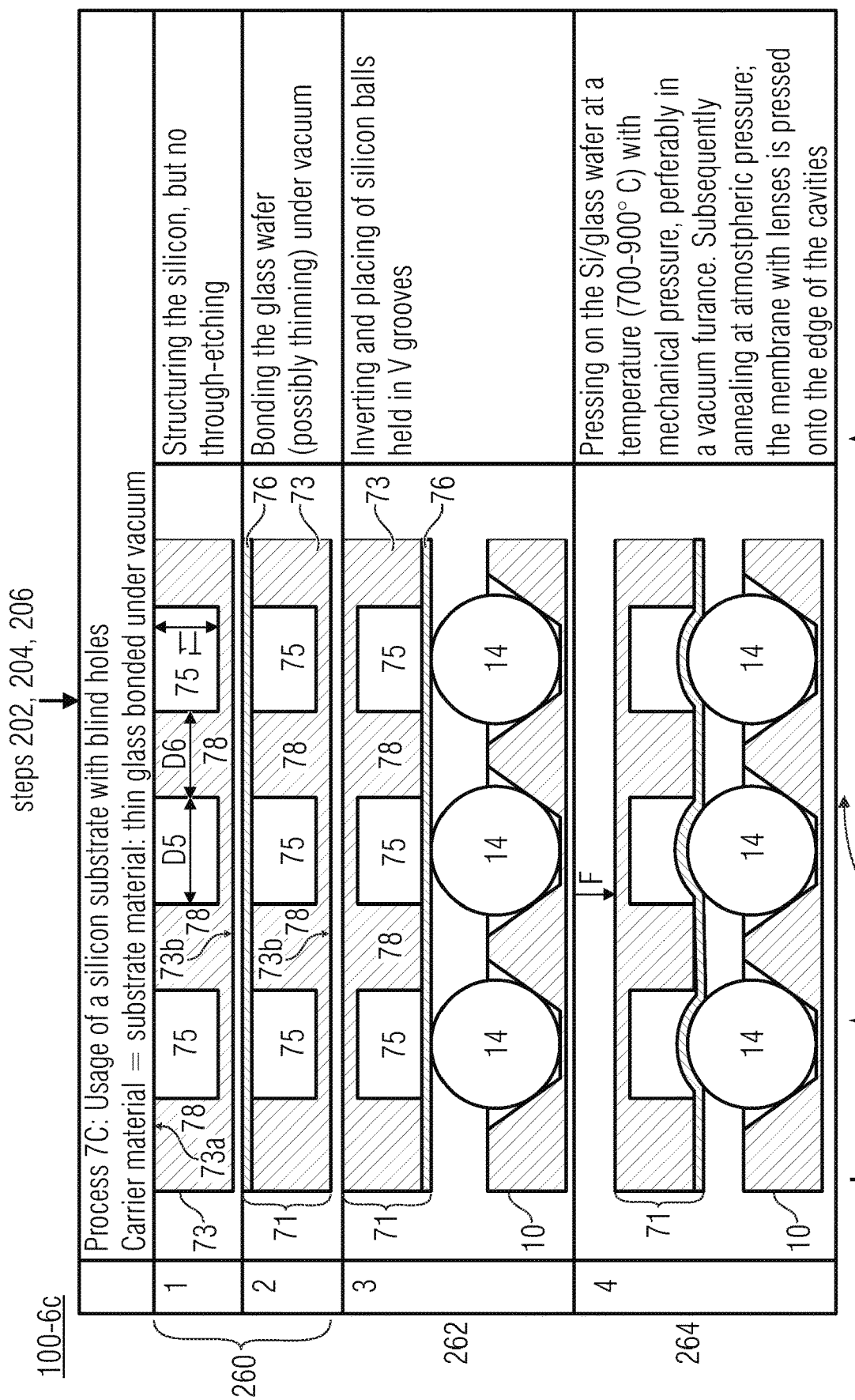
Fig. 7C (Con't)

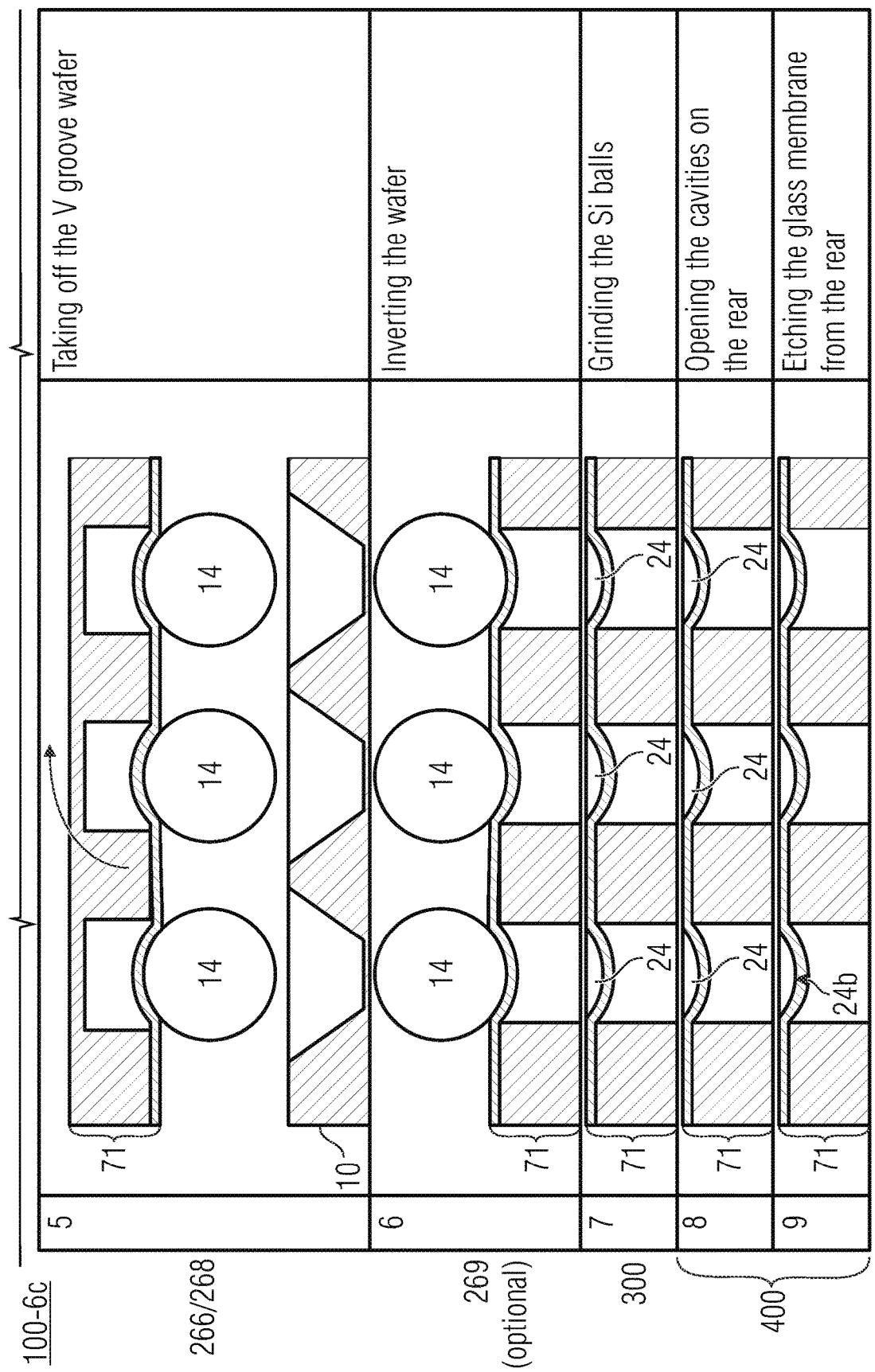
Fig. 7C (Con't)

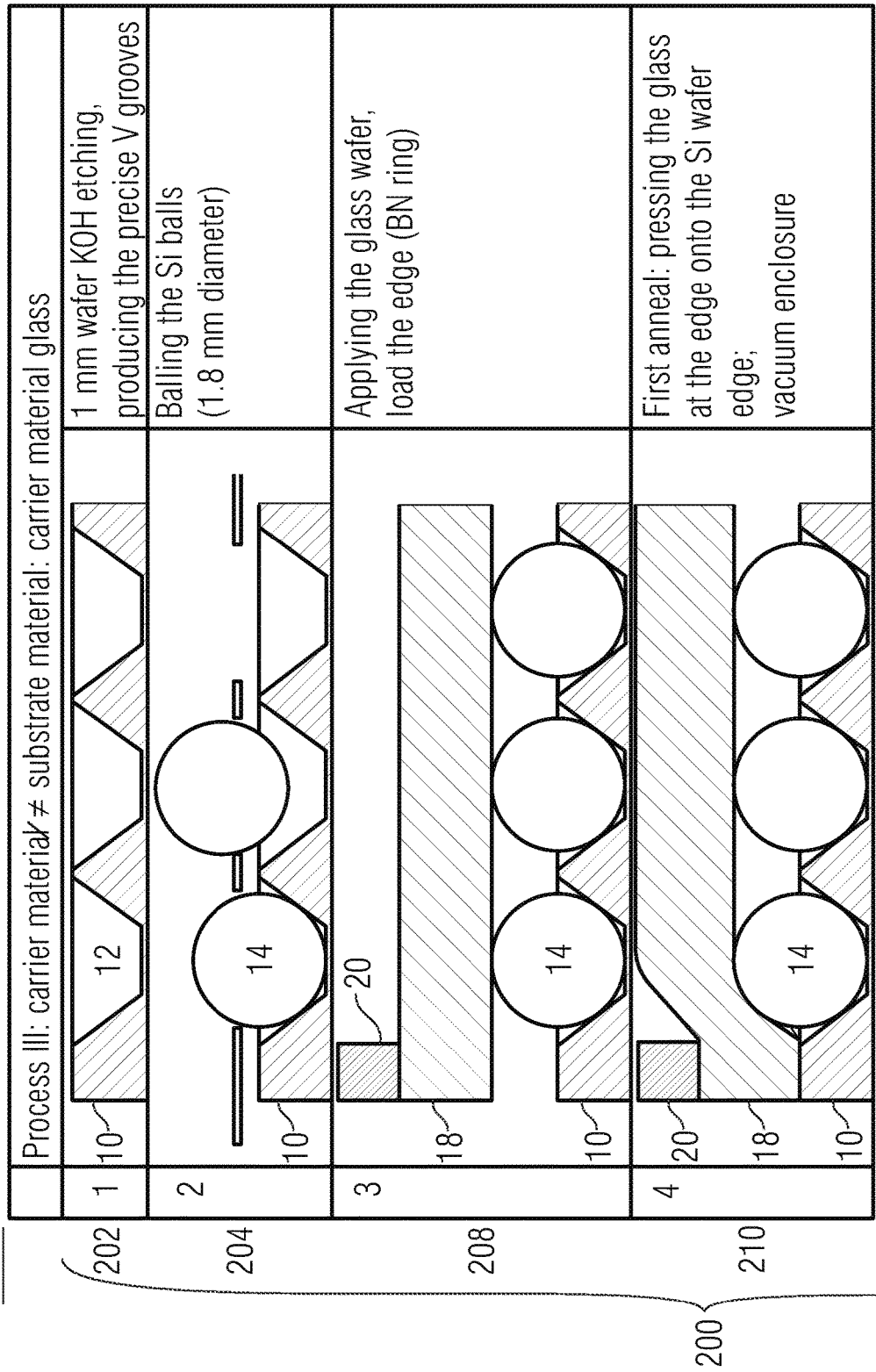
Fig. 8 (Con't)

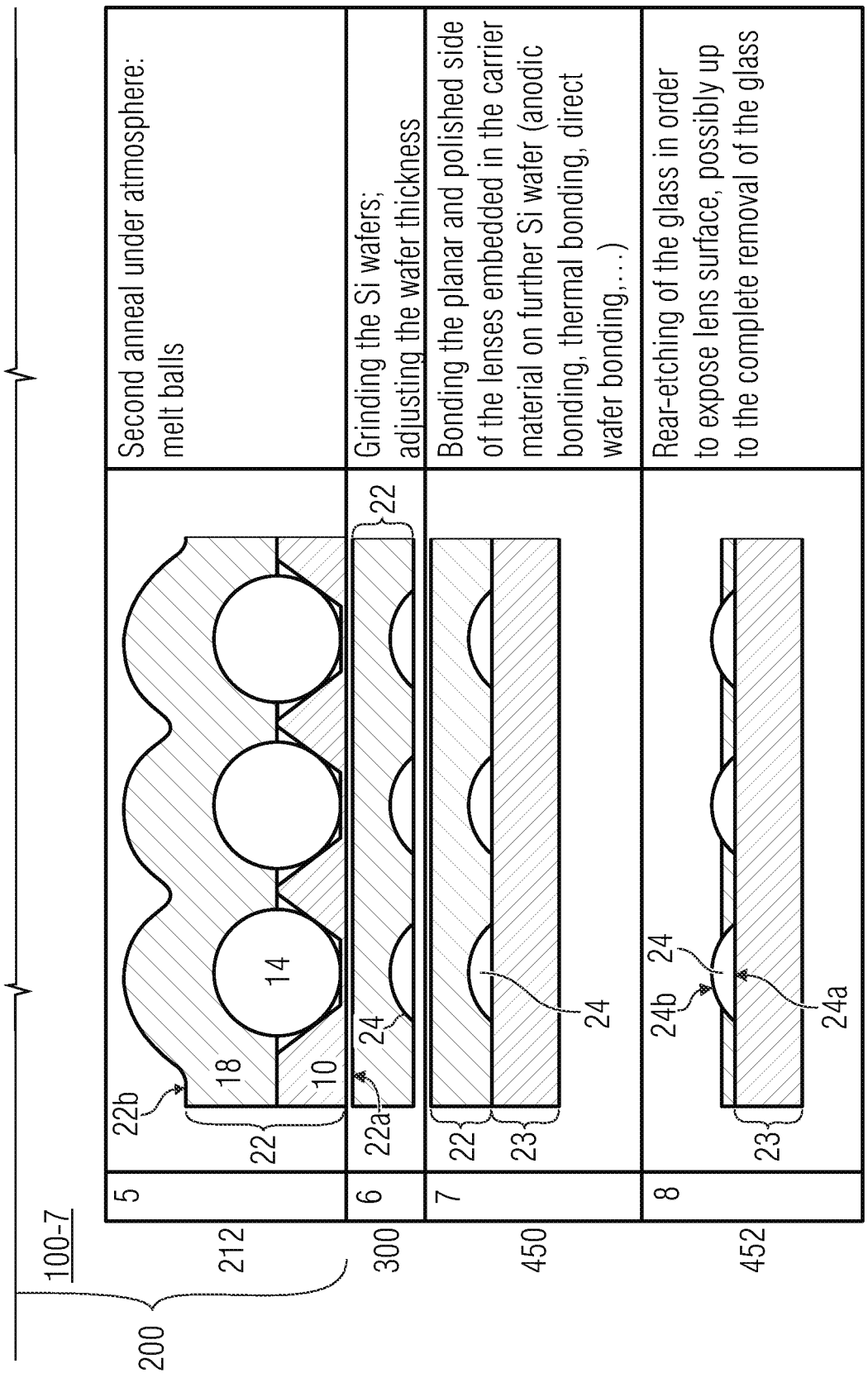
Fig. 8 (Con't)

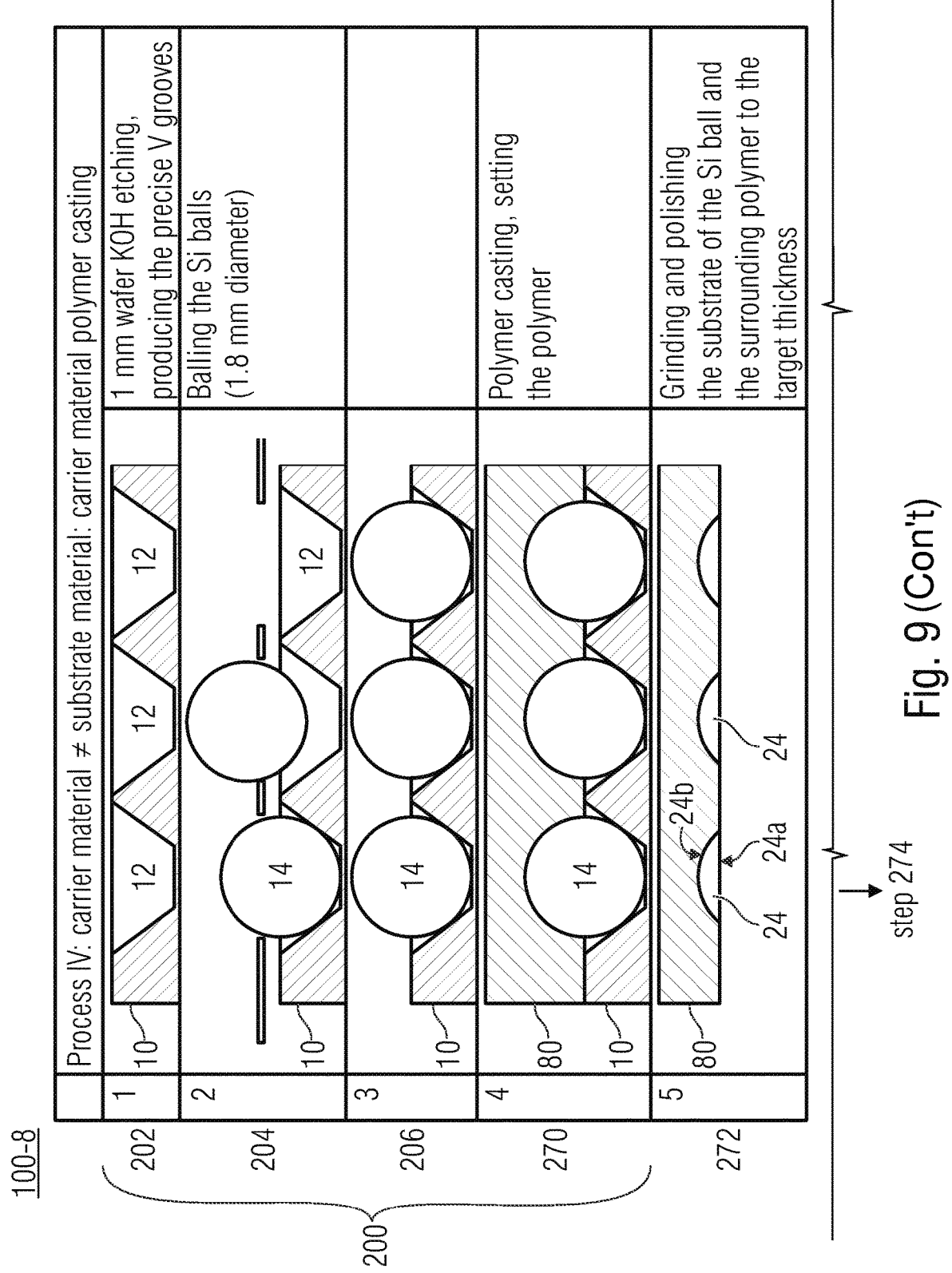
Fig. 9 (Con't)

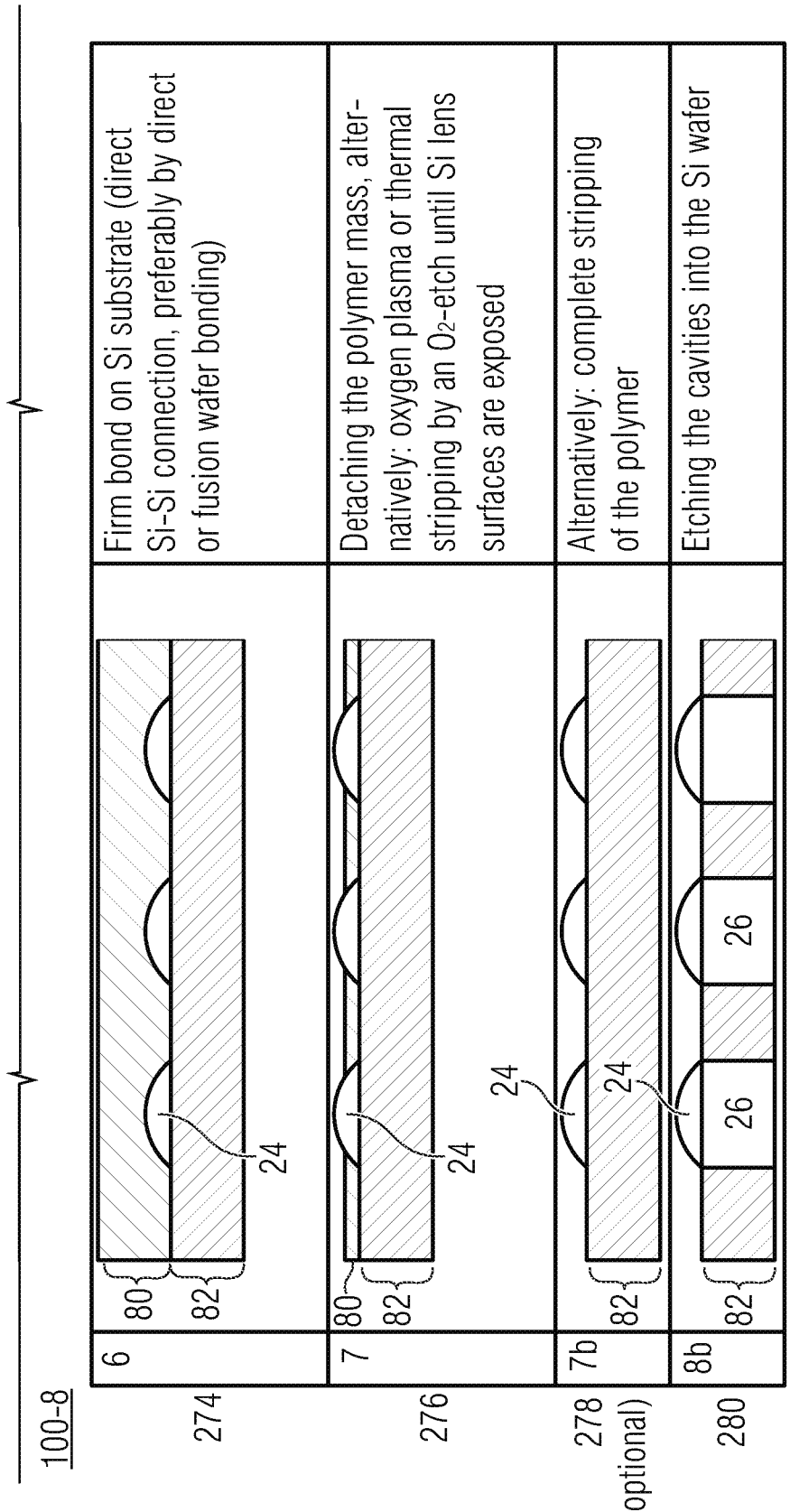
Fig. 9 (Con't)

METHOD FOR PRODUCING LENS ELEMENTS AND PACKAGED RADIATION-SENSITIVE DEVICES ON WAFER LEVEL

CROSS-REFERENCE TO RELATED APPLICATIONS

This application is a continuation of copending International Application No. PCT/EP2018/059460, filed Apr. 12, 2018, which is incorporated herein by reference in its entirety, and additionally claims priority from German Applications Nos 10 2017 206 387.4, filed Apr. 13, 2017, and 10 2017 213 065.2, filed Jul. 28, 2017, which are all incorporated herein by reference in their entirety.

The present invention relates to a production method for lens elements on wafer level and to a method for producing packaged radiation-sensitive devices on wafer level and in particular to a method for producing plano-convex silicon lenses on wafer level and packaged IR radiation-sensitive sensor elements on wafer level.

BACKGROUND OF THE INVENTION

Due to the inexpensive production methods for IR sensors, the demand for inexpensive optical IR components also increases, in particular for lenses. Silicon is a suitable material for this, since the same is largely transparent within wide ranges, but in particular in the technically important IR ranges of 3-5 µm and 8-25 µm. Since uncooled IR sensors, such as thermopiles or bolometers are already produced by methods of microelectronic processes and microsystem technology processes on silicon wafers, there is also a demand for producing silicon lenses on wafer level.

However, the present wafer-based production methods for silicon lenses all have specific disadvantages, in particular when the lenses are to have short focal lengths. These lenses with tight radii of curvature (ROC) have also a comparatively high rising height in the range of 50-200 µm, depending on the diameter of the aperture of the lens. Therefore, production methods based on plasma etching methods entail a comparatively long and expensive etching process.

The most important current production methods for silicon lenses on wafer level are the following:
a) Production of lenses from photoresist, either by application by dropping or by melting photoresist structures onto a silicon wafer and subsequent plasma etching into the silicon substrate, wherein the resist structure is stripped to that extent to which the lens structure is transferred into the silicon substrate.
b) Production of a lens structure from photoresist by means of grey shade lithography. Here, also, subsequently, the resist structure is transferred into the silicon substrate by plasma etching in a manner that is as accurate to shape as possible.
c) Wet-chemical etching: Here, closed photoresist structures provided with a large number of openings are used. The isotropic etching attack can be controlled via the density, size and position of these openings, such that lens-shaped structures can be produced.

However, all these processes have in common that the high demands on shape accuracy of the lenses are very difficult to fulfill. In particular, it is very difficult to ensure the quality of the structuring process across the entire wafer. Thus, all in all, the wafer yields are very problematic, especially against the background that very large yields should be ensured across the individual wafer.

In particular, there is a need for producing silicon lenses as precisely as possible on wafer level and to be able to join them still on wafer level with devices, such as the IR sensors, in a hermetically sealed manner. Here, the IR lenses should also be an integer component of the vacuum-tight cover of the devices (IR sensors). For this, however, the wafers should have a very large yield (>97%), since otherwise many devices fail due to the defective lenses mounted thereon.

SUMMARY

According to an embodiment, a method for producing plano-convex lens elements for radiation-sensitive devices, such as for optical sensors or IR sensors, may have the steps of: providing a first partial substrate with ball elements arranged thereon; providing a second partial substrate comprising a glass material layer; arranging the second partial substrate on the first partial substrate provided with the ball elements; fixing the ball elements to the glass material layer of the second partial substrate by means of annealing and applying mechanical pressure; and one-sided thinning of the ball elements fixed to the glass material layer of the second partial substrate to obtain the plano-convex lens elements.

According to another embodiment, a production method may have the steps of: providing a first partial substrate provided with depressions; arranging ball elements in the depressions of the first partial substrate; arranging a polymer material on the first partial substrate provided with the ball elements, such that after solidification of the polymer material the ball elements are embedded between the solidified polymer material and the first partial substrate, wherein the first partial substrate and the solidified polymer material form a carrier substrate; mechanical thinning of the carrier substrate, wherein the step of thinning the ball elements fixed to the carrier substrate takes place starting from the exposed main surface area of the first partial substrate to obtain the plano-convex lens element.

According to another embodiment, a method for producing a packaged device on wafer level may have the steps of: producing a carrier substrate provided with plano-convex lens elements according to the inventive method for producing plano-convex lens elements for radiation-sensitive devices; providing a device substrate with a plurality of devices; arranging the substrates on one another, such that the lens elements arranged on the carrier substrate are aligned with the associated devices of the device substrate, wherein the carrier substrate and the device substrate are joined in a hermetically sealed manner; and dicing the carrier substrate with the device substrate arranged thereon to obtain diced devices provided with at least one lens element each.

A production method 100 includes the following steps: providing 202 a first partial substrate 10 with ball elements 14 arranged thereon, providing a second partial substrate 30; 40; 56; 60; 70; 71 comprising a glass material layer 30; 44; 74, arranging 222 the second partial substrate 30; 40; 56; 60; 70; 71 on the first partial substrate 10 provided with the ball elements 14, fixing 200 the ball elements 14 to the glass material layer 30; 44; 54 of the second partial substrate by means of annealing and applying mechanical pressure, removing the first partial substrate 10 from the ball elements 14 fixed to the glass material layer 30; 44; 54; 74 and one-sided thinning 300 of the ball elements 14 fixed to the glass material layer 30; 44; 54; 74 of the second partial substrate 30; 40; 56; 60; 70; 71 to obtain plano-convex lens elements 24.

A method for producing a packaged device on wafer level includes the following steps: producing a carrier substrate provided with plano-convex lens elements, wherein ball elements 14 comprising a semiconductor material, e.g. ball elements 14 of a semiconductor material 22 are fixed to a carrier substrate 22 by means of pressure and heat and wherein the ball elements 14 fixed to the carrier substrate 22 are thinned on one side to form plano-convex lens elements 24 of a semiconductor material; providing a device substrate having a plurality of devices; arranging the substrates on one another, such that the lens elements arranged on the carrier substrate are aligned with the associated devices of the device substrate; and dicing the carrier substrate with the device substrate arranged thereon to obtain diced devices provided with at least one lens element each.

It is the core idea of the present invention to be able to produce lens elements of a suitable material, such as a semiconductor material, such as silicon lenses and in particular plano-convex silicon lens elements on wafer level by fixing ball elements (full ball elements or ball segment elements, e.g. of a semiconductor material) by means of pressure and heat to a glass material layer of a carrier substrate or by embedding the same into the same. The ball elements have a ball radius R. The carrier substrate with the glass material layer and the ball elements fixed thereto is then subject to a (mechanical) thinning process (grinding) such that the ball elements fixed to the carrier substrate are thinned on one side to form the plano-convex silicon lens elements. The thinning process can be performed until the needed "rising height", i.e. the height of the resulting ball segments is exactly adjusted based on the predetermined radius of curvature (ROC), such that the desired optical characteristics of the resulting silicon lens elements can be obtained exactly, since the convex-side radius of curvature of the silicon lens elements corresponds exactly to the ball radius of the silicon ball elements.

The inventive concept makes it possible to produce silicon lenses with extreme precision on wafer level and to join them still on wafer level with devices, such as the IR sensors, in a hermetically sealed manner. Here, the IR lenses can also be an integral component of the vacuum-tight cover of the devices (IR sensors). Further, it can be obtained that the wafers have a very large yield (>97%) and hence only very few devices fail due to defective lenses mounted thereon.

BRIEF DESCRIPTION OF THE DRAWINGS

Embodiments of the present invention will be detailed subsequently referring to the appended drawings, in which:

FIG. 2 is an exemplary basic flow diagram of the inventive production method according to a further embodiment;

FIG. 3 is an exemplary basic flow diagram of the inventive production method according to a further embodiment;

FIG. 4A is an exemplary basic flow diagram of the inventive production method according to a further embodiment;

FIG. 4B is an exemplary basic flow diagram of the inventive production method according to a further embodiment;

FIG. 5 is an exemplary basic flow diagram of the inventive production method according to a further embodiment;

FIG. 6 is an exemplary basic flow diagram of the inventive production method according to a further embodiment;

FIG. 7A is an exemplary basic flow diagram of the inventive production method according to a further embodiment;

FIG. 7B is an exemplary basic flow diagram of the inventive production method according to a further embodiment;

FIG. 7C is an exemplary basic flow diagram of the inventive production method according to a further embodiment;

FIG. 8 is an exemplary basic flow diagram of the inventive production method according to a further embodiment;

FIG. 9 is an exemplary basic block or flow diagram of the inventive production method according to a further embodiment;

DETAILED DESCRIPTION OF THE INVENTION

Before embodiments of the present invention will be discussed in more detail based on the drawings, it should be noted that identical equal or equally functioning elements, objects, functional blocks and/or method steps in the different figures are provided with the same reference numbers, such that the description of these elements, objects, functional blocks and/or method steps (having the same reference numbers) illustrated in different embodiments are interchangeable or interapplicable. In the subsequent description, the description of an element of a semiconductor material means that the element comprises a semiconductor material i.e. is at least partly or also completely formed of the semiconductor material.

Figure 1:
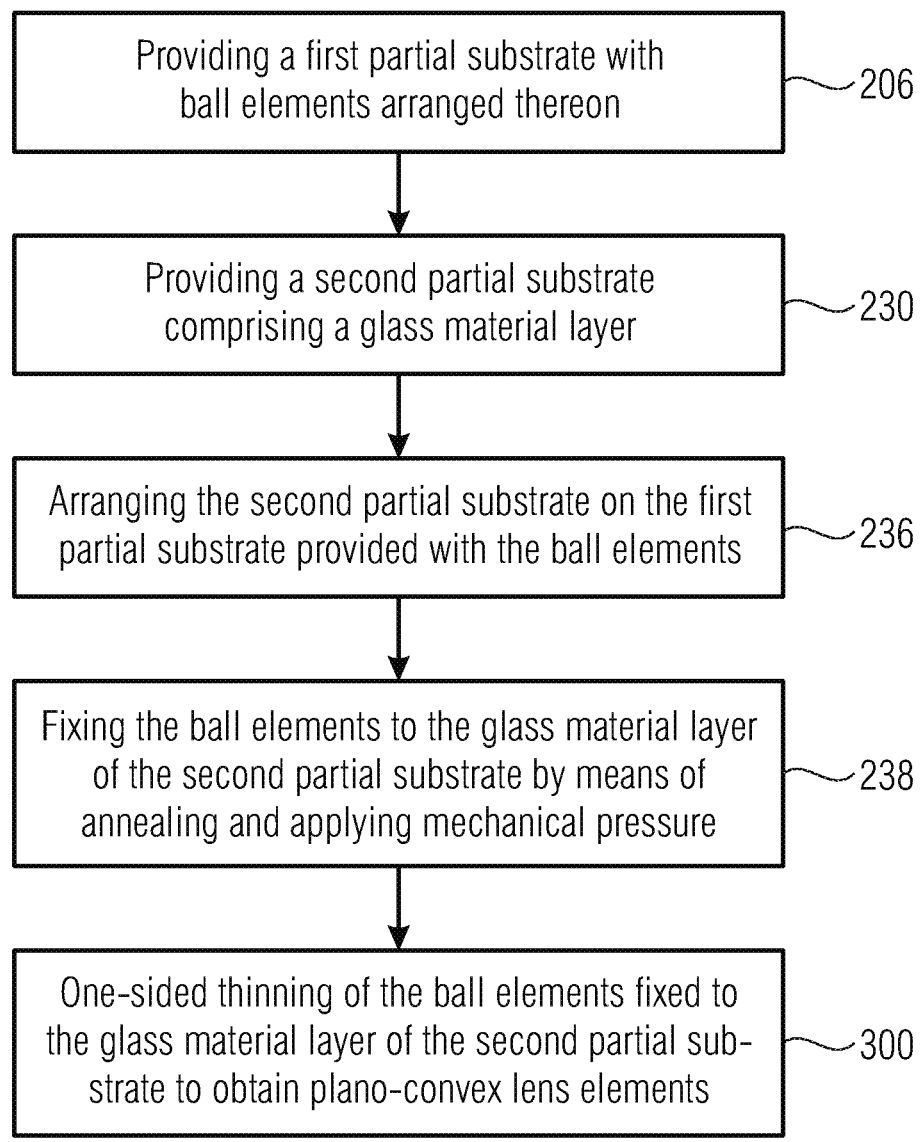
FIG. 1 is a flow diagram of the inventive production method according to an embodiment.

FIG. 1 shows a flow diagram of the inventive method 100 for producing lens elements, e.g. lens elements of a semiconductor material, such as silicon, on wafer level, wherein the resulting lens elements are formed in a plano-convex manner. Since silicon is stated as suitable material for the lens elements for the inventive method for producing lens elements on wafer level, in the following, frequently, "silicon lens elements (or Si-lens elements)" are mentioned. However, it should be clear that the usage of silicon as material for the lens elements is only exemplary, wherein depending on the field of application, for example, different materials or semiconductor materials, such as GaAs, CdTe, Ge, ZnSe, ZnS, KRS-5, CaF2, BaF2, etc. that are (possibly) transparent to the desired wave length range can be used for the lens elements.

With reference to the method 100 of FIG. 1, a first partial substrate with ball elements arranged thereon is provided, whereupon a second partial substrate is provided that comprises a glass material layer. The second partial substrate is arranged on the first partial substrate provided with the ball elements. In a further step 200, the ball elements, i.e. for example full ball or ball segment elements of a semiconductor material, such as silicon, are fixed to a carrier substrate by applying mechanical pressure and heat (annealing). The ball elements (Si-ball elements) have a predetermined ball radius R. Thereupon, the first partial substrate is removed from the ball elements fixed to the glass material layer.

In a subsequent step 300, the ball elements (e.g. Si-ball elements) fixed to the carrier substrate are mechanically thinned on one side, e.g. by means of a grinding method to obtain the plano-convex lens elements, for example of a semiconductor material, such as silicon etc. Here, the convex-side radius of curvature of the produced lens elements corresponds to the ball radius R of the (unprocessed or unthinned) ball elements fixed to the carrier substrate. By thinning the ball elements fixed to the carrier substrate on one side, further, the planar side of the plano-convex lens elements is formed.

Figure 10:
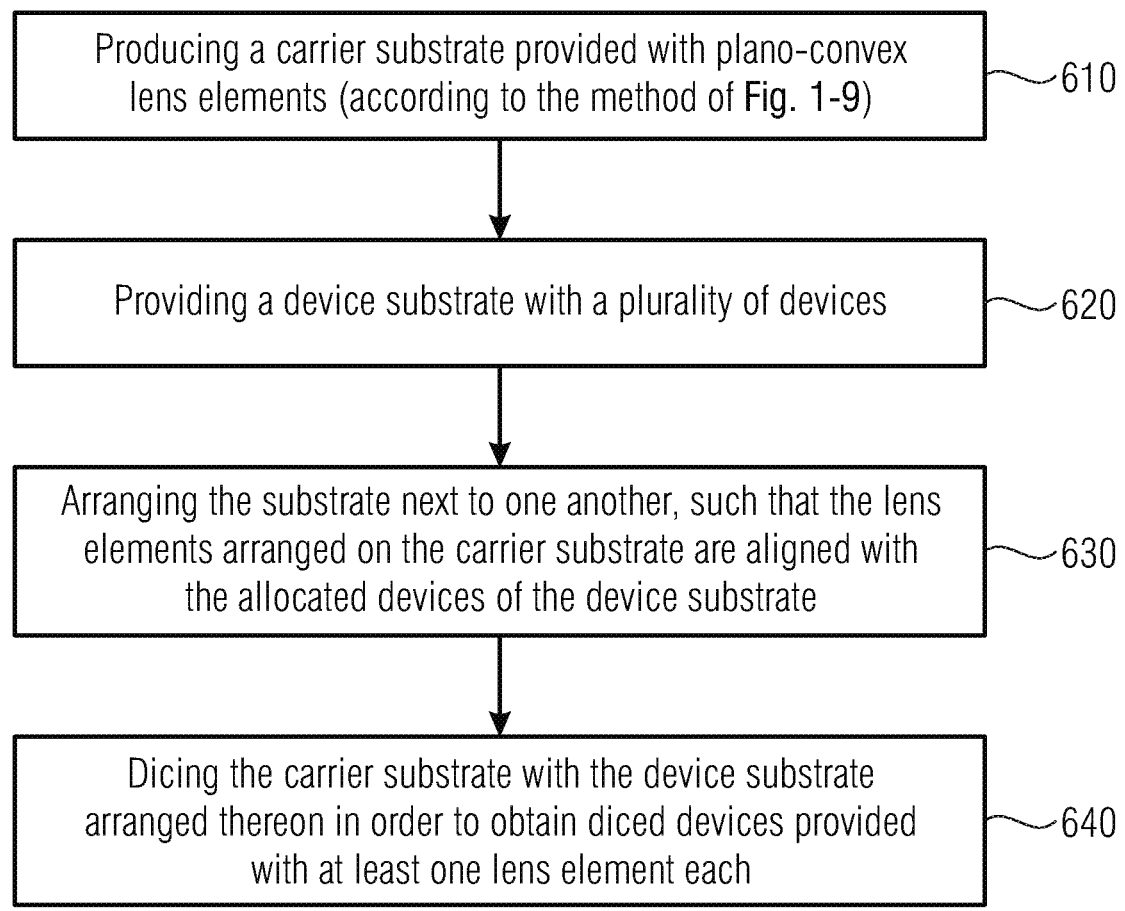
FIG. 10 is an exemplary basic flow diagram of a method for producing a packaged device on wafer level.

In a subsequent optional step 630, cf. FIG. 10, devices, such as optical sensors (IR sensors) are fixed to the carrier substrate provided with lens elements to obtain an arrangement with devices, wherein the devices are provided with at least one lens element each.

The devices can be arranged on a substrate (device substrate or device wafer), such that the mechanical fixing 630 or hermetically sealed joining or bonding of the lens elements with the devices can take place as bonding method of two wafers. In a subsequent step 640, the carrier substrate with the devices arranged thereon (or the device substrate arranged thereon) can be diced to obtain the diced devices (optical sensors or IR sensors) provided with at least one lens element each.

In the following, based on FIGS. 2 to 9, exemplary process sequences or process flows for implementing the production method 100 illustrated in FIG. 1 will be described.

All process alternatives described below are based on the basic concept that, at first, ball elements, for example of a semiconductor material, are fixed to a carrier substrate by means of pressure and heat or are embedded in the same, whereupon the ball elements fixed to the carrier substrate are thinned mechanically on one side to obtain plano-convex lens elements of a semiconductor material, such as silicon. Depending on the process sequence, it is also possible that the carrier substrate is subject to mechanical thinning (grinding) only on one side or also on both sides.

FIG. 2 shows an exemplary flow diagram 100-1 of the inventive production method of plano-convex lens elements, e.g. lens elements of a semiconductor material, such as silicon, on wafer level. In the following, first, the process sequence of step 200 of fixing ball elements of a semiconductor material, such as silicon, to a carrier substrate will be described.

First, in a step 202, a first (partial) substrate 10 having depressions 12 is provided. The first partial substrate 10 is provided for receiving ball elements, wherein the depressions 12 can be formed, for example, in a square or rectangular or circular manner.

The first partial substrate can, for example, be a semiconductor wafer having a thickness between 0.5 and 2.0 mm or 0.8 to 1.2 mm or having a thickness of approximately 1 mm. For example, a silicon wafer having a thickness of approximately 1 mm (or between 0.5 and 2.0 mm or 0.8 to 1.2 mm) can be used, wherein, for example, by means of a KOH etching process (KOH=potassium hydroxide), the depressions (V grooves) can be produced precisely. If the semiconductor wafer is, for example an (100) silicon material, an etching angle of 54.74° with respect to the horizontal results, as shown exemplarily in FIG. 1. In other semiconductor materials or other cutting planes of the semiconductor material, other etching angles can be obtained or realized.

As shown in FIG. 2 at step 204, a plurality of ball elements 14 of a semiconductor material having a diameter D=2R (e.g. D is approximately 1.8 mm or D is between 1.0 to 2.5 mm or between 1.5 to 2.1 mm) can be provided, wherein then one ball element 14 each is inserted into one of the depressions 12 of the first partial substrate 10, such that, e.g., one ball element 14 each is within a depression 12 of the first partial substrate. This process is also referred to as "balling".

The depressions 12 in the first partial substrate 10 can be formed with high accuracy by means of conventional semiconductor processing technologies, such as etching methods, such that, for example, an exact fit between the respective ball element 14 and the bottom or sidewalls of the depressions 12 can be obtained. In a step 204, for example (in the sectional plane three) exactly adjustable contact points p1, p2 and p3 (or one contact point p2 (optional) and one contact line p1, p3) are stated. Thereby, very exact arrangement and positioning of the ball elements 14 on the first partial substrate 10 can be obtained. In step 206, the ball elements 14 are arranged in the depressions 12 of the first partial substrate 10 and are available for further processing.

In a further step 208, a second (partial) substrate 18 is arranged on the first partial substrate 10 provided with the ball elements 14, however, the second partial substrate 18 can comprise, for example, a glass material. In step 208, a "glass wafer" 18 can be "applied" to the partial substrate 10 provided with the ball elements 14. As further illustrated in the step 208, a ring 20 (e.g. a BN ring, BN=boron nitride) be provided circumferentially on the edge region of the second partial substrate 18 to firmly fix (bond) the first and the second partial substrate 10, 18 at least in an edge region (wafer edge) in a subsequent temperature treatment step 210 (annealing "T-1" or first anneal) at a temperature of, for example 700-900° C. For this, in addition to the temperature treatment by the ring 20, mechanical pressure is applied to the glass material of the second partial substrate 10.

In this first annealing process, for example, the glass material of the second partial substrate 18 is pressed onto the edge region of the first partial substrate 10 (e.g. Si-wafer edge region) to obtain the glass Si-fixing between the first and second partial substrate 10 and 18 at this edge region. This first annealing process T-1 is performed, for example at an atmosphere with extremely low pressure (i.e. high negative pressure) or possibly under vacuum (as far as technically realizable), such that in the enclosed inner region between the first and second partial substrate 18, a respective atmosphere possibly close to vacuum is formed, such that vacuum enclosure can be obtained. As vacuum, a coarse vacuum of 300 . . . 1 hPa (mbar), a fine vacuum of 1 . . . $10^{-3}$ hPa, a high vacuum (HV) of $10^{-3}$ . . . $10^{-7}$ hPa, a ultrahigh vacuum (UHV) of $10^{-7}$ . . . $10^{-12}$ hPa or an extremely high vacuum (XHV) of $<10^{-12}$ hPa can be used.

In a further temperature treatment step 212 (second anneal or annealing T2) with the two partial substrates 10, 18 fixed to one another, an at least partial liquefaction or sufficient softening of the glass material of the second partial substrate 18 is obtained, such that the ball elements 14 are at least partly engulfed by the liquefied or sufficiently softened glass material of the second partial substrate 18, i.e. that the liquefied or flowable glass material of the second partial substrate 18 flows (according to the obtained viscosity of the liquefied glass material) around and between the ball elements 14 into the existing gaps. Here, for example a normal or higher atmospheric pressure is used to melt the ball elements 14 into the glass material of the second partial substrate 18. After resolidification of the glass material of the second partial substrate 18, the ball elements 14 are embedded or melted in between the first partial substrate 10 and the solidified glass material of the second partial substrate 18. In that way, the first partial substrate 10 and the resolidified glass material of the second partial substrate 18 form the carrier substrate 22 in which the ball elements 14 are fixed or embedded.

In the process flow 100-1 of the inventive production method based on FIG. 2, for example, a glass material or glass substrate material is used as carrier material for the lens elements, wherein the ball elements (e.g. Si-balls) are remelted by the glass material under vacuum to obtain embedding of the ball elements into the carrier substrate.

For the subsequent description, the exposed outer area of the first partial substrate 10, i.e. the bottom with respect to the arrangement in step 212 of FIG. 2 is referred to as first main surface area 22a of the carrier substrate 22, while the exposed outer area of the second partial substrate 18, i.e. the top with respect to the arrangement illustrated in the step 212 of FIG. 2 is referred to as second main surface area 22b of the carrier substrate 22.

Here, the method step 212 of FIG. 2 is based, for example, on technologies of so-called glass flowing. The following glass materials can be used, for example as glass materials for the second partial substrate 18, such as Pyrex, Borofloat, AF 32, Eagle XG, Hoya SD 2, etc., wherein this list is not to be considered as conclusive. As material or semiconductor material of the first partial substrate 10, for example, silicon can be used. Here, the coefficient of thermal extension (CTE) of the glass materials of the second partial substrate 18 should match the used semiconductor material of the first partial substrate 10 to keep the resulting thermomechanical tensions as low as possible. Adapted coefficients of thermal extension mean, for example, that the CTE of the glass material in embodiments does not deviate by more than 1-2 ppm/° C. from the CTE of the used semiconductor material. In embodiments, the CTE of the glass material is selected, for example, to deviate by less than 0.5 ppm/° C. from the CTE of the semiconductor material.

To obtain the desired plano-convex lens elements from the ball elements 14, the carrier substrate 22 is thinned (e.g. mechanically) on both sides, i.e. processed by means of a grinding method. Starting from the second main surface area 22b of the carrier substrate 22, unevennesses in the solidified glass material of the second partial substrate 18 are planarized in the mechanical thinning process.

In step 304, on the one hand, the material of the first partial substrate 10 is removed, e.g., by means of grinding, wherein further the ball elements 14 fixed to the resulting carrier substrate 22 are thinned (mechanically ground) starting from the first main surface area 22a of the carrier substrate 22 to obtain plano-convex lens elements 24. By exactly adjusting the resulting wafer thickness of the carrier substrate 22, the exact optical characteristics of the resulting lens elements 24 can be adjusted. Here, the planar side 24a of the resulting plano-convex lens elements is flush with the thinned rear (first main surface) of the carrier substrate 22, while the convex side 24b of the lens elements 24 is in the solidified glass material of the second partial substrate 18. The radius R of the resulting plano-convex lens elements corresponds to the radius of the original ball elements 14 while the height (rising height) of the resulting plano-convex lens elements 24 is obtained or adjusted by adjusting the resulting wafer thickness in the mechanical thinning process. In this context, the distance between the planar area 24a of the plano-convex lens elements 24 and the peak of the convex side 24b of the lens elements 24 is referred to as rising height.

In a subsequent step 306 cavities (e.g. open on one side) starting from the outer exposed surface area of the second partial substrate, i.e. starting from the second main surface area 22b of the thinned carrier substrate 22 to the lens elements 24 can be made. Here, one cavity 26 each can be generated per lens element 24, wherein the area of the convex side 24b of the lens elements 24 bordering on the respective cavity is exposed. The cavities 26 can be formed, for example by means of glass etching processes in the (residual) glass material of the first partial substrate, such that the plano-convex lens elements (Si-lenses) 24 are exposed on the inside, i.e. with respect to the second main surface area 22b.

Therefore, the above illustrated method steps 200, 204, 206, 208, 210 and 212 together form the step 200 of fixing 200 ball elements of a semiconductor material to a carrier substrate, while the individual steps 302, 304 and 306 of FIG. 2 realize the step 300 of thinning the ball elements fixed to the carrier substrate on one side for forming the plano-convex lens elements of a semiconductor material.

In the following, based on FIG. 3, an exemplary flow diagram of a further production method 100-2 for producing plano-convex lens elements (at least partly) of a semiconductor material on wafer level will be described.

In step 202, a first partial substrate 10 provided with depressions 12 is provided. In step 204, ball elements 14 are arranged or inserted in the depressions 12 of the first partial substrate 10, such that one ball element 14 each is within a depression 12 of the first partial substrate (step 206).

In step 222, a second partial substrate 30 comprising a glass material is provided which comprises depressions 32, such as continuous bores or vias in the second partial substrate 30.

The second partial substrate 30 is arranged on the first partial substrate 10 provided with the ball elements 14, wherein the depressions 32 in the first partial substrate 18 are aligned with the ball elements 14 arranged in the depressions 12 of the first partial substrate 10. Thus, the bored glass wafer 30 is applied to the first partial substrate 10 provided with the ball elements (partial wafers). Here, the diameter D1 of the recesses 32 in the second partial substrate 30 is smaller than the diameter D of the ball elements 14. The diameter D1 of the depressions 32 is, for example 20 to 70% or 40 to 60% of the diameter d of the ball elements 14, i.e. D1=0.2-0.7*D or D1=0.4-0.6*D.

In step 224, mechanical pressure F is applied to the second partial substrate 30 in that the second partial substrate 30 (e.g. a glass substrate) is loaded, for example, by a weight 34. In a further step 226, performed, for example, together with step 224, the second partial substrate 30 is fixed or pressed onto the ball elements 14 arranged in the depressions of the first partial substrate 10 by applying an increased temperature, e.g. in a range of 700 to 900° C. and by applying the mechanical pressure F (of step 224). Thus, the glass wafer 30 is pressed onto the surrounded (framed) semiconductor ball elements 14 (e.g. silicon balls). Thereby, a press fit of the ball elements 14 in the depressions 32 of the second partial substrate 30 is obtained by means of glass semiconductor bonding, wherein, for example one ball element 14 each is mounted or fixed to a depression of the second partial substrate 30.

In a step 228, the first partial substrate 10 is removed from the ball elements 14 firmly connected to the second partial substrate 30, wherein the second partial substrate 30 now serves as carrier substrate.

Thus, the above described steps 202, 204, 206, 222, 224, 226 and 228 form the inventive step 200 of fixing the ball elements 14 by means of pressure and heat to a carrier substrate. As further illustrated in FIG. 3, in the step 300 of thinning or mechanical grinding the plano-convex lens elements 24 are formed of the ball elements fixed to the second partial substrate 30 (carrier substrate). Here, the convex side 24b of the lens elements 24 is at the depressions 32 of the second partial substrate (carrier substrate), wherein the planar side 24a of the plano-convex lens elements 24 is (directly) obtained by the step of thinning. Here, the depressions 32 of the second partial substrate 30 form the cavities 26 (open on one side) for the plano-convex lens elements 24, wherein the (optically effective) area (of the convex side 24b) bordering on the cavity 26 of the lens elements 24 is respectively exposed.

As becomes clear by the above statements, for example, the method steps 202, 204, 206, 222, 224, 226 and 228 form the step 200 of fixing ball elements of a semiconductor material to a carrier substrate. Further, in step 300, the ball elements fixed to the carrier substrate are mechanically thinned on one side to obtain the plano-convex lens elements. In the procedure illustrated based on FIG. 3, the resulting carrier substrate 22 comprises, for example, glass as a substrate material, wherein the principle illustrated in FIG. 3 is based on mechanically pressing the glass substrate onto the ball elements arranged on the first partial substrate.

In the following, based on FIG. 4A, an exemplary flow diagram of a further production method 100-3a for producing plano-convex lens elements of a semiconductor material on wafer level will be described.

In step 202, a first partial substrate 10 provided with depressions 12 is provided. In step 204, ball elements 14 are inserted in the depressions 12 of the first partial substrate, such that, for example, one ball element 14 each is within a depression 12 of the first partial substrate.

In step 230, a second partial substrate 40 is provided, wherein the second partial substrate 40 comprises an auxiliary substrate 42 of a semiconductor material, e.g., a silicon wafer and a layer 44, e.g., of a glass material (glass layer 44) that is arranged on a first main surface area of the auxiliary substrate 42.

The auxiliary substrate 42 comprises vias 48, each corresponding to the positions of the ball elements 14 arranged on the first partial substrate 10, which can be aligned with the same, i.e., the vias 48 and the ball elements 14 can be arranged in a centered manner to each other. Further, the glass material layer 44 comprises openings 46 that are aligned with the vias 48 of the auxiliary substrate 42 (essentially in a centered manner). The diameter D2 of the openings 46 of the glass material layer 44 is smaller than the diameter D3 (D2<D3) of the vias 48 of the auxiliary substrate 42.

The diameter D2 of the openings 46 of the glass material layer 44 is, for example, 20 to 70% or 40 to 60% of the diameter D3 of the vias 48 of the auxiliary substrate 42, i.e., D2=0.2-0.7*D3 or D2=0.4-0.6*D3. Further, the thickness of the glass material layer 44 can, for example, be between 10 and 100 µm, between 30 and 70 µm and approximately 50 µm.

Here, the diameter D3 of the vias 48 in the auxiliary substrate is smaller than the diameter D of the ball elements 14. The diameter D3 of the vias 48 is, for example, 20 to 70% or 40 to 60% of the diameter D of the ball elements 14, i.e., D3=0.2-0.7*D respectively D3=0.4-0.6*D.

Since the openings 46 of the glass material layer 44 have a smaller diameter than the vias 48 of the auxiliary substrate 42, a projection of the glass material layer (laterally) beyond the vias 48 is provided on the side of the vias 48 of the auxiliary substrate 42 provided with the glass material layer 44.

In the following, exemplary partial steps for producing and providing the second partial substrate 40 will be described. Thus, for example in step 232, a (thin) glass material layer 44 can be deposited on the auxiliary substrate 42 (semiconductor substrate or further Si wafer), i.e., for example, a glass wafer can be bonded on the semiconductor wafer, whereupon the glass wafer is thinned to the desired thickness of the glass material layer. In step 233, for example, the glass material layer 44 is structured to form the openings 46. In step 234, the vias 48 are generated in that, for example, starting from the rear (second main surface area) of the auxiliary substrate 42, the present semiconductor material, for example silicon, is etched through, wherein the glass projections 46a are generated laterally at the vias 48 at the first main surface area of the auxiliary substrate 42.

In a step 236, the second partial substrate 40 is arranged or placed on the first partial substrate 10 provided with the ball elements 14. Here, the first main surface area of the second auxiliary substrate 40 provided with the glass material layer 44 is facing the ball elements 14 inserted in the depressions 12 of the first partial substrate 10, wherein further the ball elements 14 are aligned with the vias of the second partial substrate and with the openings of the glass material layer (possibly in a centered manner). Thus, starting from step 234, the second partial substrate is "inverted" and placed onto the semiconductor ball elements 14 (e.g., silicon balls) held in the depressions 12 (e.g., V grooves).

In a step 238, the second partial substrate provided with the glass material layer 44 is pressed onto and fixed to the ball elements 14 arranged in the depressions 12 of the first partial substrate 10 at increased temperature (temperature treatment or annealing) and with (high) mechanical pressure. Fixing is obtained by thermally bonding the glass material of the glass material layer 44 with the semiconductor material (silicon) of the ball elements 14. Thus, the semiconductor wafer 14 provided with a glass material layer 44 is pressed onto the semiconductor ball elements (silicon balls) 14 arranged on the auxiliary substrate 10 at increased temperature (e.g., 700-900° C.) and with mechanical pressure F. in the above illustrated process flow 100-3a, a thin glass layer arranged on a partial substrate 10 serves as substrate material for fixing the semiconductor ball elements.

In step 240, the first partial substrate 10 (the V groove wafer) is removed or taken off from the ball elements 14 firmly connected to the second partial substrate 40, wherein now the second partial substrate 40, together with the auxiliary substrate 42 and the glass material layer 44 arranged thereon, forms the carrier substrate to which the ball elements 14 are fixed.

In step 300, the ball elements 14 fixed to the carrier substrate 40 are thinned on one side, i.e., the silicon ball elements are processed by a grinding process to obtain the plano-convex lens elements 24 of the semiconductor material (silicon). The process of mechanical thinning is performed until the desired resulting lens shape (lens height) of the plano-convex lens elements 24 is obtained.

The planar side 24a of the plano-convex lens elements 40 is obtained (directly) by the step of mechanical thinning, wherein the convex side 24b of the lens elements 24 is at the vias of the second partial substrate 40 (carrier substrate). Thereby, the vias 48 of the second partial substrate 40, i.e., the vias through the auxiliary substrate 42 and through the glass material layer 44, form cavities 26 (open on one side) for the lens elements 24, wherein the (optically effective) area of the convex side 24 of the lens elements bordering on the cavity is (respectively) exposed.

Thus, the above statements show exemplarily that the method steps 202, 204, 230, 236, 238 and 240 are provided for fixing the semiconductor ball elements to the carrier substrate while then in step 300 one-sided thinning the ball elements fixed to the carrier substrate is performed to obtain the plano-convex lens elements 24 on wafer level, i.e., fixed to the carrier substrate.

In the following, based on FIG. 4B, an exemplary flow diagram of a further production method 100-3b for producing plano-convex lens elements of a semiconductor material on wafer level will be described.

First, in a method 100-3b, the method steps 200, 204 and 206 already described based on FIGS. 2, 3 and 4a will be performed to provide a first partial substrate 10 of a semiconductor material, e.g., silicon, provided with depressions 12. The ball elements 14 are arranged in the depressions 12 of the first partial substrate 10 such that, for example, one ball element 14 each is within a depression 12 of the first partial substrate 10 (steps 202, 204, 206). The semiconductor balls 14 (ball elements—silicon balls) can have a thin passivation layer, e.g., an oxide layer of 200-400 nm thickness, such as a silicon dioxide layer ($SiO_2$ layer).

In step 230, a second partial substrate 41 is provided, wherein the second partial substrate 41 comprises an auxiliary substrate 42 of a semiconductor material, e.g., a silicon wafer and a layer 44, e.g., of a glass material (glass layer 44) arranged on a first main surface area of the auxiliary substrate 42.

In the following, exemplary partial steps for producing and providing 230 the second partial substrate 41 will be described. Thus, for example in step 232, a (thin) glass material layer 44 can be deposited on the auxiliary substrate 42 (semiconductor substrate or further Si wafer), i.e., for example, a glass wafer can be bonded on the semiconductor wafer; whereupon the glass wafer is thinned to the desired thickness of the glass material layer. In step 233, for example, the glass material layer 44 is structured to form openings 46 having a diameter D2. In step 234', the recesses 49 are generated, in that, for example, the present semiconductor material, e.g., silicon is etched up to a depth T1 from the front (from the first main surface area) of the auxiliary substrate 42. Here, additionally, under-etching of the glass material layer 44 is specifically obtained, such that the glass projections 46a are generated laterally on the recesses 49 on the first main surface area of the auxiliary substrate 42.

Starting from the first main surface area, the auxiliary substrate 42 comprises, for example, recesses 49, each corresponding to the positions of the ball elements 14 arranged on the first partial substrate 10 and that can be aligned with the same, i.e., recesses 49 and ball elements 14 can be arranged in a centered manner to each other. The recesses 49 do not extend, e.g., completely, i.e., only partly (in the thickness direction perpendicular to the first main surface area of the auxiliary substrate 42) up to a depth T1 into the material of the auxiliary substrate 42. Further, the glass material layer 44 comprises openings 46 that are aligned with the recesses 49 of the auxiliary substrate 42 (essentially in a centered manner). The diameter D2 of the openings 46 of the glass material layer 44 is smaller than the diameter D3 (D2<D3) of the recesses 49 of the auxiliary substrate 42.

The diameter D2 of the openings 46 of the glass material layer 44 is, for example, 20 to 70% or 40 to 60% of the diameter D3 of the recesses 49 of the auxiliary substrate 42, i.e., D2=0.2-0.7*D3 or D2=0.4-0.6*D3. Further, the thickness of the glass material layer 44 can, for example, be between 10 and 100 μm, between 30 and 70 μm and approximately 50 μm.

Here, the diameter D3 of the recesses 49 in the auxiliary substrate is smaller than the diameter D of the ball elements 14. The diameter D3 of the recesses 49 is, for example, 20 to 70% or 40 to 60% of the diameter D of the ball elements 14, i.e., D3=0.2-0.7*D, respectively, D3=0.4-0.6*D.

Since the openings 46 of the glass material layer 44 have a smaller diameter than the recesses 49 of the auxiliary substrate 42, one projection 46a of the glass material layer 46 each beyond the vias 48 is provided (laterally) each on the side of the recesses 49 of the auxiliary substrate 42 provided with the glass material layer.

In a step 236, the second partial substrate 41 is arranged or placed on the first partial substrate 10 provided with the ball elements 14. Here, the first main surface area of the second auxiliary substrate 41 provided with the glass material layer 44 is facing the ball elements 14 inserted in the depressions 12 of the first partial substrate 10, wherein further the ball elements 14 are aligned with the recesses 49 of the second partial substrate and with the openings 46 of the glass material layer 44 (possibly in a centered manner). Thus, starting from step 234, the second partial substrate is "inverted" and placed onto the semiconductor ball elements 14 (e.g., silicon balls) held in the depressions 12 (e.g., V grooves). The semiconductor balls 14 comprise, for example, a thin passivation layer 14a, e.g., an oxide layer (e.g., $SiO_2$ layer) of 200-400 nm thickness.

In a step 238, the second partial substrate provided with the glass material layer 44 is pressed onto and fixed to the ball elements 14 arranged in the depressions 12 of the first partial substrate 10 at increased temperature (temperature treatment or annealing) and with (high) mechanical pressure F. Fixing is obtained by thermal bonding of the glass material of the glass material layer 44 with the semiconductor material (silicon) or the oxide material (e.g., $SiO_2$) of the ball elements 14. Thus, the semiconductor wafer 41 provided with a glass material layer 44 is pressed onto the semiconductor ball elements (silicon balls) 14 arranged on the auxiliary substrate 10 at increased temperature (e.g., 700-900° C.) and with mechanical pressure F. In the above illustrated process flow 100-3b, a thin glass layer 44 arranged on a partial substrate 10 serves as substrate material for fixing the semiconductor ball elements.

In step 240, the first partial substrate 10 (the V groove wafer) is removed or taken off from the ball elements 14 firmly connected to the second partial substrate, wherein now the second partial substrate 41, together with the auxiliary substrate 42 and the glass material layer 44 arranged thereon, forms the carrier substrate to which the ball elements 14 are fixed. In an optional step 240-1, the second partial substrate 41 is, for example, inverted or aligned for the next processing step.

In step 300, the ball elements 14 fixed to the carrier substrate 41 are thinned on one side, i.e., the silicon ball elements are processed with a grinding process to obtain the plano-convex lens elements 24 of the semiconductor material (silicon). The process of mechanical thinning is performed until the desired resulting lens shape (lens height) of the plano-convex lens elements 24 is obtained.

The planar side 24a of the plano-convex lens elements 41 is obtained (directly) by the step of mechanical thinning, wherein the convex side 24b of the lens elements 24 (with the oxide layer 14a arranged thereon) is at the recesses 49 of the second partial substrate 41 (carrier substrate) of the lens element 24. Here, the recesses 49 of the second partial substrate 41, i.e., the recesses 49 through the auxiliary substrate 42 and through the glass material layer 44 form cavities 26 for the lens elements 24, wherein the (optically effective) area of the convex side 24b of the lens elements bordering on the cavity is still covered by the oxide layer 14a ($SiO_2$ layer).

Therefore, the above statements show exemplarily that the method steps 202, 204, 230, 236, 238 and 240 are provided for fixing the semiconductor ball elements to the carrier substrate, while then in step 300 one-sided thinning of the ball elements fixed to the carrier substrate is performed to obtain the plano-convex lens elements 24 on wafer level, i.e., fixed to the carrier substrate.

In the following, optional steps of the production method will be exemplarily illustrated, wherein the rear 41b (second main surface) of the second partial substrate 41 is processed to be able to prepare and provide the second partial substrate 41 (carrier substrate) provided with the plano-convex lens elements 24 for electrical and mechanical connection (bonding), i.e., for example for wafer bonding to a device substrate (sensor wafer). Here, it takes effect that the rear 41b (second main surface) of the second partial substrate or lens wafer 41 is essentially still completely planar and uniform since, during the preceding process steps only processing from the front 41a (i.e., from the first surface area 41a) of the second partial substrate or carrier substrate 41 has taken place. Thereby, significant simplification of further processing and process-technical treatment from the rear 41b of the second auxiliary substrate 41 is obtained.

In an optional step 402, surface processing of the rear or second main surface 41b of the second partial substrate 41 is performed at first, for example, by depositing a passivation layer 95 (e.g., on the whole surface) onto the second main surface area of the second partial substrate 41, i.e., on the rear of the carrier substrate (or carrier wafer). Thereupon, optionally, further structures can be produced on the second main surface area of the second carrier substrate 41, such as a bond frame of solder materials (solders) or glass solders 96, and for example additional getter layers 97. The getter layer or getter or layer comprising getter material is a chemically reactive material that serves to maintain a vacuum as long as possible. On the surface of a getter, gas molecules establish a direct chemical bond with the atoms of the getter material or the gas molecules are held by sorption. In that way, gas molecules can be "trapped".

The bond frames 96 can, for example, be configured to continuously surround the subsequently formed openings in the rear of the second partial substrate 41 to the recesses 49 formed therein, to be able to establish a gas-tight bond with the device substrate or device wafer afterwards.

In a subsequent step 404, starting from the rear 41b of the second partial substrate 41, the recesses 49 within the second partial substrate 41 can be "opened" to obtain respective complete vias 48 to the rear of the second partial substrate 41. The step 404 for opening the recesses 49 in the second partial substrate 41 can be performed, for example, by performing lithography of the rear openings in the second partial substrate 41, i.e., by generating a lithographic mask (not shown in FIG. 4b) on the rear 41b of the second partial substrate 41, which predetermines or defines the access areas to the recesses 49 in the second partial substrate 41 that are to be opened. Thereupon, starting from the rear 41b of the second partial substrate 41, the passivation layer 95 can be removed, e.g., by means of plasma etching, whereupon starting from the rear 41b of the second partial substrate 41, the semiconductor material, e.g., the silicon material is etched to obtain the passages to the recesses 49 in the second partial substrate 41, i.e., to obtain the resulting vias 48 to the rear of the second partial substrate 41.

When etching semiconductor structures on the rear, the silicon dioxide layer 24a (as etching stop layer) fulfils a protection function for the silicon lenses on the areas of the silicon ball segments or silicon lenses 24 exposed to the recesses 49 with respect to the etching process (etching attack) performed from the rear.

In a subsequent step 406, the surfaces of the silicon lenses 24 facing the vias can be removed from the silicon dioxide layer ($SiO_2$ layer) 24a. For this, for example, a plasma etching method can be used. Subsequently, for example, the residuals of the photolithographic mask (resist mask) on the rear 41b of the second partial substrate 41 can be removed and, for example, final cleaning at least of the rear or the entire resulting second partial substrate 41 can be performed.

The second partial substrate 41 provided with the lens elements 24 can now be provided for a wafer bond process with device substrate or device wafer, wherein, subsequently, in a step 603 the second partial substrate 41 can be connected (bonded) to the device substrate (on the rear) by a bonding method or wafer bonding process.

In the following, an exemplary flow diagram of a further production method 100-4 for producing plano-convex lens elements of a semiconductor material on wafer level will be described based on FIG. 5.

First, in the method 100-4, the method steps 202, 204 and 206 already described based on FIGS. 2, 3 and 4a are performed to provide a first partial substrate 10 provided with depressions 12 of a semiconductor material, e.g., silicon. In the depressions 12 of the first partial substrate 10, the ball elements 14 are arranged such that, for example, one ball element 14 each is within a depression 12 of the first partial substrate 10 (steps 202, 204, 206).

In step 242 of FIG. 5, a second partial substrate 56 is provided that comprises an auxiliary substrate 50 of a semiconductor material, such as silicon. Recesses 52 (that are non-continuous to the opposing second main surface area) are arranged on a first main surface area of the auxiliary substrate 50. These recesses 52 each correspond to the positions of the ball elements 14 arranged on the first partial substrate 10 or can be aligned with these positions, i.e., the recesses 52 and the ball elements 14 can be arranged in a centered manner to each other. The recesses 52 can, for example, be structured in the semiconductor material by means of conventional semiconductor processing processes, e.g. etching processes.

Here, the diameter (or the width) D4 of the recesses 52 in the auxiliary substrate is smaller than the diameter D of the ball elements 14. The diameter D4 of the recesses 52 is, for example, 20 to 70% or 40 to 60% of the diameter D of the ball elements 14, i.e., D3=0.2-0.7*D or D3=0.4-0.6*D. further, the depth t of the recesses 52 in the auxiliary substrate is smaller than, for example, 50, 30, 20, 10, 5 or 1% of the diameter D of the ball elements 14 and is, for example, 50 to 200 µm and approximately 100 µm. Further, the thickness of the glass material layer 54 can, for example, be between 10 and 100 µm, between 30 and 70 µm and approximately 50 µm.

Further, a glass material layer 54 spanning or covering the recesses 56 in the auxiliary substrate 50 (at least partly or also completely) is arranged on the first main surface area of the auxiliary carrier 50. Thus, the second partial substrate 56 can be obtained by depositing the (e.g., continuous) glass material layer 54 on the auxiliary carrier 50 structured with the recesses 52, for example by bonding a glass wafer on the first main surface area of the auxiliary substrate 50 provided with recesses and possibly subsequent thinning of the glass wafer.

In step 244, the second partial substrate 54 is arranged or placed on the first partial substrate 10 provided with the ball elements, wherein the first main surface area of the second partial substrate 56 provided with the glass material layer 54 is facing the ball elements 14 arranged in the depressions 12 of the first partial substrate 10, and wherein the ball elements 14 are aligned with the recesses of the second partial substrate, for example, in a manner that is as centered as possible. Thus, the provided partial substrate 56 is, for example, inverted and placed onto the first partial substrate 10 where the silicon balls 14 are held in the V grooves.

In step 246, the second partial substrate 56 provided with the glass material layer 54 is fixed to the ball elements 14 at increased temperature (temperature treatment or annealing at 700-900° C.) by applying mechanical pressure F. Pressing the second partial substrate 56, i.e., an Si/glass wafer onto the semiconductor ball elements 14 (silicon balls) is hence performed at increased temperature and with high mechanical pressure. During this pressing or fixing step, the glass material liquefied or sufficiently softened during this annealing process fills the recess 52 (cavity) at least partly (i.e., to a large part) or also completely.

In step 248, the first partial substrate 10 is removed from the ball elements 14 firmly connected to the second partial substrate 56, wherein now the second partial substrate 56 forms the carrier substrate for the semiconductor ball elements 14 to be thinned. Thus, in step 248, the first partial substrate 10, i.e., the V groove wafer is taken off.

In the step 300 of thinning the ball elements 14 fixed to the second partial substrate 56 (carrier substrate), the plano-convex lens elements 24 are obtained. The process of mechanical thinning can be performed, for example by means of grinding the semiconductor ball elements (silicon balls). By exactly adjusting the resulting wafer thickness of the carrier substrate 56, the exact optical characteristics of the resulting lens elements 24 can be adjusted. In the step of thinning, the planar side 24a of the plano-convex lens elements 24 is (directly) obtained, while the convex side 24b of the lens elements 24 is at the recesses 52 of the second partial substrate 56 (carrier substrate) that are at least partly filled with the glass material 54.

In a subsequent step 400, cavities 26 are generated starting from the second main surface area of the second partial substrate (carrier substrate) 56 to the lens elements 24, wherein, for example, one cavity 26 each per lens element 24 is generated. Thus, the optically effective area of the convex side 24b of the lens element 24 bordering on the cavity 26 is exposed. This is obtained, for example, by means of an etching process of the silicon material of the auxiliary substrate 50 from the rear (the second main surface area of the same), wherein an etch stop takes place on the glass material layer 54 in the recesses 52. Thereupon, the glass material bordering on the cavity 56 is removed (at least partly) in the area of the convex side 24b of the lens elements 24, i.e., the optically effective area of the lens 24 is exposed. Removing the glass material from the lens element 24 (silicon lens) can be performed, for example, by means of etching.

From the above description regarding the method 100-4 illustrated in FIG. 5 for producing plano-convex lens elements on wafer level it becomes clear that the steps 202, 204, 206, 242, 244, 246 and 248 implement the step 200 of fixing ball elements of a semiconductor material to a carrier substrate, whereupon in step 300 one-sided thinning of the ball elements 14 fixed to the carrier substrate 56 and further in step 300 forming the cavities is performed.

In the following, based on FIG. 6, an exemplary flow diagram of a further production method 100-5 for producing plano-convex lens elements of a semiconductor material on wafer level will be described.

In step 202, a first partial substrate 10 provided with depressions 12 is provided. In step 204, ball elements 14 are arranged or inserted in the depressions 12 of the first partial substrate 10, such that one ball element 14 each is within one depression 12 of the first partial substrate (step 206).

In step 250 of FIG. 6, a second partial substrate 60 is provided which comprises an auxiliary substrate 62 of a semiconductor material, such as silicon. A (e.g., continuous) glass material layer 64 covering the first main surface area of the auxiliary substrate 62 is arranged on a first main surface area of the auxiliary substrate 62. The second partial substrate 60 can be obtained by depositing the (e.g., continuous) glass material layer 64 on the auxiliary carrier 62, for example by bonding a glass wafer to the first main surface area of the auxiliary substrate 62 and possibly subsequent thinning of the glass wafer 64. Further, the thickness of the glass material layer 64 can, for example, be between 10 and 100 µm, between 30 and 70 µm and approximately 50 µm.

In step 252, the second partial substrate 60 is arranged or placed on the first partial substrate 10 provided with the ball elements 14, wherein the first main surface area of the second partial substrate 60 provided with the glass material layer 64 is facing the ball elements 14 arranged in the depressions 12 of the first partial substrate 10. The provided partial substrate 60 is, for example, inverted and placed onto the first partial substrate 10 where the silicon balls 14 are held in the V grooves.

In step 254, the second partial substrate 60 provided with the glass material layer 64 is fixed to the ball elements 14 at increased temperature (temperature treatment or annealing at 700-900° C.) and by applying mechanical pressure F. Pressing the second partial substrate 56, i.e., an Si/glass wafer onto the semiconductor ball elements 14 (silicon balls) is hence performed at increased temperature and with high mechanical pressure. Thus, the glass material of the layer 64 sufficiently softened and then re-solidified during this annealing process represents a fixed bond connection to the semiconductor material (e.g., silicon) of the ball elements 14.

Thereupon, the first partial substrate 10 is removed from the ball elements 14 firmly connected to the second partial substrate 60, wherein now the second partial substrate 60 forms the carrier substrate for the semiconductor ball elements 14 to be thinned. Thus, the first partial substrate 10, i.e., the V groove wafer is taken off.

In the step 300 of thinning the ball elements 14 fixed to the carrier substrate 60, the plano-convex lens elements 24 are obtained. The process of mechanical thinning can be performed, for example, by means of grinding the semiconductor ball elements (silicon balls). By exactly adjusting the resulting wafer thickness of the carrier substrate 60, the exact optical characteristics of the resulting lens elements 24 can be adjusted. In the step of thinning, the planar side 24a of the plano-convex lens elements 24 is (directly) obtained, while the convex side 24b of the lens elements 24 is (at least partly) in the glass material of the layer 64.

In a subsequent step 400, cavities 26 starting from the second main surface area (rear) of the carrier substrate 60 to the lens elements 24 are generated, wherein, for example, one cavity 26 each per lens element 24 is generated. Thus, the optically effective area of the convex side 24b of the lens elements 24 bordering on the cavity 26 is respectively exposed. This is obtained, for example, by means of an etching process of the silicon material of the auxiliary substrate 50 from the rear (the second main surface area of the same), wherein an etch stop takes place on the glass material layer 64 in the recesses 52. Thereupon, the glass material bordering on the cavity 26 is removed (at least partly) in the area of the convex side 24b of the lens elements 24, i.e., the optically effective area of the lens 24 is exposed. Removing the glass material from the lens element 24 (silicon lens) can, for example, be performed by means of etching.

From the above description with respect to the method 100-4 illustrated in FIG. 6 for producing plano-convex lens elements on wafer level, it becomes clear that the steps 202, 204, 206, 250, 252 and 254 implement the step 200 of fixing ball elements of a semiconductor material to a carrier substrate, whereupon in step 300 one-sided thinning of the ball elements 14 fixed to the carrier substrate 60 and further in step 600 forming the cavities 26 is performed.

In the following, based on FIG. 7a, an exemplary flow diagram of a further production method 100-6a for producing plano-convex lens elements (e.g., of a semiconductor material) on wafer level will be described.

First, in a method 100-6a, the method steps 200, 204 and 206 already described based on FIGS. 2, 3 and 4 will be performed to provide a first partial substrate 10 provided with depressions 12, e.g., of a semiconductor material such as silicon. The ball elements 14 are arranged in the depressions 12 of the first partial substrate 10, such that, for example, one ball element 14 each is within a depression 12 of the first partial substrate 10 (steps 202, 204, 206).

In step 260 of FIG. 7a, a second partial substrate 70 is provided which comprises an auxiliary substrate 72 of a semiconductor material, such as silicon. On a first main surface area of the auxiliary substrate 72, recesses or vias 74 (to the opposing second main surface area, e.g., continuous or non-continuous) are arranged. These recesses 74 each correspond to the positions of the ball elements 14 arranged on the first partial substrate 10 or can be aligned with these positions, i.e., the recesses 74 and the ball elements 14 can be arranged in a centered manner to each other. The recesses 74 can, for example, be structured by means of conventional semiconductor processing processes, e.g., etching processes, in the semiconductor material 72.

Here, the diameter D5 of the recesses 74 in the auxiliary substrate 72 is smaller than the diameter D of the ball elements 14. The diameter D5 of the recesses 74 is, for example, 20 to 70% or 40 to 60% of the diameter D of the ball elements 14, i.e., D5=0.2-0.7*D or D3=0.4-0.6*D.

The intermediate areas 78 according to the sectional view of the auxiliary layer 72 are now selected, e.g., such that the recesses 74 are arranged at a distance (thickness) D6 with respect to one another. The distance D6 can be selected, e.g., such that the diameter D5 and the distance D6 are, in combination, greater than the diameter D of the ball elements 14, i.e., D5+D6≤D. The diameter D5 and the distance D6 can be selected, e.g., to allow a packing density of the ball elements 14 at the first partial substrate 10 and (after fixing) at the auxiliary substrate 72 that is as dense as possible.

Further, a (e.g., continuous) glass material layer 76 is arranged on the first main surface area of the auxiliary carrier 72, which spans or covers the recesses 74 in the auxiliary substrate 72 (at least partly or also completely). In that way, the second partial substrate 70 can be obtained by the depositing the (e.g., continuous) glass material layer 76 on the auxiliary carrier 72 structured with the recesses 74, for example by bonding a glass wafer to a first main surface area of the auxiliary substrate 72 and possibly subsequent thinning of the glass wafer. Further, the thickness of the glass material layer 76 can be, for example, between 10 and 100 μm, between 30 and 70 μm and approximately 50 μm.

In step 262, the second partial substrate 70 is arranged or placed on the first partial substrate 10 provided with the ball elements 14, wherein the first main surface area of the second partial substrate 70 provided with the glass material layer 76 is facing the ball elements 14 arranged in the depressions 12 of the first partial substrate 10, and wherein the ball elements 14 are aligned with the recesses 74 of the second partial substrate 70, for example in a manner that is as centered as possible. Thus, the provided partial substrate 70 is, for example, inverted and placed onto the first partial substrate 10 where the silicon balls 14 are held in the V grooves.

In step 264, the second partial substrate 70 provided with the glass material layer 76 is pressed onto or fixed to the ball elements 14 at increased temperature (temperature treatment or annealing at 700-900° C.) and by applying mechanical pressure F.

Fixing is obtained by thermal bonding of the glass material of the layer 76 with the semiconductor material (silicon) of the ball elements 14. Thus, the semiconductor wafer 70 provided with a glass material 76 is pressed onto the semiconductor ball elements (silicon balls) 14 arranged on the auxiliary substrate 10 at an increased temperature (e.g., 700-900° C.) and by mechanical pressure F. Thus, in the above illustrated process flow 100-6a, a thin glass layer 76 arranged on the second partial substrate 70 serves as substrate material for fixing the semiconductor ball elements 14.

During the pressing or fixing step, the glass material of the layer sufficiently softened during this annealing process fills the recess 52 (cavity) at least partly (i.e., to a large part) or completely.

Thereupon, in step 266, 268, the first partial substrate (the V groove wafer) is removed or taken off from the ball elements 14 firmly connected to the second partial substrate 70, whereupon the second partial substrate 70, together with the auxiliary substrate 72 and the glass material layer arranged thereon, forms the carrier substrate to which the ball elements 14 are fixed.

In the step 300 of thinning the ball elements 14 fixed to the carrier substrate 70, the plano-convex lens elements 24 are obtained. The process of mechanical one-sided thinning can, for example, be performed by means of grinding the semiconductor ball elements (silicon balls). The process of mechanical thinning is performed until the desired resulting lens shape (lens height) of the plano-convex lens elements 24 is obtained with the exact optical characteristics of the resulting lens elements 24. In the step of thinning the planer side 24a of the plano-convex lens element 24 is obtained (directly), while the convex side 24b of the lens elements 24 is (at least partly) in the glass material of the layer 76. Here, the convex-side radius of curvature of the produced lens elements corresponds to the ball radius R of the (unprocessed or un-thinned) ball elements fixed to the carrier substrate. By one-sided thinning of the ball elements fixed to the carrier substrate, further, the planar side of the plano-convex lens elements is formed.

Thus, the thinning process is performed until the needed height of the resulting ball segment is exactly adjusted based on the predetermined radius of curvature (ROC), such that the desired optical characteristics of the resulting silicon lens elements can be exactly obtained, since the convex-side radius of curvature of the silicon lens elements exactly corresponds to the ball radius of the silicon ball elements.

In the subsequent step 400, cavities 26 are generated starting from the second main surface area (rear) of the carrier substrate 70 to the lens elements 24, wherein, for example, one cavity 26 each per lens element 24 is generated. Thus, the optically effective area of the convex side 24b of the lens elements 24 bordering on the cavity 26 is respectively exposed.

This is obtained, for example, by means of an etching process of the silicon material of the auxiliary substrate 72 from the rear (the second main surface area of the same), wherein an etch stop takes place on the glass material layer 76 in the recesses 74.

Thereupon, the glass material bordering on the cavity 26 is removed (at least partly) in the area of the convex side 24b of the lens elements 24, i.e., the optically effective area of the lens 24 is exposed. Removing the glass material from the lens element 24 (silicon lens) can take place, for example, by means of etching.

From the above description with respect to the method 100-6a illustrated in FIG. 7A for producing plano-convex elements on wafer level, it becomes clear that the steps 202, 204, 206, 262, 264, 266 and 268 implement the step 200 of fixing ball elements of a semiconductor material to a carrier substrate, whereupon in step 300 one-sided thinning of the ball elements 14 fixed to the carrier substrate 70 and further in step 400 forming the cavities 26 is performed.

In the following, based on FIG. 7B, an exemplary flow diagram of a further production method 100-6b for producing plano-convex lens elements of a semiconductor material on wafer level will be described.

First, in the method 100-6b, the method steps 202, 204 and 206 already described based on FIGS. 2, 3 and 4 are performed to provide a (first) partial substrate 10 provided with depressions 12 of a semiconductor material, e.g., silicon. A first subset (a first partial amount) of the ball elements 14 is arranged in the depressions 12 of the partial substrate 10, such that, for example, a ball element 14 is within a depression 12 of the partial substrate 10 (steps 202, 204, 206).

In step 260-1 of FIG. 7b, a further (second) partial substrate 70 is provided comprising an auxiliary substrate 72 of a semiconductor material, such as silicon. On a first main surface of the auxiliary substrate 72, vias or recesses 74 (continuous or also non-continuous to the opposite second main surface area) are arranged. These recesses 74 each correspond to the positions of the ball elements 14 arranged on the first partial substrate 10 or can be aligned with these positions, i.e., the recesses 74 and the ball elements 14 can be arranged in a centered manner to each other. The recesses 74 can be structured, for example, by means of conventional semiconductor processes, e.g., etching processes in the semiconductor material 72.

Here, the diameter D5 of the recesses 74 in the auxiliary substrate 72 is smaller than the diameter D of the ball elements 14. The diameter D5 of the recesses 74 is, for example, 20 to 70% or 40 to 60% of the diameter D of the ball elements 14, i.e., $D5=0.2\text{-}0.7*D$ or $D3=0.4\text{-}0.6*D$.

The intermediate areas 72 according to the sectional view of the auxiliary substrate 72 are now selected, for example, such that the recesses 76 are arranged at a distance D6 to one another. The distance (the thickness) D6 can be selected, e.g., such that the diameter D5 and the thickness D6 in combination are smaller than or equal to the diameter D of the ball elements 14, i.e., $D5+D6 \leq D$. The diameter D5 and the thickness D6 can be selected, e.g., such as to allow a packing density of the ball elements 14 (after fixing) at the auxiliary substrate 72 that is as high as possible.

Further, an (e.g., continuous) glass material layer 76 is arranged on the first main surface area of the auxiliary carrier 72, which spans or covers the recesses 74 in the auxiliary substrate 72 (at least partly or also completely). Thus, the second partial substrate 70 can be obtained in that the (e.g., continuous) glass material layer 76 is deposited on the auxiliary carrier 72 structured with the recesses 74, for example, by bonding a glass wafer to a first main surface area of the auxiliary substrate 72 and possibly subsequent thinning of the glass wafer. Further, the thickness of the glass material layer 76 can be, for example, between 10 and 100 μm, between 30 and 70 μm and approximately 50 μm.

In step 262-1, the further partial substrate 72 is arranged or placed on the partial substrate 10 provided with the ball elements 14, wherein the first main surface area of the further partial substrate 70 provided with the glass material layer 76 is facing the ball elements 14 arranged in the depressions 12 of the first partial substrate 10, and wherein the ball elements 14 are aligned with a subset of the recesses 74 of the second partial substrate 70, for example in a manner that is as centered as possible. Thus, the provided partial substrate 70 is, for example, inverted and placed onto the first partial substrate 10 where the silicon balls 14 are held in the V grooves.

In step 264-1, the further partial substrate 70 provided with the glass material layer 76 is pressed onto or fixed to the ball elements 14 at an increased temperature (temperature treatment or annealing at 700-900° C.) and by applying mechanical pressure F.

Fixing is obtained by thermal bonding of the glass material of the layer 76 with the semiconductor material (silicon) of the ball elements 14. Thus, the semiconductor wafer 70 provided with the glass material layer 76 is pressed onto the semiconductor ball elements (silicon balls) 14 arranged on the auxiliary substrate 10 at increased temperature (e.g., 700-900° C.) and with mechanical pressure F. In the above illustrated process flow 100-6b, a thin glass layer 76 arranged on the second partial substrate 70 serves as substrate material for fixing the semiconductor ball elements 14.

During the pressing or fixing step, the glass material of the layer sufficiently softened in this annealing process fills the recess 52 (cavity) at least partly (i.e., to a large part) or also completely.

Thereupon, in step 266-1, the first partial substrate 10 (the V groove wafer) is removed or taken off from the ball element 14 firmly connected to the second partial substrate 70, wherein now the second partial substrate 70, together with the auxiliary substrate 72 and the glass material layer 76 arranged thereon, forms the carrier substrate to which the ball elements 14, i.e., the first subset of the ball elements 14, are fixed.

In the step 300-1 of thinning the ball elements 14 fixed to the carrier substrate 70, a first subset of the plano-convex lens elements 24 is obtained. The process of mechanical one-sided thinning can take place, for example, by means of grinding the ball elements (e.g., semiconductor or silicon balls). The process of mechanical thinning is performed until the desired resulting lens shape (lens height) of the plano-convex lens elements 24 is obtained with the exact optical characteristics of the resulting lens elements 24.

In a step 262-2, a partial substrate 10 provided with depressions 12 is provided, wherein a further subset of the ball elements 14 is arranged in the depressions 12 of the partial substrate 10. In step 262-2, the partial substrate 10 of step 262-1 that has been "re-populated" with the further subset of ball elements 14 in the depressions 12 can be used, or a further partial substrate 10 with a further subset of the ball elements 14 in the depressions 12 can be provided.

Further, in step 262-2, the further partial substrate 70 is arranged on the partial substrate 10 provided with the subset of ball elements 14, wherein the first main surface area provided with the glass material layer 74 of the further partial substrate 70 is facing the ball elements 14, and wherein the ball elements 14 are aligned with a further "un-populated" subset of the vias 76.

Thus, in step 262-2, the further partial substrate 70 (with the first subset of ball elements) is arranged or placed on the partial substrate 10 provided with the further subset of ball elements 14, wherein the further ball elements 14 are aligned with a further un-populated subset of the recesses 74 of the second partial substrate 70, for example in a manner that is as centered as possible. Thus, the provided partial substrate 70 is, for example, inverted and placed onto the first partial substrate 10 where the silicon balls 14 are held in the V grooves.

Then, in step 264-2, the further partial substrate 70 provided with the glass material layer 76 is pressed onto or fixed to the further ball elements 14 at increased temperature (temperature treatment or annealing at 700-900° C.) and by applying mechanical pressure F.

Fixing is again obtained by thermal bonding of the glass material of the layer 76 with the semiconductor material (silicon) of the further ball elements 14. Thus, the semiconductor wafer 70 provided with a glass material layer 76 is pressed onto the semiconductor ball elements (silicon balls) arranged on the auxiliary substrate 10 at increased temperature (e.g., 700-900° C.) and with mechanical pressure F. Therefore, in the above illustrated process flow 100-6b, a thin glass layer 76 arranged on the second partial substrate 70 serves as substrate material for fixing the semiconductor ball elements 14. During the pressing or fixing step, the glass material of the layer sufficiently softened during this annealing process fills the recess 52 (cavity) at least partly (i.e., to a large part) or also completely.

Thereupon, in step 266-2, the (first) partial substrate 10 (of the V groove wafer) is removed or taken off from the further ball elements 14 firmly connected to the second partial substrate 70, wherein now the second partial substrate 70, together with the auxiliary substrate 72 and the glass material layer 76 arranged thereon, forms the carrier substrate to which the ball elements 14, i.e., the further subset of the ball elements 14, are fixed.

In the step 300-2 of thinning the further ball elements fixed to the carrier substrate 70, a further subset of plano-convex lens elements 24 is obtained. The process of mechanical one-sided thinning can, for example, be performed by means of grinding the ball elements (e.g., semiconductor or silicon balls). The process of mechanical thinning is performed until the desired resulting lens shape (lens height) of the plano-convex lens element 24 with the exact optical characteristics of the resulting lens elements 24 (first and second subset) is obtained.

In the step of thinning (300-1, 300-2) the planar side 24a of the plano-convex lens elements 24 is (directly) obtained, while the convex side 24b of the lens elements 24 is (at least partly) in the glass material of the layer 76. Here, the convex-side radius of curvature of the produced lens elements corresponds to the ball radius R of the (unprocessed or un-thinned) ball elements fixed to the carrier substrate. By one-sided thinning of the ball elements fixed to the carrier substrate, further, the planar side of the plano-convex lens elements is formed. Here, the vias of the further partial substrate 70 form cavities 26 for the lens elements 24, wherein the area of the lens elements 24 bordering on the cavity 26 is at least partly exposed.

The thinning process is performed until the needed height of the resulting ball segment is exactly adjusted based on the predetermined radius of curvature (ROC), such that the desired optical characteristics of the resulting silicon lens elements can be obtained exactly, since the convex-side radius of curvature of the silicon lens elements exactly corresponds to the ball radius of the silicon ball elements.

In a subsequent step 400, cavities 26 are generated starting from the second main surface area (rear) of the carrier substrate 70 to the lens elements 24, wherein, for example (at least), one cavity 26 each per lens element 24 is generated. Thus, the optically effective area of the convex side 24b of the lens elements 24 bordering on the cavity 26 is each exposed.

This is obtained, for example, by means of an etching process of the silicon material of the auxiliary substrate 72 from the rear (the second main surface area of the same), wherein an etch stop takes place on the glass material layer 76 in the recesses 74.

Thereupon, the glass material bordering on the cavity 26 is removed (at least partly) in the area of the convex side 24b of the lens elements 24, i.e., the optically effective area of the lens 24 is exposed. Removing the glass material from the lens element 24 (silicon lens) can be performed, for example, by means of etching.

From the above description of the method 100-6a for producing plano-convex lens elements on wafer level illustrated based on FIG. 7a, it becomes clear that the steps 202, 204, 206, 262, 264, 266 and 268 implement the step 200 of fixing ball elements of a semiconductor material to a carrier substrate, whereupon in step 300 one-sided thinning of the ball elements 14 fixed to the carrier substrate and further in step 400 forming the cavities 26 is performed.

In the following, based on FIG. 7C, an exemplary flow diagram of a further production method 100-6c for producing plano-convex lens elements of a semiconductor material on wafer level is described.

First, in a method 100-6c, the method steps 202, 204 and 206 already described based on FIGS. 2, 3 and 4 are performed to provide a first partial substrate 10 provided with depressions 12, for example, of a semiconductor material, such as silicon. The ball elements 14 are arranged In the depressions 12 of the first partial substrate 10, such that, for example, one ball element 14 each is within a depression 12 of the first partial substrate 10 (steps 202, 204, 206).

In step 260 of FIG. 7c, a second partial substrate 71 is provided comprising an auxiliary substrate 73 of a semiconductor material, such as silicon. Non-continuous (to the opposite main surface area 73b) recesses 75 are arranged on a first main surface area 73a of the auxiliary substrate 73. These recesses 75 each correspond to the positions of the ball elements 14 arranged on the first partial substrate 10 or can be aligned with these positions, i.e., the recesses 75 and the ball elements 14 can be arranged in a centered manner to each other. The recesses 75 can be structured, for example, by means of conventional semiconductor processing processes, e.g., etching processes in the semiconductor material of the auxiliary substrate 73, i.e., by, for example, etching the semiconductor material, e.g., silicon, up to a depth T1 from the front 73a of the auxiliary substrate 73.

Here, the diameter D5 of the recesses 75 in the auxiliary substrate 73 is smaller than the diameter D of the ball elements 14. The diameter D5 of the recesses 75 is, for example, 20 to 70% or 40 to 60% of the diameter D of the ball elements 14, i.e., D5=0.2-0.7*D or D3=0.4-0.6*D.

The intermediate areas 78 according to the sectional view of the auxiliary substrate 73 are selected such that the recesses 75 are arranged at a distance (thickness) D6 to one another. The distance D6 can be selected such that the diameter D5 and the distance D6 in combination are greater than the diameter D of the ball elements 14, i.e., D5+D6≤D. The diameter D5 and the distance D6 can be selected to allow a packing density of the ball elements 14 at the first partial substrate 10 and (after fixing) at the auxiliary substrate 73 that is as high as possible.

Further, a (e.g., continuous) glass material layer 76 is arranged on the first main surface area of the auxiliary carrier 73, which completely spans or covers the recesses 75 in the auxiliary substrate 73. Thus, the second partial substrate 71 can be obtained in that the (e.g., continuous) glass material layer 76 is deposited on the auxiliary carrier 73 structured with the recesses 75, for example by bonding a glass wafer on a first main surface area of the auxiliary substrate 73 and possibly subsequent thinning of the glass wafer. Further, the thickness of the glass material layer 76 can, for example, be between 10 and 100 µm, between 30 and 70 µm and approximately 50 µm.

In step 262, the second partial substrate 71 is arranged or placed on the first partial substrate 10 provided with the ball elements 14, wherein the first main surface area of the second partial substrate 71 provided with the glass material layer 76 is facing the ball elements 14 arranged in the depressions 12 of the first partial substrate 10, and wherein the ball elements 14 are aligned with the recesses 75 of the second partial substrate 70, for example, in a manner that is as centered as possible. Thus, the provided partial substrate 71 is, for example, inverted and placed onto the first partial substrate 10 where the silicon balls 14 are held in the V grooves.

In step 264, the second partial substrate 71 provided with the glass material layer 76 is pressed onto or fixed to the ball elements 14 at increased temperature (e.g., in a vacuum furnace) and by applying mechanical pressure F. Fixing is obtained by thermal bonding of the glass material of the layer 76 with the semiconductor material (silicon) of the ball elements 14. Thus, the semiconductor wafer 71 provided with a glass material layer 76 is pressed onto the semiconductor ball elements (silicon balls) 14 arranged on the auxiliary substrate 10 at increased temperature (e.g., 700-900° C.) and with mechanical pressure F. Thereupon, for example, temperature treatment (annealing) is performed at atmospheric pressure. Thus, in the above illustrated process flow 100-6c, a thin glass layer 76 arranged on the second partial substrate 71 serves as substrate material for fixing the semiconductor ball elements 14. During the pressing or fixing step, the glass material of the layer 76 sufficiently softened during this annealing process spans, for example, the recess 75 (cavity) completely.

Thereupon, in step 266, 268, the first partial substrate 10 (the V groove wafer) is removed or taken off from the ball elements 14 firmly connected to the second partial substrate 71, wherein now the second partial substrate 71, together with the auxiliary substrate 73 and the glass material layer 76 arranged thereon, forms the carrier substrate to which the ball elements 14 are fixed. In an optional step 269, the second partial substrate 71 is, for example, inverted or aligned for the next processing step.

In the step 300 of thinning the ball elements 14 fixed to the carrier substrate 71, the plano-convex lens elements 24 are obtained. The process of mechanical one-sided thinning can take place, for example, by means of grinding the semiconductor ball elements (silicon balls). The process of mechanical thinning is performed until the desired resulting lens shape (lens height) of the plano-convex lens elements 24 is obtained with the exact optical characteristics of the resulting lens elements 24. In the step of thinning, the planar side 24a of the plano-convex lens elements 24 is (directly) obtained, while the convex side 24b of the lens elements 24 is (at least partly) in the glass material of the layer 76. Here, the convex-side radius of curvature of the produced lens elements corresponds to the ball radius R of the (unprocessed or un-thinned) ball elements fixed to the carrier substrate. Further, by one-sided thinning of the ball elements fixed to the carrier substrate, the planar side of the plano-convex lens elements is formed.

The thinning process is performed until the needed height of the resulting ball elements is exactly adjusted based on the predetermined radius of curvature (ROC), such that the desired optical characteristics of the resulting silicon lens elements can be exactly obtained, since the convex-side radius or curvature of the silicon lens elements exactly corresponds to the ball radius of the silicon ball elements.

In a subsequent step 400, cavities 26 are generated starting from the second main surface area (rear) of the carrier substrate 71 to the lens elements 24, wherein, for example, one cavity 26 each per lens element 24 is generated. Thus, the optical effective area of the convex side 24b of the lens elements 24 bordering on the cavity 26 is each exposed.

This is obtained, for example, by means of an etching process of the silicon material of the auxiliary substrate 73 from the rear (the second main surface area of the same), wherein an etch stop takes place on the glass material layer 74 in the recesses 75.

Thereupon, the glass material bordering on the cavity 26 is removed (at least partly) in the area of the convex side 24b of the lens elements 24, i.e., the optically effective area of the lens 24 is exposed. Removing the glass material from the lens element 24 (silicon lens) can take place, for example, by means of etching.

From the above description with respect to the method 100-6c illustrated in FIG. 7C for producing plano-convex elements on wafer level, it becomes clear that the steps 202, 204, 206, 262, 264, 266 and 268 implement the step 200 of fixing ball elements of a semiconductor material to a carrier substrate, whereupon in step 300 one-sided thinning of the ball elements 14 fixed to the carrier substrate 70 and further in step 400 forming the cavities 26 is performed.

In the method 100-6c illustrated in FIG. 7c for producing plano-convex lens elements on wafer level, after the step 300 of thinning the ball elements 14 fixed to the carrier substrate 71, further, the optional steps 402, 404, 406 described based on FIG. 4b can be performed, where the rear 71b (second main surface) of the second partial substrate 71 is processed to prepare and provide the second partial substrate or carrier substrate 71 provided with the plano-convex lens elements 24 for electrical and mechanical connection, i.e., for example for wafer bonding, with a device substrate (sensor wafer). Here, it comes in particular into effect that the rear 71b (second main surface) of the second partial substrate or lens wafer 71 is still completely planar and uniform since in the preceding process steps only processing of the front 71a (i.e., the first surface area 71a) of the second partial substrate or carrier substrate 71 has taken place. Thereby, significant simplification of further processing and process-technical treatment of the rear 71b of the second auxiliary substrate 71 is obtained.

Since the "continuous" glass material layer 76 in the method illustrated based on FIG. 7c completely covers the recesses 75 in the auxiliary substrate 73, it is not needed that the semiconductor balls (silicon balls) comprise a passivation layer, e.g., an oxide layer, for the method steps 402, 404, 406. When etching the rear semiconductor structures, the glass material layer 76 on the silicon ball segments 24 fulfils the protective function for the silicon lenses with respect to the etching process performed from the rear.

In the following, based on FIG. 8, an exemplary flow diagram of a further production method 100-7 for producing plano-convex lens elements of a semiconductor material on wafer level will be described.

FIG. 8 shows an exemplary flow diagram of the inventive production method 100-7 of plano-convex lens elements of a semiconductor material, such as silicon, on wafer level. In the following, first, the process sequence of step 200 of fixing ball elements of a semiconductor material, such as silicon, to a carrier substrate will be described.

First, in a step 202, a first partial substrate 10 having depressions 12 is provided. The first partial substrate 10 is provided for receiving ball elements, wherein the depressions 12 can be formed, for example, in a square or rectangular manner.

As shown in FIG. 8 at step 204, a plurality of ball elements 14 of a semiconductor material having a diameter D can be provided, wherein then one ball element 14 each is inserted into one of the depressions 12 of the first partial substrate 10, such that one ball element 14 each is within a depression 12 of the first partial substrate. This process is also referred to as "balling".

The depressions 12 in the first partial substrate 10 can be formed with high accuracy by means of conventional semiconductor processing technologies, such as etching methods, such that an exact fit between the respective ball element 14 and the bottom or sidewalls of the depressions 12 can be obtained.

In step 208, the ball elements 14 are arranged in the depressions 12 of the first partial substrate 10, wherein a second partial substrate 18 is arranged on the first partial substrate 10 provided with the ball elements 14. The second partial substrate 18 can, for example, comprise a glass material. In step 208, a "glass wafer" 18 can be "applied" to the partial substrate 10 provided with the ball elements 14. As further illustrated in step 208, a ring 20 (e.g., a BN ring, BN=boron nitride) can be provided circumferentially on the edge region of the second partial substrate 18 to firmly fix (bond) the first and second partial substrate 10, 18 at least in an edge region (wafer edge) in a subsequent temperature treatment step 210 (annealing "T–1" or first anneal) at a temperature of, for example, 700-900° C. For this, in addition to the temperature treatment, mechanical pressure F is applied to the glass material of the second partial substrate 10 via the ring 20.

This first annealing process is possibly performed under vacuum such that a vacuum enclosure can be obtained accordingly in the enclosed inner area between the first and second partial substrate 10, 18.

In a further temperature treatment step 212 (second anneal or annealing T2) under "normal" atmosphere with the two partial substrates 10, 18 fixed to each other, at least partial liquefaction or sufficient softening of the glass material of the second partial substrate 18 is obtained, such that the ball elements 14 are at least partly engulfed by the sufficiently softened glass material of the second partial substrate 18. After re-solidification of the glass material of the second partial substrate 18, the ball elements 14 are embedded between the first partial substrate 10 and the solidified glass material of the second partial substrate 18. Thus, the first partial substrate 10 and the re-solidified glass material of the second partial substrate 18 form the carrier substrate 22 where the ball elements 14 are fixed or embedded. The method step 212 of FIG. 8 is, for example, based on technologies of so-called glass flowing.

To obtain the desired plano-convex lens elements 24 from the ball elements 14 embedded in the carrier substrate, the carrier substrate 22 is thinned on both sides (e.g., mechanically), i.e., processed by means of a grinding method.

In the mechanical thinning processes, starting from the second main surface area 22b of the carrier substrate 22, non-planarities in the solidified glass material of the second partial substrate 18 are planarized.

Starting from the first main surface area 22a of the carrier substrate 22, on the one hand, the material of the first partial substrate 10 is removed, e.g. by means of grinding, wherein further the ball elements 14 fixed to the resulting carrier substrate 22 are thinned on one side (mechanically ground) to obtain the plano-convex lens elements 24. By exactly adjusting the resulting wafer thickness of the carrier substrate 22, the exact optical characteristics of the resulting lens elements 24 can be adjusted. Here, the planar side 24a of the resulting plano-convex lens elements is flush with the thinned rear (first main surface) of the carrier substrate 22, while the convex side 24b of the lens elements 24 is in the solidified glass material of the second partial substrate 18.

In step 450, a third partial substrate 24 is bonded or connected to the first main surface area 22a of the carrier substrate 22 provided with the lens elements 24, wherein the third partial substrate 23 can comprise a semiconductor material, such as silicon. Thus, the planar and polished side 24a of the lens elements 24, i.e., the lens elements 24 embedded in the carrier substrate 22 is bonded onto a further third partial substrate, such as a silicon wafer. This connecting process (bonding) can take place by means of anodic bonding, thermal bonding or direct wafer bonding.

In step 452, the glass material of the carrier substrate 22 is at least partly removed starting from the first exposed main surface of the same to at least partly expose the optically effective convex-side surface 24b of the lens elements 24. This can take place, for example, by glass rear etching of the glass material of the carrier substrate 22 to expose the (convex-side) lens surface, wherein the glass material might be removed completely. This depends, for example, on the respective further processing of the lens elements 24 on the third partial substrate 23.

In the arrangement of lens elements 24 arranged on the third partial substrate 23 illustrated in step 452, it becomes clear that the planar side 24a of the lens elements 24 is applied to the first partial substrate 24 or bonded thereon, while the convex-side surface 24b of the lens elements 24 (i.e., at least the optically effective area of the same) is exposed.

Thus, the above illustrated method steps 200, 204, 206, 208, 210 and 212 form together the step 200 of fixing 200 ball elements of a semiconductor material to a carrier substrate, while step 300 of one-sided thinning the ball elements fixed to the carrier substrate is realized for forming the plano-convex lens elements of a semiconductor material.

First, in a method 100-8, the above-described method steps 202, 204 and 206 are performed to provide a first partial substrate 10 provided with depressions 12 of a semiconductor material, e.g., silicon. In the depressions 12 of the first partial substrate 10, the ball elements 14 are arranged such that, for example, one ball element 14 each is within a depression 12 of the first partial substrate 10 (steps 202, 204, 206).

In the following, based on FIG. 9, an exemplary flow diagram of a further production method 100-8 for producing plano-convex lens elements of a semiconductor material on wafer level will be described. In the following, first, the process flow of step 200 of fixing ball elements of a semiconductor material, such as silicon, to a carrier substrate is described.

First, in a step 202, a first partial substrate 10 with depressions 12 is provided. The first partial substrate 10 is provided for receiving ball elements, wherein the depressions 12 can be formed in a square or rectangular or circular manner.

As illustrated in FIG. 9 at step 204, a plurality of ball elements 14 of a semiconductor material having a diameter D can be provided, wherein then one ball element 14 each is inserted in one of the depressions 12 of the first partial substrate 10, such that one ball element 14 each is within a depression 12 of the first partial substrate. This process is also referred to as "balling".

The depressions 12 in the first partial substrate 10 can be formed by means of conventional semiconductor processing technologies, such as etching methods, with high accuracy, such that exact fitting between the respective ball element 14 and the bottom or lateral walls of the depressions 12 can be obtained. In step 206, the ball elements 14 are arranged in the depressions 12 of the first partial substrate 10.

In step 270, e.g., a polymer material is deposited on the first partial substrate 10 provided with the ball elements 14, such that the ball elements 14 are embedded between the solidified polymer material 80 and the first partial substrate 10 after solidification of the polymer material. Thus, the first partial substrate 10 and the solidified polymer material 70 (or polymer casting material or polymer casting mass) form the carrier substrate with the ball elements 14 fixed thereto.

In step 272, the carrier substrate comprising the first partial substrate 10 and the polymer material 80 is mechanically thinned on one or both sides, wherein the step of thinning the ball elements fixed to the carrier substrate takes place starting from the exposed main surface area of the first partial substrate 10. Further, the carrier substrate can be thinned starting from the exposed main surface area of the polymer material to obtain the desired target thickness of the resulting carrier substrate with the lens elements 24 embedded therein. Here, the planar side 24a of the lens elements 24 is flush with the rear (second main surface) of the carrier substrate, wherein respectively the convex side 24b of the lens elements 24 is in the polymer material. In step 272, the material of the first partial substrate, the semiconductor ball elements (silicon balls) and the surrounding polymer material is ground to the desired target thickness and polished.

In step 274, a further (third) partial substrate 82 of a semiconductor material is connected to the carrier substrate on the second main surface area of the same or bonded thereon. This is performed, for example by firm material bond of the carrier substrate provided with the lens elements 24 on the third partial substrate, e.g. a silicon substrate. A direct silicon-silicon connection is obtained, for example by direct wafer bonding or fusion wafer bonding.

In a step 276, the polymer material 80 of the carrier substrate is at least partly removed starting from the exposed (first) main surface area of the same to at least partly expose the convex-side surface 24b of the lens elements 24, i.e. to expose at least the optically effective areas of the convex-side surface of lens elements 24.

Removing the polymer material can, for example, be performed by releasing the polymer mass. Alternatively, an oxygen plasma or thermal stripping by an $O_2$ etching process ($O_2$ etch) can be performed until the convex-side surface 24b of the lens elements (silicon lenses) is exposed.

Further, the polymer material can also be completely stripped to completely expose the convex-side surface 24b of the lens elements. This is illustrated in the optional step 278.

In step 280, for example, cavities 26 that are open on one side are generated starting from the outer exposed surface area of the third partial substrate to the lens elements 24, such that the (optically effective) area of the planar side 24a of the lens elements 24 bordering on the respective cavity 26 is exposed. The cavities 26 can be formed, for example by means of an etching process into the semiconductor material (e.g. silicon) of the third partial substrate.

In the following, some aspects of the inventive production method will be summarized.

According to the inventive concept, the lens elements are no longer directly produced with the respective needed focal length, but semiconductor balls (e.g. silicon balls) having exactly the necessitated radius are embedded into a rigid carrier material, such that a complete substrate or a complete wafer with semiconductor balls is obtained. Subsequently, these semiconductor balls fixed to the substrate are ground (on one side) and polished, such that a substrate in wafer format results which includes the desired plano-convex lenses or ball caps of a semiconductor material, e.g. silicon. This wafer can subsequently be processed further and accordingly be joined according to the production method illustrated in detail above either onto a further silicon wafer (bonded, process 100-7) or can be directly provided with cavities, such that this wafer can be used directly for hermetically sealed capping of IR sensors (processes 100, 100-1, . . . , 100-8).

Since the encapsulation of the IR sensors is to be performed on wafer level and the joining processes all entail an increased process temperature, the coefficient of thermal extension (CTE) of the substrate with the lenses should be adapted to the one of silicon. Otherwise, after joining and cooling down, very large mechanical tensions can occur, which can result in damage (at least) of the joining zone or even to damages or the destruction of the device. However, since the substrate should also ensure hermetical sealing of the cavities of the IR sensors, as a material for the substrate, ultimately, silicon itself or glasses having adapted CTE (Pyrex, Borofloat, AF32, Eagle XG, Hoya SD 2, etc.) can essentially be used. Thus, for the processes, merely glass can be used as material and substrate material.

Even in the process 100-7, after bonding the substrate, the carrier material is removed at least to a large part (even complete removal is possible when the planar side of the plano-convex lenses is directly connected to the underlying silicon substrate) to expose the actual lens area. Subsequently, cavities are also inserted on the rear which, in the following production process, enclose and seal the IR sensors. In this technology, glass can also be used as carrier material (process 100-7), however, it is also basically possible to use other materials, especially polymers (process 100-8), under the prerequisite that the material is suitable for grinding and polishing the surfaces. For example, polyimide is known to enable planarizing and polishing. For this, however, a further process variation 100-8 would be particularly suitable since here also materials can be used that do not flow viscously at a temperature but only set or react after thermal post treatment.

Subsequently, regardless of which variations are used, the lens surfaces can be provided with antireflective coating (ARC), for example by vapor deposition of suitable layers with adapted layer thicknesses and refractive indices.

Subsequently, depending on the exact configuration of the joining process (wafer bonding) joining materials surrounding the cavities can be deposited and structured. In the simplest case, these can be glass solders that are printed on and remelted, or are metallic solders such as gold-tin. In the latter case, however, the joining frame around the actual cavities should be provided with a suitable solderable metallization. FIG. 10 shows an exemplary basic flow diagram of a method 600 for producing a packaged device on wafer level. The method 600 for producing a packaged device on wafer level performs first the step 610 of producing a carrier substrate (lens wafer) provided with plano-convex lens elements, wherein ball elements 14 comprising a semiconductor material are fixed to a carrier substrate 22, wherein the ball elements 14 fixed to the carrier substrate 22 are thinned on one side to form the plano-convex lens elements 24 of a semiconductor material or the plano-convex lens elements 24 comprising a semiconductor material. This process has been described above based on FIGS. 1 to 9 in detail as method 100, 100-1 . . . 100-8.

Subsequently, in step 620, a device substrate (e.g. sensor wafer) comprising a plurality of devices, such as IR sensor elements (IR radiation-sensitive devices, IR=infrared) is provided. Thereupon, in a step 630, the substrates (device substrate and carrier substrate) are arranged on one another, e.g. by a vacuum-bond process, such that the lens elements arranged on the carrier substrate are aligned with the associated devices (e.g. IR sensor elements) of the device substrate (sensor wafer). The carrier substrate with the lens elements arranged thereon and the device substrate can be joined in a hermetically sealed manner also by using solders or glass solders. Arranging (connecting or bonding) of the substrates can take place under vacuum. As vacuum, a coarse vacuum of 300 . . . 1 hPa (mbar), a fine vacuum of 1 . . . $10^{-3}$ hPa, a high vacuum (HV) of $10^{-3}$ . . . $10^{-7}$ hPa, an ultrahigh vacuum (UHV) of $10^{-7}$ . . . $10^{-12}$ hPa or an extremely high vacuum (XHV) of $<10^{-12}$ hPa can be used.

The produced lens wafer can, for example, be provided with a solder frame, e.g. with a glass solder or a metallic solder and can be connected in a hermetically sealed manner under vacuum (vacuum bonded) with the actual sensor wafer. The cavity serving to receive the silicon lens forms at the same time the evacuated area above the IR sensor. By the vacuum, the sensitivity of the IR sensor (e.g. a bolometer or thermopile) is significantly increased since heat conduction via air is omitted.

Finally, in a step 640, the carrier substrate with the device substrate arranged thereon is diced to obtain diced devices provided with one lens element each.

Figure 11:
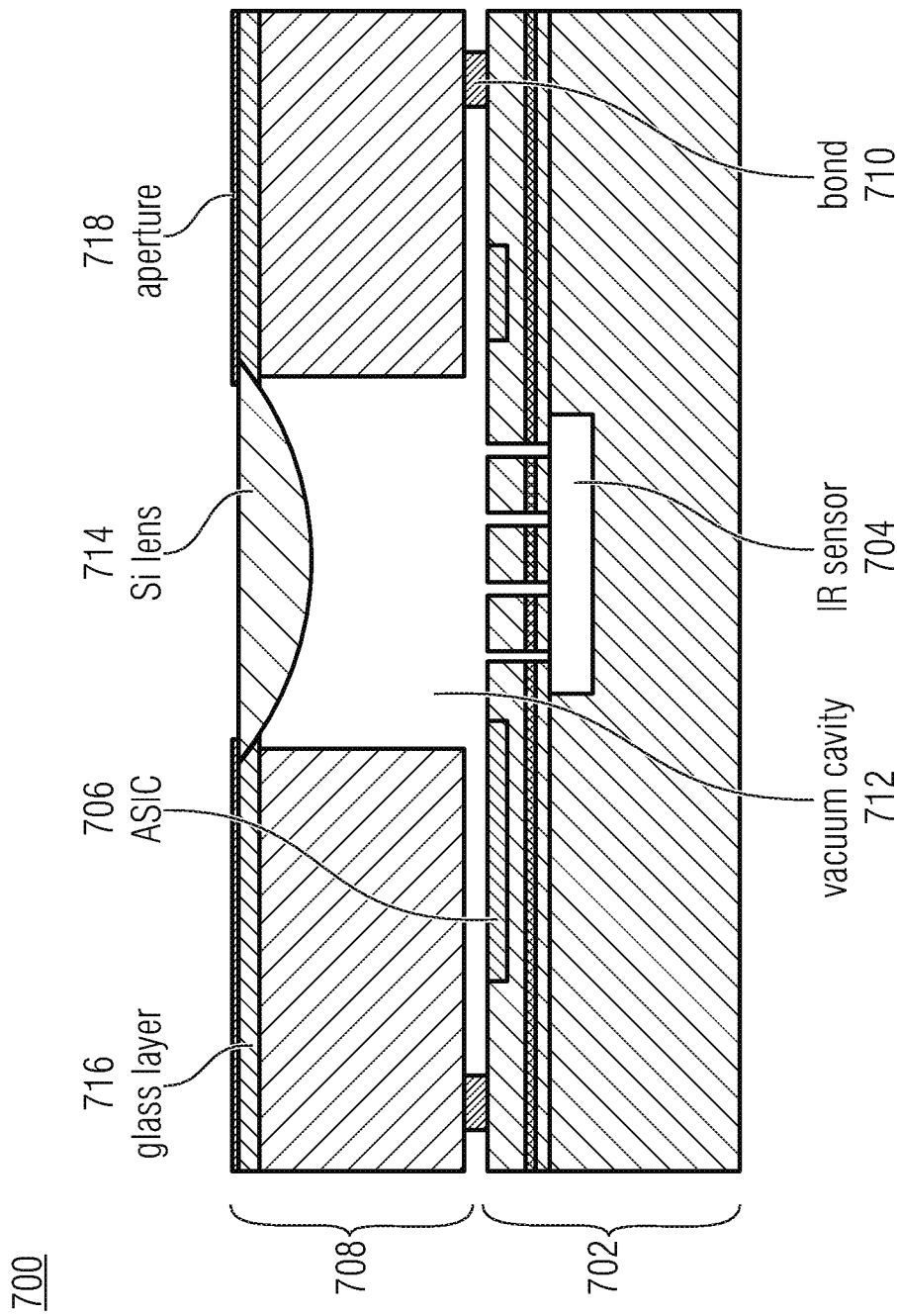
FIG. 11 is an exemplary embodiment for a packaged radiation-sensitive device according to an embodiment produced, for example by a method described herein.

FIG. 11 shows an exemplary embodiment for a packaged radiation-sensitive device 700 according to an embodiment produced, for example with the method 100, 100-1 . . . 100-8 described herein.

As illustrated in FIG. 11, the radiation-sensitive device (IR sensor) 700 comprises an IR sensor 704 arranged in the device substrate 702 and an ASIC 706. A bond frame (solder frame) 710 is arranged between the device substrate 702 and a carrier substrate 708 (cf. carrier substrates 30, 40, 56, 70). Further, a vacuum cavity 712 (cf. cavity 26) is formed between the device substrate 702 and a carrier substrate 708. Further, a semiconductor lens 714 (Si-lens, cf. semiconductor lens 24), a glass layer 716 (cf. glass layer 44, 54, 76) and an aperture 718 are arranged on the carrier substrate 708).

The lens shape (e.g. the lens radius) of the semiconductor lens 714 is selected such that the focal width or the focus of the lens 714 is at the bottom of the vacuum chamber 712, i.e. at the IR sensor element 704. The semiconductor lens 714 directed to the inside provides hermetic sealing of the vacuum cavity 712 to the environment by the combination with the glass material of the glass layer 716 (glass membrane).

According to the procedure for producing the lens wafer or a packaged device illustrated in FIGS. 1 to 10, it is ensured that the semiconductor 714 is surrounded (essentially at all times) by the glass layer 714 (e.g. ring-shaped or rim-shaped) above the vacuum cavity 712 and hence forms some sort of "rim" (frame) for the semiconductor lens 714 and (together with the bond material 710) hermetic sealing of the vacuum capacity 712 supports or allows hermetic sealing of the vacuum cavity 712 to the environment.

The method for producing the lens wafer or a packaged device illustrated in FIGS. 1 to 10 merely involves a single lithography plane (an etch-through process), wherein the residual production steps are (all) self-adjusting and hence are easy and cost-effective to realize. Further, the illustrated procedure allows high reproducibility of the optical characteristics of the sensor elements, i.e. for example the focal width, wherein the production method is also cost-effective to realize since semiconductor balls usable for the present method are relatively cost-effective. By the described procedure, an essentially planar outer side of the packaged device is obtained while the convex side of the lens is arranged on the inside directed towards the cavity.

Apart from IR detectors, accordingly produced packaged devices can also be used for realizing infrared cameras.

Figure 12:
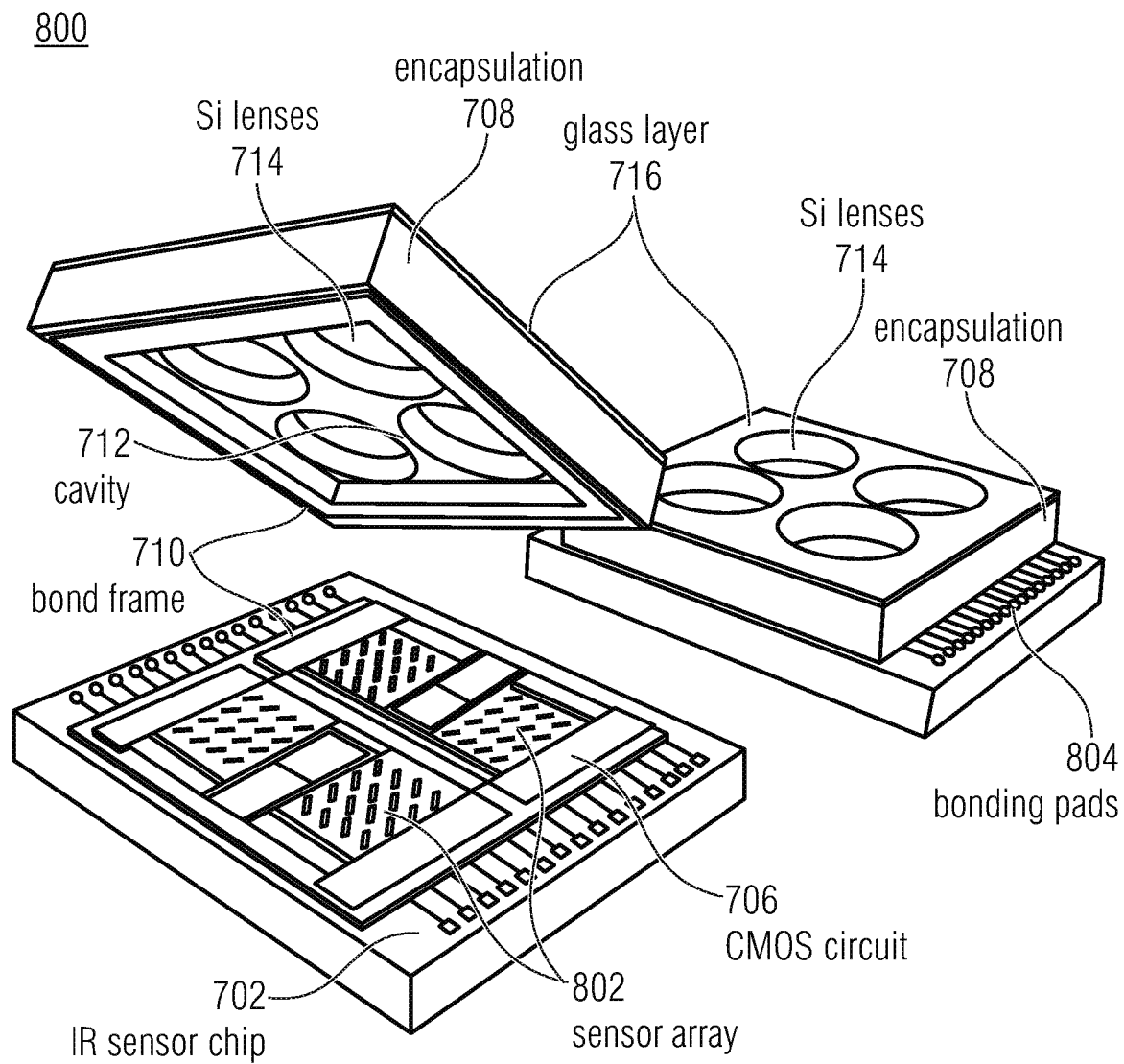
FIG. 12 is an exemplary embodiment having several radiation-sensitive devices and associated lens elements in the same housing.

FIG. 12 shows an exemplary embodiment for a packaged radiation-sensitive device (IR sensor) 800 with several radiation-sensitive devices 700 and associated lens elements 714 (arrays) in the same housing 802. In the sensor array arrangement of FIG. 12 (as far as applicable), the reference numbers of FIG. 11 are used.

As illustrated in FIG. 12 in an open view (on the left) and a closed view (on the right), the radiation-sensitive device (IR sensor) 800 includes a plurality (an array 802) of IR sensors 704 arranged in the device substrate 702 and CMOS circuits (ASIC) 706 with associated bonding pads 804. A bond frame (solder frame) 710 is arranged between the device substrate 702 (sensor chip) and a carrier substrate 708 (encapsulation, cf. carrier substrates 30, 40, 56, 70). Further, a vacuum cavity 712 (cf. cavity 26) is formed between the device substrate 702 and a carrier substrate 708. Further, an array of semiconductor lenses 714 (Si-lens, cf. semiconductor lens 24) and a glass layer 716 (cf. glass layer 44, 54, 76) are arranged on the carrier substrate 708.

As illustrated in FIG. 12, the actual IR sensor chip 702 includes, apart from the IR sensor elements 704 arranged in an array 802, the evaluation circuits 706 and the frame structure 710 needed for encapsulation, e.g. AlGe bond frames. The silicon lenses 704 are inserted into a depression in the encapsulation 708, which is evacuated during wafer bonding. This cavity 712 is also enclosed by a solderable frame structure 710. The silicon lenses 714 themselves are embedded into a glass layer 706 on the surface of the encapsulation chip 708. The entire structure can still be realized on wafer level. Only at the end of the production process, the wafers 702, 708 are diced.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus. Some or all of the method steps may be performed by a hardware apparatus (or using a hardware apparatus), such as a microprocessor, a programmable computer or an electronic circuit. In some embodiments, some or several of the most important method steps may be performed by such an apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer readable.

Some embodiments according to the invention include a data carrier comprising electronically readable control signals, which are capable of cooperating with a programmable computer system, such that one of the methods described herein is performed. Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, wherein the computer program is stored on a machine readable carrier. In other words, an embodiment of the inventive method is, therefore, a computer program comprising a program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein. The data carrier, the digital storage medium, or the computer-readable medium are typically tangible or non-volatile.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises a processing means, for example a computer, or a programmable logic device, configured to or adapted to perform one of the methods described herein. A further embodiment comprises a computer having installed thereon the computer program for performing one of the methods described herein.

A further embodiment in accordance with the invention includes an apparatus or a system configured to transmit a computer program for performing at least one of the methods described herein to a receiver. The transmission may be electronic or optical, for example. The receiver may be a computer, a mobile device, a memory device or a similar device, for example. The apparatus or the system may include a file server for transmitting the computer program to the receiver, for example.

In some embodiments, a programmable logic device (for example a field programmable gate array, FPGA) may be used to perform some or all of the functionalities of the methods described herein. In some embodiments, a field programmable gate array may cooperate with a microprocessor to perform one of the methods described herein. Generally, the methods are performed by any hardware apparatus. This can be a universally applicable hardware, such as a computer processor (CPU) or hardware specific for the method, such as ASIC.

According to a first aspect, a production method 100, 100-1, . . . , 100-8 can comprise the following steps: providing 202 a first partial substrate 10 with ball elements 14 arranged thereon; providing 230 a second partial substrate 30; 40; 41; 56; 60; 70; 71 including a glass material layer 30; 44; 54; 76; arranging 236; 244; 262 the second partial substrate 30; 40; 41; 56; 60; 70; 71 on the first partial substrate 10 provided with the ball elements 14, fixing 238, 246, 264 the ball elements 14 to the glass material layer 30; 44; 54 of the second partial substrate by means of annealing and applying mechanical pressure; and one-sided thinning 300 of the ball elements 14 fixed to the glass material layer 30; 44; 54; 76 of the second partial substrate 30; 40; 41; 56; 60; 70; 71 to obtain plano-convex lens elements 24.

According to a second aspect with reference to the first aspect, in a method, the ball elements 14 can comprise a semiconductor material and the convex-side radius of curvature R of the lens elements 24 can correspond to the ball radius R of the ball elements 14.

According to a third aspect with reference to at least one of the first to second aspect, the method can further comprise the following step: fixing 630 devices to the second partial substrate 30; 40; 41; 56; 60; 70 provided with the lens elements 24 to obtain devices provided with at least one lens element 24 each.

According to a fourth aspect with reference to at least one of the first to third aspects, the method can further comprise the following step: dicing 640 the second partial substrate 30; 40; 41; 56; 60; 70 with the lens elements 24 arranged thereon and the devices to obtain diced devices provided with at least one lens element 24 each.

According to a fifth aspect with reference to at least one of the first to fourth aspects, the method can further comprise the following steps; providing 202 a first partial substrate provided with depressions 12, wherein the ball the ball elements 14 are arranged in the depressions 12 of the first partial substrate 10; providing a second partial substrate 41, wherein the second partial substrate comprises recesses 49 and the glass material layer 44, wherein the glass material layer 44 is arranged on a first main surface area of the second partial substrate, wherein the glass material layer 44 comprises openings 46 that are aligned with the recesses 49 of the second partial substrate 41, and wherein the openings 46 of a the glass material layer 44 have a smaller diameter than the recesses 49 of the second partial substrate 41; arranging the second partial substrate 41 on the first partial substrate 10 provided with the ball elements 14, wherein the first main surface area of the second partial substrate 41 provided with the glass material layer 44 is facing the ball elements 14 and wherein the ball elements 14 are aligned with the recesses 49; and fixing the second partial substrate 41 provided with the glass material layer 44 to the ball elements 14 by means of annealing and applying mechanical pressure; and removing the first partial substrate 10 from the ball elements 14 firmly connected to the second partial substrate 41.

According to a sixth aspect with reference to the fifth aspect, in the method in step 300 of thinning the ball elements 14 fixed to the second partial substrate 41, the plano-convex lens elements 24 can be formed, wherein the convex side 24b of the lens elements 24 is at the recesses 49 of the second partial substrate 41, and wherein the planar side 24a of the plano-convex lens elements 24 is formed by the step of thinning; and wherein the recesses 49 of the second partial substrate 41 and the openings 46 of the glass material layer 44 form cavities 26 for the lens elements 24, wherein the area of the lens elements 24 bordering on the cavity is exposed.

According to a seventh aspect with reference to at least one of the fifth to sixth aspect, the method can further comprise the following step: processing the rear of the second partial substrate to prepare the second partial substrate provided with the plano-convex lens elements for electrical and mechanical connection.

According to an eighth aspect with reference to the seventh aspect, in the method, the step of processing can further comprise the following steps: depositing a passivation layer and a bond structure arranged thereon on the rear of the second partial substrate, opening recesses within the second partial substrate starting from the rear of the second partial substrate to obtain complete vias to the rear of the second partial substrate; and removing oxide material on the surfaces of the silicon lenses facing the vias.

According to a ninth aspect with reference to at least one of the first to fourth aspects, the method 100-2 can further comprise the following steps: providing 202, 204, 206 a first partial substrate 10 provided with depressions 12, wherein the ball elements 14 are arranged in the depressions 12 of the first partial substrate 10; providing a second partial substrate 30 comprising the glass material layer, wherein the second partial substrate 30 comprises depressions 32; arranging 222 the second partial substrate 30 on the first partial substrate 10 provided with the ball elements 14, wherein the depressions 32 in the second partial substrate 30 are aligned with the ball elements 14; fixing the second partial substrate 30 to the ball elements 14 arranged in the depressions 12 of the first partial substrate 10 by means of annealing and applying mechanical pressure to fix the ball elements 14 to the depressions 32 of the second partial substrate 30; and removing the first partial substrate 10 from the ball elements 14 firmly connected to the second partial substrate 30.

According to a tenth aspect with reference to the ninth aspect, in the step 300 of thinning the ball elements fixed to the second partial substrate, the plano-convex lens elements can be obtained, wherein the convex side 24b of the lens elements 24 is at the depressions 32 of the second partial substrate 30 and wherein the planar side 24a of the plano-convex lens elements 24 is formed by the step of thinning, and wherein the depressions 32 of the second partial substrate 30 form cavities 26 for the lens elements 24, wherein the area of the lens elements 24 bordering on the cavities 26 is exposed.

According to an eleventh aspect with reference to at least one of the first to fourth aspects, the method 100-2 can further comprise the following steps: providing 202 a first partial substrate 10 provided with depressions 12, wherein the ball elements 14 are arranged in the depressions 12 of the first partial substrate 10; providing a second partial substrate 40, wherein the second partial substrate comprises vias 48 and the glass material layer 44, wherein the glass material layer 44 is arranged on a first main surface area of the second partial substrate, wherein the glass material layer 44 comprises openings 46 that are aligned with the vias 48 of the second partial substrate 40, and wherein the openings 46 of the glass material layer 44 have a smaller diameter than the vias 48 of the second partial substrate 40; arranging the second partial substrate 40 on the first partial substrate 10 provided with the ball elements 14, wherein the first main surface area of the second partial substrate 40 provided with the glass material layer 44 is facing the ball elements 14, and wherein the ball elements 14 are aligned with the vias 48; and fixing the second partial substrate 40 provided with the glass material layer 44 to the ball elements 14 by means of annealing and applying mechanical pressure; and removing the first partial substrate 10 from the ball elements 14 firmly connected to the second partial substrate 40.

According to a twelfth aspect with reference to the eleventh aspect, in the step 300 of thinning the ball elements 14 fixed to the second partial substrate 40, the plano-convex lens elements 24 can be formed, wherein the convex side 24b of the lens elements 24 is at the vias 48 of the second partial substrate 40, and wherein the planar side 24a of the plano-convex lens elements 24 is formed by the step of thinning; and wherein the vias 48 of the second partial substrate 40 and the openings 46 of the glass material layer 44 form cavities 26 for the lens elements 24, wherein the area of the lens elements 24 bordering on the cavity is exposed.

According to a thirteenth aspect with reference to at least one of the eleventh to twelfth aspects, the method can further comprise the following step: processing the rear of the second partial substrate to prepare the second partial substrate provided with the plano-convex lens elements for electrical and mechanical connection.

According to a fourteenth aspect with reference to at least one of the first to fourth aspects, in the method 110-4, the step 200 of fixing can comprise the following steps: providing 202, 204, 206 a first partial substrate 10 provided with depressions 12, wherein the ball elements 14 are arranged in the depressions 12 of the first partial substrate 10; providing 242 a second partial substrate 56, wherein the second partial substrate 56 comprises recesses 52 and the glass material layer 54, wherein the glass material layer 54 is arranged on the first main surface area of the second partial substrate 56 provided with the recesses 52, and wherein the glass material layer 54 spans the recesses 52; arranging the second partial substrate 56 on the first partial substrate 10 provided with the ball elements 14, wherein the first main surface area of the second partial substrate 56 provided with the glass material layer 54 faces the ball elements 14, and wherein the ball elements 14 are aligned with the recesses 52; fixing the second partial substrate 56 provided with the glass material layer 54 to the ball elements 14 by means of annealing and applying mechanical pressure; and removing the first partial substrate 10 from the ball elements 14 firmly connected to the second partial substrate 56.

According to a fifteenth aspect with reference to the fourteenth aspect, in the step 300 of thinning the ball elements 14 fixed to the second partial substrate 56, the plano-convex lens elements 24 can be obtained, wherein the convex side 24b of the lens elements 24 is at the recesses 52 of the second partial substrate 56, and wherein the planar side 24a of the plano-convex lens elements 24 is obtained by the step of thinning.

According to a sixteenth aspect with reference to at least one of the fourteenth to fifteenth aspects, the method can further comprise the following step: generating cavities 26 starting from the exposed second main surface area of the second partial substrate 56 to the lens elements 24, such that the area of the lens elements 24 bordering on the cavity is exposed.

According to a seventeenth aspect with reference to at least one of the first to fourth aspects, the step 200 of fixing can comprise the following steps: providing 202, 204, 206 of first partial substrate 10 provided with depressions 12, wherein the ball elements 14 are arranged in the depressions 12 of the first partial substrate 10; providing a second partial substrate 60, wherein a glass material layer 64 is arranged on a first main surface area of the second partial substrate 60; arranging the second partial substrate 60 on the first partial substrate 10 provided with the ball elements 14, wherein the first main surface area of the second partial substrate 60 provided with the glass material layer 62 is facing the ball elements 14; fixing the second partial substrate 60 provided with the glass material layer 64 to the ball elements 14 by means of annealing and by applying mechanical pressure; removing the first partial substrate 10 from the ball elements 14 firmly connected to the second partial substrate 60.

According to an eighteenth aspect with reference to the seventeenth aspect, in the step 300 of thinning the ball elements 14 fixed to the second partial substrate 60, the plano-convex lens elements can be obtained, wherein the convex side 24b of the lens elements 24 is at the glass material layer 24 of the second partial substrate 60, and wherein the planar side 24a of the plano-convex lens elements 24 is formed by the step of thinning.

According to a nineteenth aspect with reference to at least one of the seventeenth to eighteenth aspects, the method can further comprise the following step: generating cavities 26 starting from the exposed second main surface area of the second partial substrate 60 to the lens elements 24, such that the area of the lens elements 24 bordering on the cavity 26 is at least partly exposed.

According to a twentieth aspect with reference to at least one of the first to fourth aspects, the step 200 of fixing can comprise the following steps: providing 202 a first partial substrate 10 provided with the depressions 12, wherein the ball elements 14 are arranged in the depressions 12 of the first partial substrate 10; providing a second partial substrate 70, wherein the second partial substrate comprises vias and a glass material layer, wherein the glass material layer 76 spans the vias 74; arranging the second partial substrate 70 on the first partial substrate 10 provided with the ball elements, wherein the first main surface area of the second partial substrate 70 provided with the glass material layer 76 is facing the ball elements 14, and wherein the ball elements 14 are aligned with the vias 74; fixing the second partial substrate 70 provided with the glass material layer 76 to the ball elements 14 by means of annealing and applying pressure; and removing the first partial substrate 10 from the ball elements 14 firmly connected to the second partial substrate 70.

According to a twenty-first aspect with reference to the twentieth aspect, in the step of thinning 300 the ball elements 14 fixed to the second partial substrate 70, the plano-convex lens elements 24 can be obtained, wherein the convex side 24b of the lens elements 24 is at the vias 74 of the second partial substrate, and wherein the planar side 24a of the plano-convex lens elements 24 is obtained by the step of thinning, and wherein the vias of the second partial substrate 70 form cavities 26 for the lens elements 24, wherein the area of the lens elements 24 bordering on the cavity 26 is at least partly exposed.

According to a twenty-second aspect with reference to at least one of the first to fourth aspects, the step 200 of fixing can comprise the following steps: providing 202, 204, 206 a first partial substrate 10 provided with depressions 12, wherein a subset of the ball elements 14 is arranged in the depressions 12 of the partial substrate 10; providing 260-1 a second partial substrate 70, wherein the second partial substrate comprises vias 74 and the glass material layer 76, wherein the glass material layer 76 spans the vias 74; arranging 262-1 the second partial substrate 70 on the first partial substrate 10 provided with the ball elements 14, wherein the first main surface area of the second partial substrate 70 provided with the glass material layer 76 is facing the ball elements 14, and wherein the ball elements 14 are aligned with a subset of the vias 74; fixing the second partial substrate 70 provided with the glass material layer 76 to the ball elements 14 by means of annealing and applying pressure; removing 266-1 the first partial substrate 10 from the ball elements 14 firmly connected to the second partial substrate 70; performing 300-1 the step of thinning 300 the ball elements 14 fixed to the second partial substrate 70 to obtain plano-convex lens elements 24; providing a further partial substrate 10 provided with depressions 12, wherein a further subset of the ball elements 14 is arranged in the depressions 12 of the partial substrate 10; arranging 262-2 the second partial substrate 70 on the further partial substrate 10 provided with the further subset of ball elements 14, wherein the first main surface area of the second partial substrate 70 provided with the glass material layer 76 is facing the ball elements 14, and wherein the ball elements 14 are aligned with a further subset of the vias 74; fixing 264-2 the second partial substrate 70 provided with the glass material layer 76 to the further subset of ball elements 14 by means of annealing and applying pressure; removing 266-2 the further partial substrate 10 from the ball elements 14 firmly connected to the second partial substrate 70; performing the step of thinning 300-2 the further subset of ball elements 14 fixed to the second partial substrate 70 to obtain the plano-convex lens elements 24.

According to a twenty-third aspect with reference to at least one of the first to fourth aspects, the step 200 of fixing can comprise the following steps: providing 202 a first partial substrate 10 provided with depressions 12, wherein the ball elements 14 are arranged in the depressions 12 of the first partial substrate 10; providing a second partial substrate 71, wherein the second partial substrate 71 comprises recesses 73 starting from the first main surface area and further a glass material layer 76, wherein the glass material layer 76 spans the recesses 76, arranging the second partial substrate 70 on the first partial substrate 10 provided with the ball elements 14, wherein the first main surface area of the second partial substrate 71 provided with the glass material layer 76 is facing the ball elements 14, and wherein the ball elements 14 are aligned with the recesses 74; fixing the second partial substrate 71 provided with the glass material layer 76 to the ball elements 14 by means of annealing and applying pressure; and removing the first partial substrate 10 from the ball elements 14 fixed to the second partial substrate 70.

According to a twenty-fourth aspect with reference to the twenty third aspect, in the step of thinning 300 the ball elements 14 fixed to the second partial substrate 71, the plano-convex lens elements 24 can be obtained, wherein the convex side 24b of the lens elements 24 is at the vias 76 of the second partial substrate, and wherein the planar side 24a of the plano-convex lens elements 24 is obtained by the step of thinning, and wherein the vias of the second partial substrate 70 form cavities 26 for the lens elements 24, wherein the area of the lens elements 24 bordering on the cavity 26 is at least partly exposed.

According to a twenty-fifth aspect with reference to the twenty-fourth aspect, in the step of thinning 300, the plano-convex lens elements 24 can be obtained, wherein the convex side 24b of the lens elements 24 is at the vias 76 of the second partial substrate, and wherein the planar side 24a of the plano-convex lens elements 24 is obtained by the step of thinning, and wherein the vias of the second partial substrate 70 form cavities 26 for the lens elements 24, wherein the area of the lens elements 24 bordering on the cavity 26 is at least partly exposed.

According to a twenty-sixth aspect with reference to at least one of the twenty-fourth to twenty-fifth aspects, the method can further comprise the following step: processing the rear of the second partial substrate to prepare the second partial substrate provided with the plano-convex lens elements for electrical and mechanical connection.

According to a twenty-seventh aspect with reference to the twenty-sixth aspect, the step of processing can further comprise the following steps: depositing a passivation layer and a bond structure arranged thereon on the rear of the second partial substrate, opening recesses within the second partial substrate starting from the rear of the second partial substrate to obtain complete vias to the rear of the second partial substrate; and removing oxide material on the surfaces of the silicon lenses facing the vias.

According to a twenty-eighth aspect with reference to at least one of the first to fourth aspects, the step 200 of fixing can comprise the following steps: providing 202 a first partial substrate 10 provided with depressions 12; arranging 204 the ball elements 14 in the depressions 12 of the first partial substrate 10; arranging a second partial substrate 18 on the first partial substrate 10 provided with ball elements 14, wherein the second partial substrate 18 comprises a glass material, wherein the first and second partial substrates 10, 18 are fixed to one another at least in an edge region; and annealing the two partial substrates such that partial engulfing the ball elements 14 with the glass material of the second partial substrate 18 is effected, such that, after re-solidification of the glass material of the second partial substrate 18, the ball elements are embedded between the first partial substrate 10 and the solidified glass material of the second partial substrate 18, wherein the first partial substrate 10 and the solidified glass material of the second partial substrate 18 form a carrier substrate.

According to a twenty-ninth aspect with reference to the twenty-eighth aspect, the method can further comprise the following steps: two-sided mechanical thinning of the carrier substrate; wherein the step 300 of thinning the ball elements 14 fixed to the carrier substrate takes place starting from the outer exposed main surface area of the first partial substrate 10 to form the plano-convex lens elements; and wherein the carrier substrate is further thinned starting from the outer exposed surface area of the second partial substrate 18.

According to a thirtieth aspect with reference to at least one of the twenty-eighth to twenty-ninth aspects, the method can comprise the following steps: connecting a third partial substrate 23 comprising a semiconductor material to the carrier substrate; and at least partly removing the glass material of the carrier substrate to expose the convex-side surface 24b of the lens elements 24 at least partly.

According to a thirty-first aspect with reference to at least one of the first to fourth aspects, the step 200 of fixing can comprise the following steps: providing 202 a first partial substrate 10 provided with depressions 12; arranging the ball elements 14 in the depressions 12 of the first partial substrate 10; arranging 270 a polymer material 80 on the first partial substrate 10 provided with the ball elements, such that the ball elements 14 are embedded between the polymer material 80 and the first partial substrate 10, wherein the first partial substrate 10 and the polymer material 80 form a carrier substrate.

According to a thirty-second aspect with reference to the thirty-first aspect, the method can further comprise the following steps: two-sided mechanical thinning of the carrier substrate, wherein the step 300 of thinning the ball elements 14 fixed to the carrier substrate takes place starting from the exposed main surface area of the carrier substrate 10 to obtain the plano-convex lens elements 10; and wherein the carrier substrate 10 is further thinned starting from the exposed main surface area of the polymer material 80 to obtain the desired target thickness of the resulting carrier substrate, wherein the planar side 24a of the plano-convex lens elements 24 is flush with the rear of the carrier substrate, and wherein the convex side 24b of the lens elements 24 is within the polymer material 80.

According to a thirty-third aspect with reference to at least one of the thirty-first to thirty-second aspects, the method can comprise the following steps: connecting a third partial substrate 82 comprising a semiconductor material to the carrier substrate; and at least partly removing the polymer material 80 of the carrier substrate to expose the convex-side surface 24b of the lens elements 24 at least partly.

According to a thirty-fourth aspect with reference to at least one of the thirty-first to thirty-third aspects, the method can further comprise the following step: generating cavities 26 in the third partial substrate such that the area of the planar side 24a of the lens elements 24 bordering on the cavities is at least partly exposed.

According to a thirty-fifth aspect with reference to at least one of the first to thirty-fourth aspects, the second partial substrate can form a carrier substrate.

According to a thirty-sixth aspect, the method 600 for producing a packaged device on wafer level can comprise the following steps: producing 610 a carrier substrate provided with plano-convex lens elements according to the method of the first to thirty-fifth aspects; providing 620 a device substrate with a plurality of devices; arranging 630 the substrates on one another, such that the lens elements arranged on the carrier substrate are aligned with the associated devices of the device substrate, wherein the carrier substrate and the device element substrate are joined in a hermetically sealed manner; and dicing 640 the carrier substrate with the device substrate arranged thereon to obtain devices provided with at least one lens element each.

A thirty-seventh aspect can comprise a packaged device 700 sensitive to IR radiation which is produced according to the method 600 of the thirty-sixth aspect.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for producing plano-convex lens elements, comprising:
   providing a first partial substrate with ball elements arranged thereon;
   providing a second partial substrate comprising a glass material layer;
   arranging the second partial substrate on the first partial substrate provided with the ball elements;
   fixing the ball elements to the glass material layer of the second partial substrate by means of thermal bonding the ball elements to the glass material layer of the second partial substrate at an increased temperature together with an applied mechanical pressure; and one-sided thinning of the ball elements fixed to the glass material layer of the second partial substrate to acquire the plano-convex lens elements.

2. The method according to claim 1, wherein the ball elements comprise a semiconductor material and the convex-side radius of curvature R of the lens elements corresponds to the ball radius R of the ball elements.

3. The method according to claim 1, further comprising:
fixing the radiation-sensitive devices to the second partial substrate provided with the lens elements to acquire radiation-sensitive devices provided with at least one lens element each.

4. The method according to claim 3, further comprising:
dicing the second partial substrate with the lens elements and the radiation-sensitive devices arranged thereon to acquire diced radiation-sensitive devices provided with at least one lens element each.

5. The method according to claim 1, further comprising:
providing a first partial substrate provided with depressions, wherein the ball elements are arranged in the depressions of the first partial substrate;
providing a second partial substrate, wherein the second partial substrate comprises recesses and the glass material layer, wherein the glass material layer is arranged on a first main surface area of the second partial substrate, wherein the glass material layer comprises openings that are aligned with the recesses of the second partial substrate, and wherein the openings of the glass material layer have a smaller diameter than the recesses of the second partial substrate;
arranging the second partial substrate on the first partial substrate provided with the ball elements, wherein the first main surface area of the second partial substrate provided with the glass material layer is facing the ball elements, and wherein the ball elements are aligned with the recesses; and
fixing the second partial substrate provided with the glass material layer to the ball elements by means of annealing together with applying mechanical pressure; and
removing the first partial substrate from the ball elements firmly connected to the second partial substrate.

6. The method according to claim 5, wherein in the step of thinning the ball elements fixed to the second partial substrate the plano-convex lens elements are acquired,
wherein the convex side of the lens elements is at the recesses of the second partial substrate, and wherein the planar side of the plano-convex lens elements is acquired by the step of thinning; and
wherein the recesses of the second partial substrate and the openings of the glass material layer form cavities for the lens elements, wherein the area of the lens elements bordering on the cavity is exposed.

7. The method according to claim 5, further comprising:
processing the rear of the second partial substrate to prepare the second partial substrate provided with the plano-convex lens elements for electrical and mechanical connection.

8. The method according to claim 7, wherein processing further comprises:
depositing a passivation layer and a bond structure arranged thereon on the rear of the second partial substrate, opening the recesses within the second partial substrate starting from the rear of the second partial substrate to acquire complete vias to the rear of the second partial substrate; and
removing oxide material on the surfaces of the lens elements facing the vias.

9. The method according to claim 1, further comprising:
providing a first partial substrate provided with depressions, wherein the ball elements are arranged in the depressions of the first partial substrate;
providing a second partial substrate comprising the glass material layer, wherein the second partial substrate comprises depressions;
arranging the second partial substrate on the first partial substrate provided with the ball elements, wherein the depressions are aligned with the ball elements in the second partial substrate;
fixing the second partial substrate to the ball elements arranged on the depressions of the first partial substrate by means of annealing together with applying mechanical pressure to fix the ball elements to the depressions of the second partial substrate; and
removing the first partial substrate from the ball elements firmly connected to the second partial substrate.

10. The method according to claim 9, wherein in the step of thinning the ball elements fixed to the second partial substrate the plano-convex lens elements are acquired,
wherein the convex side of the lens elements is at the depressions of the second partial substrate and wherein the planar side of the plano-convex lens elements is acquired by the step of thinning, and
wherein the depressions of the second partial substrate form cavities for the lens elements, wherein the area of the lens elements bordering on the cavities is exposed.

11. The method according to claim 1, further comprising:
providing a first partial substrate provided with depressions, wherein the ball elements are arranged in the depressions of the first partial substrate;
providing a second partial substrate, wherein the second partial substrate comprises vias and the glass material layer, wherein the glass material layer is arranged on a first main surface area of the second partial substrate, wherein the glass material layer comprises openings that are aligned with the vias of the second partial substrate, and wherein the openings of the glass material layer have a smaller diameter than the vias of the second partial substrate;
arranging the second partial substrate on the first partial substrate provided with the ball elements, wherein the first main surface area of the second partial substrate provided with the glass material layer is facing the ball elements and wherein the ball elements are aligned with the vias; and
fixing the second partial substrate provided with the glass material layer to the ball elements by means of annealing together with applying mechanical pressure; and
removing the first partial substrate from the ball elements firmly connected to the second partial substrate.

12. The method according to claim 11, wherein in the step of thinning the ball elements fixed to the second partial substrate the plano-convex lens elements are acquired,
wherein the convex side of the lens elements is at the vias of the second partial substrate, and wherein the planar side of the plano-convex lens elements is acquired by the step of thinning; and
wherein the vias of the second partial substrate and the openings of the glass material layer form cavities for the lens elements, wherein the area of the lens elements bordering on the cavity is exposed.

13. The method according to claim 11, further comprising:
processing the rear of the second partial substrate to prepare the second partial substrate provided with the plano-convex lens elements for electrical and mechanical connection.

14. The method according to claim 1, wherein fixing comprises:
providing a first partial substrate provided with depressions, wherein the ball elements are arranged in the depressions of the first partial substrate;
providing a second partial substrate, wherein the second partial substrate comprises recesses and the glass material layer, wherein the glass material layer is arranged on the first main surface area of the second partial substrate provided with the recesses, and wherein the glass material layer spans the recesses;
arranging the second partial substrate on the first partial substrate provided with the ball elements, wherein the first main surface area of the second partial substrate provided with the glass material layer is facing the ball elements, and wherein the ball elements are aligned with the recesses;
fixing the second partial substrate provided with the glass material layer to the ball elements by means of annealing together with applying mechanical pressure; and
removing the first partial substrate from the ball elements firmly connected to the second partial substrate.

15. The method according to claim 14, wherein in the step of thinning the ball elements fixed to the second partial substrate the plano-convex lens elements are acquired, wherein the convex side of the lens elements is at the recesses of the second partial substrate, and wherein the planar side of the plano-convex lens elements is acquired by the step of thinning.

16. The method according to claim 14, further comprising:
generating cavities starting from the exposed second main surface area of the second partial substrate to the lens elements, such that the area of the lens elements bordering on the cavity is exposed.

17. The method according to claim 1, wherein fixing comprises:
providing a first partial substrate provided with depressions, wherein the ball elements are arranged in the depressions of the first partial substrate;
providing a second partial substrate, wherein a glass material layer is arranged on a first main surface area of the second partial substrate;
arranging the second partial substrate on the first partial substrate provided with the ball elements, wherein the first main surface area of the second partial substrate provided with the glass material layer is facing the ball elements;
fixing the second partial substrate provided with the glass material layer to the ball elements by means of annealing together with applying mechanical pressure;
removing the first partial substrate from the ball elements firmly connected to the second partial substrate.

18. The method according to claim 17, wherein in the step of thinning the ball elements fixed to the second partial substrate the plano-convex lens elements are acquired, wherein the convex side of the lens elements is at the glass material layer of the second partial substrate, and wherein the planar side of the plano-convex lens elements is acquired by the step of thinning.

19. The method according to claim 17, further comprising:
generating cavities starting from an exposed second main surface area of the second partial substrate to the lens elements, such that the area of the lens elements bordering on the cavity is at least partly exposed.

20. The method according to claim 1, wherein fixing comprises:
providing a first partial substrate provided with depressions, wherein the ball elements are arranged in the depressions of the first partial substrate;
providing a second partial substrate, wherein the second partial substrate comprises vias and a glass material layer, wherein the glass material layer spans the vias;
arranging the second partial substrate on the first partial substrate provided with the ball elements, wherein the first main surface area of the second partial substrate provided with the glass material layer is facing the ball elements, and wherein the ball elements are aligned with the vias;
fixing the second partial substrate provided with the glass material layer to the ball elements by means of annealing together with applying mechanical pressure; and
removing the first partial substrate from the ball elements firmly connected to the second partial substrate.

21. The method according to claim 20, wherein in the step of thinning the ball elements fixed to the second partial substrate the plano-convex elements are acquired,
wherein the convex side of the lens elements is at the vias of the second partial substrate, and wherein the planar side of the plano-convex lens elements is acquired by the step of thinning, and
wherein the vias of the second partial substrate form cavities for the lens elements, wherein the area of the lens elements bordering on the cavity is at least partly exposed.

22. The method according to claim 1, wherein fixing comprises:
providing a first partial substrate provided with depressions, wherein a subset of the ball elements is arranged in the depressions of the first partial substrate;
providing a second partial substrate, wherein the second partial substrate comprises vias and the glass material layer, wherein the glass material layer spans the vias;
arranging the second partial substrate on the first partial substrate provided with the ball elements, wherein the first main surface area of the second partial substrate provided with the glass material layer is facing the ball elements, and wherein the ball elements are aligned with a subset of the vias;
fixing the second partial substrate provided with the glass material layer to the ball elements by means of annealing together with applying mechanical pressure;
removing the first partial substrate from the ball elements firmly connected to the second partial substrate;
performing the step of thinning the ball elements fixed to the second partial substrate to acquire plano-convex lens elements;
providing a further partial substrate provided with depressions, wherein a further subset of the ball elements is arranged in the depressions of the partial substrate;
arranging the second partial substrate on the further partial substrate provided with the further subset of ball elements, wherein the first main surface area of the second partial substrate provided with the glass material layer is facing the ball elements, and wherein the ball elements are aligned with the further subset of the vias;

fixing the second partial substrate provided with the glass material layer to the further subset of ball elements by means of annealing together with applying mechanical pressure;

removing the further partial substrate from the ball elements firmly connected to the second partial substrate;

performing the step of thinning the further subset of ball elements fixed to the second partial substrate to acquire the plano-convex elements.

23. The method according to claim 1, wherein fixing comprises:

providing a first partial substrate provided with depressions, wherein the ball elements are arranged in the depressions of the first partial substrate;

providing a second partial substrate, wherein the second partial substrate comprises, starting from the main surface area, recesses and further a glass material layer, wherein the glass material layer spans the recesses;

arranging the second partial substrate on the first partial substrate provided with the ball elements, wherein the first main surface area of the second partial substrate provided with the glass material layer is facing the ball elements, and wherein the ball elements are aligned with the recesses;

fixing the second partial substrate provided with the glass material layer to the ball elements by means of annealing together with applying mechanical pressure; and removing the first partial substrate from the ball elements fixed to the second partial substrate.

24. The method according to claim 23, wherein in the step of thinning the ball elements fixed to the second partial substrate the plano-convex elements are acquired, wherein the convex side of the lens elements is at the vias of the second partial substrate, and wherein the planar side of the plano-convex lens elements is acquired by the step of thinning, and wherein the vias of the second partial substrate form cavities for the lens elements, wherein the area of the lens elements bordering on the cavity is at least partly exposed.

25. The method according to claim 24, further comprising:

processing the rear of the second partial substrate to prepare the second partial substrate provided with the plano-convex lens elements for electrical and mechanical connection.

26. The method according to claim 25, wherein processing further comprises:

depositing a passivation layer and a bond structure arranged thereon on the rear of the second partial substrate, opening the recesses within the second partial substrate starting from the rear of the second partial substrate to acquire complete vias to the rear of the second partial substrate; and removing oxide material on the surfaces of the silicon lenses facing the vias.

27. The method according to claim 1, wherein fixing comprises:

providing a first partial substrate provided with depressions;

arranging the ball elements in the depressions of the first partial substrate;

arranging a second partial substrate on the first partial substrate provided with the ball elements, wherein the second partial substrate comprises a glass material, wherein the first and second partial substrates are fixed to one another at least in an edge region; and annealing the two partial substrates such that the glass material of the second partial substrate flows at least partly around the ball elements, such that the ball elements are embedded, after re-solidification of the glass material of the second partial substrate, between the first partial substrate and the solidified glass material of the second partial substrate, wherein the first partial substrate and the solidified glass material of the second partial substrate form a carrier substrate.

28. The method according to claim 27, further comprising:

two-sided mechanical thinning of the carrier substrate;

wherein thinning the ball elements fixed to the carrier substrate takes place starting from the outer exposed main surface area of the first partial substrate to acquire the plano-convex lens elements; and wherein the carrier substrate is further thinned starting from the outer exposed surface area of the second partial substrate.

29. The method according to claim 27, comprising:

connecting a third partial substrate comprising a semiconductor material to the carrier substrate; and at least partly removing the glass material of the carrier substrate to at least partly expose the convex-side surface of the lens elements.

30. The method according to claim 1, wherein the second partial substrate forms a carrier substrate.

31. The method for producing a packaged device on wafer level, comprising:

producing a carrier substrate provided with plano-convex lens elements according to the method according to claim 1;

providing a device substrate with a plurality of devices;

arranging the substrates on one another, such that the lens elements arranged on the carrier substrate are aligned with the associated devices of the device substrate, wherein the carrier substrate and the device substrate are joined in a hermetically sealed manner; and dicing the carrier substrate with the device substrate arranged thereon to acquire diced devices provided with at least one lens element each.

\* \* \* \* \*